(12) United States Patent
Fukuda et al.

(10) Patent No.: US 6,274,802 B1
(45) Date of Patent: Aug. 14, 2001

(54) THERMOELECTRIC SEMICONDUCTOR MATERIAL, MANUFACTURE PROCESS THEREFOR, AND METHOD OF HOT FORGING THERMOELECTRIC MODULE USING THE SAME

(75) Inventors: Katsushi Fukuda; Yasunori Sato; Takeshi Kajihara, all of Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/254,657

(22) PCT Filed: Sep. 16, 1997

(86) PCT No.: PCT/JP97/03263

§ 371 Date: Mar. 15, 1999

§ 102(e) Date: Mar. 15, 1999

(87) PCT Pub. No.: WO98/11612

PCT Pub. Date: Mar. 19, 1998

(30) Foreign Application Priority Data

Sep. 13, 1996 (JP) .................................................. 8-243811

(51) Int. Cl.⁷ .................................................. H01L 35/34
(52) U.S. Cl. .................... 136/201; 136/205; 136/238; 136/240
(58) Field of Search ..................... 148/649, 650, 148/653; 419/28, 49, 29; 29/DIG. 18; 75/228; 136/201, 240, 238, 203, 205, 236.1

(56) References Cited

U.S. PATENT DOCUMENTS 4,452,756 * 6/1984 McLeod ................................. 419/29
5,021,085 * 6/1991 Karagoz et al. ........................ 75/239
5,318,743 * 6/1994 Tokiai et al. ............................ 419/38

FOREIGN PATENT DOCUMENTS

| 57-172784 | 10/1982 | (JP) . |
| 62-264682 | 11/1987 | (JP) . |
| 1-106478 | 4/1989 | (JP) . |
| 2-250921 | 10/1990 | (JP) . |
| 3-16281 | 1/1991 | (JP) . |
| 3-41780 | 2/1991 | (JP) . |
| 3-201577 | 9/1991 | (JP) . |
| 63-138789 | 6/1999 | (JP) . |
| 977111 | * 12/1982 | (SU) . |

OTHER PUBLICATIONS

International Search Report PCT/JP97/03263.

* cited by examiner

Primary Examiner—Kathryn Gorgos
Assistant Examiner—Thomas H Parsons
(74) Attorney, Agent, or Firm—Varndell & Varndell, PLLC

(57) ABSTRACT

A thermoelectric semiconductor material having sufficient strength and performance and high production yield. The thermoelectric semiconductor material is characterized in that a sintered powder material of a thermoelectric semiconductor having a rhombohedral structure (or hexagonal structure) is hot-forged and plastically deformed to direct either the crystals of the sintered powder structure or the subcrystals constructing the crystals in a crystal orientation having an excellent figure of merit.

56 Claims, 29 Drawing Sheets

FIG.1(a)
FIG.1(b)
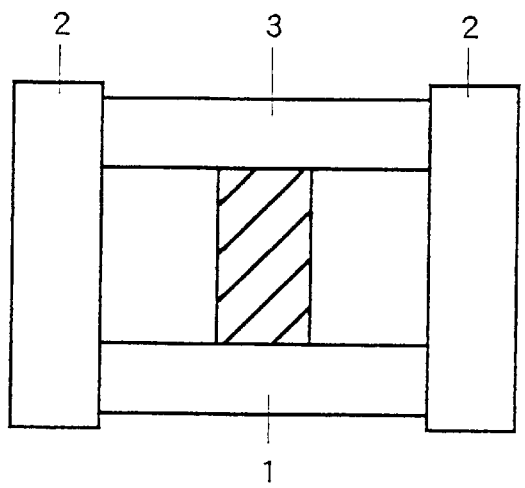
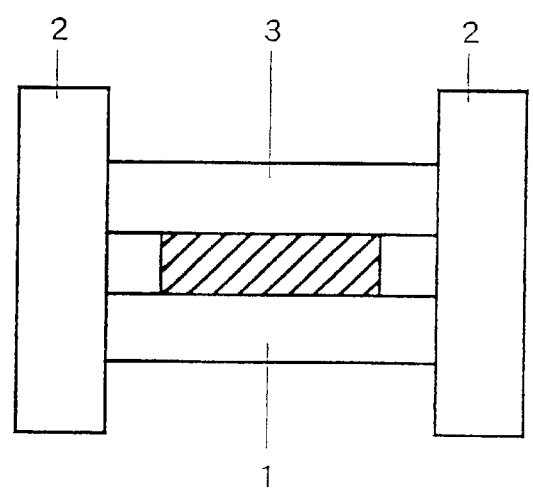

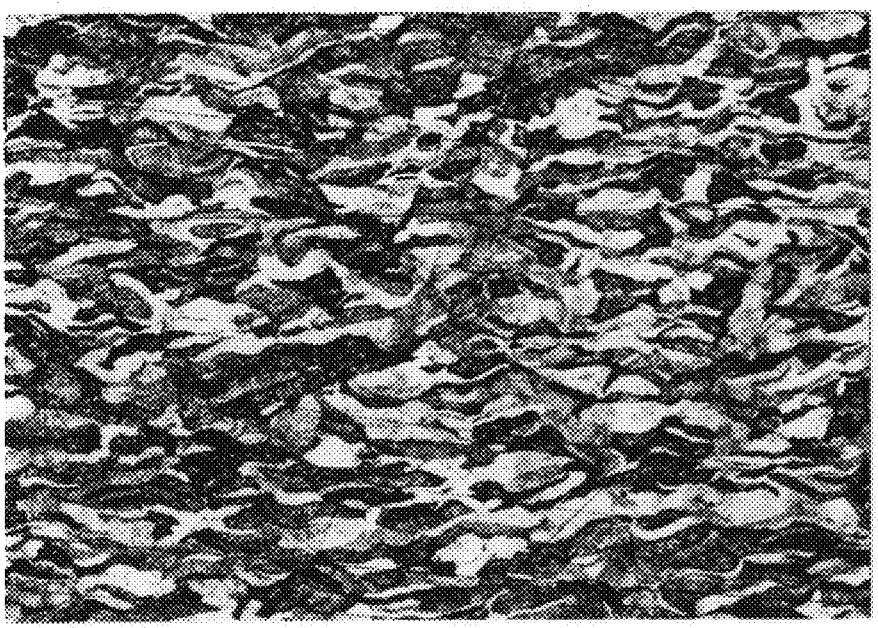
FIG. 3
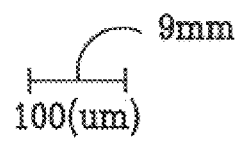

FIG.9(a)     FIG.9(b)
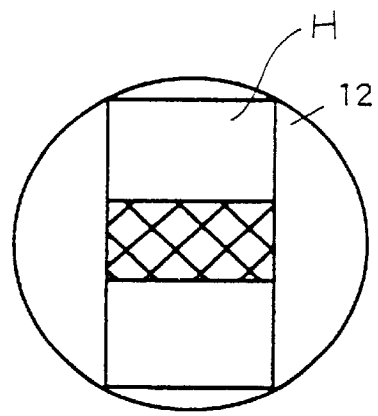
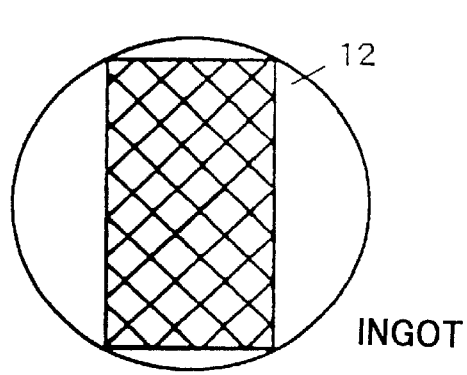
INGOT
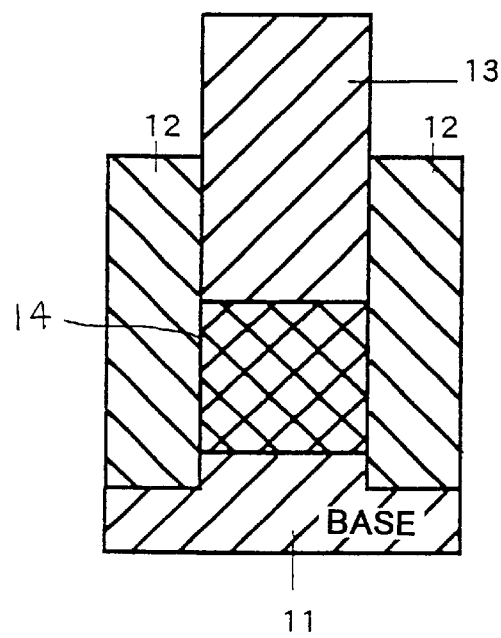
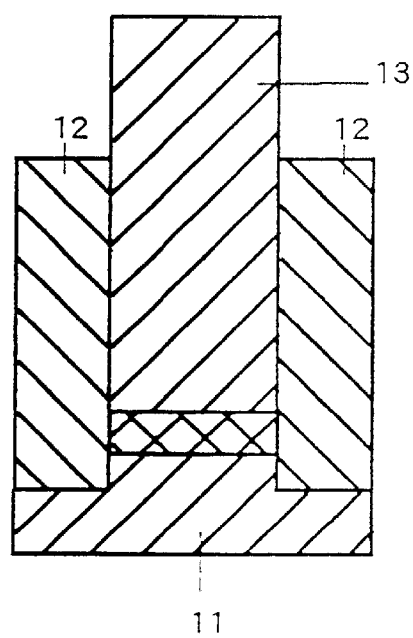

THERMOELECTRIC SEMICONDUCTOR MATERIAL, MANUFACTURE PROCESS THEREFOR, AND METHOD OF HOT FORGING THERMOELECTRIC MODULE USING THE SAME

BACKGROUND OF THE INVENTION

1. Field of the Invention

The present invention relates to a thermoelectric semiconductor material, its method of manufacture and a thermoelectric module using this, and, in addition, to a method of hot forging.

2. Description of the Related Art

Application of electronic cooling elements utilizing the Peltier effect or Ettinghausen effect, or thermoelectric power generating elements utilizing the Seebeck effect over a wide range is noted on account of their simple construction, ease of handling, and ability to maintain stable characteristics. In particular regarding electronic cooling elements, research is being conducted in many places aimed at temperature stabilization etc. of optoelectronics or semiconductor lasers etc., on account of the capability that they possess for precise temperature control of local cooling and in the vicinity of room temperature.

As shown in FIG. 12, a thermoelectric module employed in such electronic cooling and thermoelectric power generation is constructed such that a pn element pair is formed by joining a p-type semiconductor 5 and n-type semiconductor 6 through a metallic electrode 7, a plurality of such pn elements being arranged in series, heat being generated at one end while cooling occurs at the other end, depending on the direction of the current flowing through the junctions. A material of large figure of merit $Z(=\alpha^2/\rho K)$ expressed by the Seebeck coefficient $\alpha$, resistivity $\rho$ and thermal conductivity K, which are constants characteristic of the material, is employed as the material of such a thermoelectric element.

Most thermoelectric semiconductor materials have anisotropy of thermoelectric performance depending on their crystal structure i.e. the figure of merit Z is different depending on crystal orientation. A single crystal material is therefore employed with current being passed in a crystal orientation of large thermoelectric performance. In general, anisotropic crystals are subject to cleavage and are brittle, so, as a practical material, instead of employing single crystals, a material is employed in which alignment is effected in a crystal orientation of large thermoelectric performance by unidirectional solidification achieved by the Bridgman method etc.

However, albeit not to the same degree as a single crystal, such a unidirectional solidified material is still brittle, and problems are experienced during element working regarding cracking and/or chipping of the elements. In contrast to such crystalline material, powder sintered material has no cleavage and the material strength is enormously better, but the alignments of the crystal orientations are random or, if there is crystal alignment, this shows a gently sloping distribution, so there was the problem that the thermoelectric performance was inferior to that of crystalline materials. Thermoelectric semiconductor materials having both satisfactory strength and performance were thus hitherto unavailable. Specifically, the crystalline materials that were typically employed as electronic cooling elements were mixed crystals of bismuth telluride ($Bi_2Te_3$), antimony telluride ($Sb_2Te_3$) and bismuth selenide ($Bi_2Se_3$), but these crystals have the problems of being subject to severe cleavage and that the yield was very considerably lowered owing to cracking and chipping on undergoing slicing and dicing steps etc. to obtain the thermoelectric element from the ingot.

Formation of powder sintered elements has therefore been tried in order to improve mechanical strength. When the material is employed in the form of a powder sintered body instead of crystals, the problem of cleavage is eliminated, but, as mentioned above, performance is inferior due to the poor alignment. In other words, there was the problem of a low figure of merit Z.

In view of the foregoing, it is an object of the present invention to provide a thermoelectric semiconductor material exhibiting satisfactory strength and performance and of high manufacturing yield.

SUMMARY OF THE INVENTION

Definitions of terms used in this specification and in the claims will now be given.

A "crystal grain" is a unit constituted by crystalline structure, its circumference being enclosed by a grain boundary. For example, in the case of a powder sintered material, these originate in the particles of the powder when this sintered material is formed.

Also, "a subcrystal grain" is a constituent unit of a crystal grain; in this specification, it means a unit crystal from the crystallographic point of view.

Accordingly, although both the case where the crystal grains consist of single subcrystal grains and the case where they consist of a plurality of subcrystal grains may be considered, both of these cases are included in this specification.

Consequently, if the subcrystal grains are aligned, the crystal grains will be aligned.

A first aspect of the present invention comprises: a heating step in which material powder is mixed so as to have a desired composition, and melted by heating; a solidification step, in which a solid solution ingot of thermoelectric semiconductor material having a rhombohedral structure (hexagonal crystal structure) is formed; a crushing step in which the solid solution ingot is crushed to form a solid solution powder; a screening step in which the grain size of the solid solution powder is made uniform; a sintering step in which the solid solution powder whose grain size has been made uniform is subjected to pressing and sintering; and a hot upset forging step in which hot upset forging is performed by subjecting the powder sintered body to plastic deformation while hot, and extending it, thereby aligning crystal grains of the powder sintered structure in a crystal orientation of excellent figure of merit, such that a density ratio of the powder sintered body is finally at least 97%.

Preferably the hot upset forging step is an upset forging step wherein the powder sintered body is extended in one axial direction only, while hot.

Also, preferably, the hot upset forging step is a step in which extension is performed whilst pressing in a direction coinciding with the direction of pressing in the sintering step.

Further, preferably, a heat treatment step in which heat treatment is performed is further included after the hot upset forging step.

A second aspect of the present invention comprises: an ingot forming step in which a mixture whose chief constituents are bismuth, antimony, tellurium, and selenium of prescribed composition is melted by heating, and a solid solution ingot of $Bi_2Te_3$-based thermoelectric semiconductor material is formed; a crushing step in which the solid solution ingot is crushed to form a solid solution powder; a screening step in which the grain size of the solid solution powder is made uniform; a sintering step in which the solid solution powder whose grain size has been made uniform is subjected to pressing and sintering; and a hot upset forging step in which hot upset forging is performed by subjecting the powder sintered body to plastic deformation while hot, and extending it, thereby aligning crystal grains of the powder sintered structure in a crystal orientation of excellent figure of merit, such that a density ratio of the powder sintered body is finally at least 97%.

Preferably, the hot upset forging step is an upset forging step in which the powder sintered body is extended in one axial direction only, while hot.

Preferably, the hot upset forging step is a step in which extension is effected whilst pressing in a direction coinciding with the direction of application of pressure in the sintering step.

Also preferably, a heat treatment step in which heat treatment is performed is further included after the hot upset forging step.

Further, preferably, after the screening step and before the sintering step there is included a hydrogen reduction step in which the solid solution powder is subjected to heat treatment in a hydrogen atmosphere.

A third aspect of the present invention comprises an ingot formation step in which a mixture whose chief constituents are bismuth and antimony in a desired composition is melted by heating to form a solid solution ingot of BiSb-based thermoelectric semiconductor material; a crushing step in which the solid solution ingot is crushed to form a solid solution powder; a screening step in which the grain size of the solid solution powder is made uniform; a sintering step in which the solid solution powder whose grain size has been made uniform is subjected to pressing and sintering; and a hot upset forging step in which hot upset forging is performed by subjecting the powder sintered body to plastic deformation while hot, and extending it, thereby aligning crystal grains of the powder sintered structure in a crystal orientation of excellent figure of merit, such that a density ratio of the powder sintered body is finally at least 97%. Preferably, the hot upset forging step is an upset forging step in which extension of the powder sintered body is effected in one axial direction only, while hot.

Preferably, the hot upset forging step is a step in which extension is effected whilst pressing in a direction coinciding with the direction of pressing in the sintering step.

Also, preferably, a heat treatment step in which heat treatment is performed is further included after the hot upset forging step.

According to a fourth aspect of the present invention, a thermoelectric semiconductor material is formed such that crystal grains of a powder sintered structure are arranged in crystal orientation of excellent figure of merit, by plastic deformation produced by hot upset forging of a powder sintered body of BiSb-type thermoelectric semiconductor material, a density ratio of the powder sintered body being finally made at least 97%.

According to a fifth aspect of the present invention, there is provided a thermoelectric semiconductor material formed such that the c axis of crystal grains of a powder sintered composition are aligned, by plastic deformation performed by hot upset forging of a powder sintered body of $Bi_2Te_3$-based thermoelectric semiconductor material, a density ratio of the powder sintered body being finally made at least 97%.

According to a sixth aspect of the present invention, there is provided a thermoelectric semiconductor material formed such that crystal grains of a powder sintered composition are aligned in a crystal orientation of excellent figure of merit, by plastic deformation produced by hot upset forging, with a powder sintered body of BiSb-based thermoelectric semiconductor material being put in a condition in which it can be extend in one axial direction only, a density ratio of the powder sintered body being finally made at least 97%.

According to a seventh aspect of the present invention, there is provided a thermoelectric semiconductor material formed such that c axis of crystal grains of a powder sintered structure are aligned by plastic deformation performed by hot upset forging in which a powder sintered body of $Bi_2Te_3$-based thermoelectric semiconductor material is put in a condition in which extension is possible in one axial direction only, a density ratio of the powder sintered body being finally made at least 97%.

According to an eighth aspect of the present invention, there is provided a thermoelectric module comprising: p-type and n-type thermoelectric semiconductor materials arranged such that cleavage faces of crystal grains of a powder sintered structure are aligned, by plastic deformation performed by respective hot upset forging of powder sintered bodies of p-type and n-type thermoelectric semiconductor materials having a rhombohedral structure (hexagonal crystal structure), a density ratio of the powder sintered body being finally made at least 97%, and, in each case, a pair of electrodes mutually oppositely fixed at a top face and a bottom face of the p-type and n-type thermoelectric semiconductor materials, whereby a current flows along the cleavage planes.

According to a ninth aspect of the present invention, there is provided a thermoelectric module comprising: p-type and n-type thermoelectric semiconductor materials wherein c axes of crystal grains of a powder sintered structure are aligned by plastic deformation performed by respective hot upset forging of powder sintered bodies of p-type and n-type $Bi_2Te_3$-type thermoelectric semiconductor material, a density ratio of the powder sintered body being finally made at least 97%; and, in each case, a pair of electrodes mutually oppositely fixed at a top face and a bottom face of the p-type and n-type thermoelectric semiconductor materials, whereby a current flows along a direction perpendicular to the c axes.

According to a tenth aspect of the present invention, the hot upset forging step is a step in which hot upset forging is performed of the powder sintered body below a recrystallization temperature.

According to an eleventh aspect of the present invention, the hot upset forging step is a step in which hot upset forging is performed of the powder sintered body at above 350° C. but below 550° C.

According to a twelfth aspect of the present invention, the hot upset forging step is a step in which hot upset forging is performed such that a density ratio of the powder sintered body is finally at least 97%.

According to a thirteenth aspect of the present invention, the hot upset forging step is a step wherein the powder sintered body of density ratio not less than 97% is finally made to be of the density ratio or more by hot upset forging.

According to a fourteenth aspect of this invention, the hot upset forging step is a step in which hot upset forging is performed on the powder sintered body with a load pressure of not more than 500 kg/cm$^2$.

According to a fifteenth aspect of the present invention, the hot upset forging step is a step in which hot upset forging is performed on the powder sintered body with an initial load pressure of not less than 70 kg/cm² but not more than 350 kg/cm².

According to a sixteenth aspect of the present invention, the hot upset forging step is a step in which the powder sintered body is extended in a free direction, and then is further pressed in a condition in which this free direction is restrained.

According to a seventeenth aspect of the present invention, after the hot upset forging step, the powder sintered body is further subjected to a hot mold forging step in which it is forged inserted into a mold while hot.

According to an eighteenth aspect of the present invention, the hot upset forging step is repeated a plurality of times.

According to a nineteenth aspect of the present invention, a density ratio of not less than 97% is obtained by plastic deformation of a powder sintered body of BiSb-based thermoelectric semiconductor material by hot upset forging.

According to a twentieth aspect of the present invention, a density ratio of not less than 97% is obtained by plastic deformation of a powder sintered body of $Bi_2Te_3$-based thermoelectric semiconductor material by hot upset forging.

According to a twenty-first aspect of the present invention, forming is effected such that the C planes of subcrystal grains constituting a structure are aligned on a specified axis or in a specified plane by plastic processing of a thermoelectric semiconductor material having a hexagonal crystal structure, a density ratio with respect to a single crystal being made at least 97%.

Preferably, the thermoelectric semiconductor material having the hexagonal crystal structure is a powder molded body.

Preferably, the thermoelectric semiconductor material having the hexagonal structure is a powder sintered body.

Also, according to a twenty-second aspect of the present invention, formation is effected such that C planes of at least 80% of subcrystal grains, in volumetric percentage terms, of the subcrystal grains constituting a structure, are aligned within a range of ±30° with respect to a specified axial direction or a specified plane, by plastic processing of thermoelectric semiconductor material having a hexagonal structure, a density ratio with respect to a single crystal being made at least 97%.

Preferably, the thermoelectric semiconductor material having the hexagonal crystal structure is a powder molded body.

Preferably, the thermoelectric semiconductor material having the hexagonal crystal structure is a powder sintered body.

Also, according to a twenty-third aspect of the present invention, formation is effected such that C planes of at least 50% of subcrystal grains, in volumetric percentage terms, of the subcrystal grains constituting a structure, are aligned within a range of ±15° with respect to a specified axial direction or a specified plane, by plastic processing of thermoelectric semiconductor material having a hexagonal crystal structure, a density ratio with respect to a single crystal being made at least 97%.

Preferably, the thermoelectric semiconductor material having the hexagonal crystal structure is a powder molded body.

Preferably, the thermoelectric semiconductor material having the hexagonal crystal structure is a powder sintered body.

Also, according to a twenty-fourth aspect of the present invention, by plastic processing of a thermoelectric semiconductor material, a size of subcrystal grains constituting a structure is reduced below a fixed size, and a grain size of the subcrystal grains is unified to a grain size in a fixed range.

Preferably, the thermoelectric semiconductor material is a powder molded body.

Preferably, the thermoelectric semiconductor material is a powder sintered body.

Preferably, the plastic processing is performed below a recrystallization temperature.

Also, according to a twenty-fifth aspect of the present invention, by plastic processing of a thermoelectric semiconductor material, a density ratio with respect to a single crystal is made at least 97% and the thermoelectric semiconductor material is formed to a shape desired for elements constituting a thermoelectric module.

Preferably, the thermoelectric semiconductor material is a powder molded body.

Preferably, the thermoelectric semiconductor material is a powder sintered body.

Also, according to a twenty-sixth aspect of the present invention, by plastic processing of a thermoelectric semiconductor material, a density ratio with respect to a single crystal is made at least 97% and a mean value of a shearing strength of the thermoelectric semiconductor material is made at least equal to a fixed value and a statistical scatter of the shearing strength is kept within a fixed range.

Preferably, the thermoelectric semiconductor material is a powder molded body.

Preferably, the thermoelectric semiconductor material is a powder sintered body.

Also, according to a twenty-seventh aspect of the present invention, in addition to the features of the twenty-first aspect of the invention, by plastic processing of the thermoelectric semiconductor material having the hexagonal crystal structure, a ratio of density with respect to a single crystal of not less than 97% is achieved.

Preferably, the thermoelectric semiconductor material having the hexagonal crystal structure is a powder molded body.

Preferably, the thermoelectric semiconductor material having the hexagonal crystal structure is a powder sintered body.

Also, according to a twenty-eighth aspect of the present invention, in addition to the features of the twenty-first aspect of the invention, after plastic processing of the thermoelectric semiconductor material having the hexagonal crystal structure, heat treatment is performed.

Preferably, the thermoelectric semiconductor material having the hexagonal crystal structure is a powder molded body.

Preferably, the thermoelectric semiconductor material having the hexagonal crystal structure is a powder sintered body.

Also, according to a twenty-ninth aspect of the present invention, in addition to the features of the twenty-first aspect, the thermoelectric semiconductor material having the hexagonal crystal structure is of composition represented by any of $Bi_2Te_3$, $Bi_2Se_3$, $Sb_2Te_3$, $Sb_2Se_3$, $Bi_2S_3$, $Sb_2S_3$ or a combination of two, three or four of these.

Preferably, the thermoelectric semiconductor material having the hexagonal crystal structure is a powder molded body.

Preferably, the thermoelectric semiconductor material having the hexagonal crystal structure is a powder sintered body.

Also, according to a thirtieth aspect of the present invention, by plastic processing of a thermoelectric semiconductor material having a hexagonal crystal structure, there is formed thermoelectric semiconductor materials of p-type and n-type such that C planes of subcrystal grains constituting a structure are aligned with respect to a specified axis or specified plane, a density ratio with respect to a single crystal being made at least 97% and; and a thermoelectric module is provided with at least one pn element pair wherein the p-type and n-type thermoelectric semiconductor materials are joined through a pair of electrodes such that an electric current or a heat current flows in an orientation in which the C planes of the subcrystal grains constituting the structure are most aligned.

Preferably, the thermoelectric semiconductor material having the hexagonal crystal structure is a powder molded body.

Preferably, the thermoelectric semiconductor material having the hexagonal crystal structure is a powder sintered body. Specifically, whereas, in relation to the anisotropy of thermoelectric performance that is originally possessed by a single crystal of thermoelectric semiconductor material, a thermoelectric semiconductor ingot consisting of a powder sintered body, although it has better strength, has inferior alignment of the crystal grains constituting its structure in accordance with the present invention, its crystal alignment is improved by plastic deformation induced by applying a load exceeding the yield stress of the material by plastic processing such as hot forging.

The material that, according to the present invention is to be the subject of plastic processing is a thermoelectric semiconductor material having a hexagonal structure; this concept includes powder moldings consisting of thermoelectric semiconductor material powder, irrespective of pressing or heating, and powder sintered bodies sintered by pressing and heating thermoelectric semiconductor powder, etc. In particular, it is preferable that a powder sintered body should be subjected to plastic processing.

Also, the concept of plastic processing includes various types of processing, such as forging (upset forging or mold forging), rolling, or extrusion etc. In particular, a method of plastic processing by hot upset forging is preferred.

Owing to the performance of such plastic processing, as plastic deformation proceeds, the ingot shrinks in the direction of compression. In contrast, the ingot expands in the direction of the compression plane. By this deformation, the crystal grains constituting the structure of the ingot undergo flattening plastic deformation and their cleavage planes become aligned such as to be perpendicular to the direction of compression. That is, sliding of the subcrystal grains constituting the crystal grains occurs preferentially at the C planes of the hexagonal crystals; in the case of simple uniaxial pressing such as rolling or forging, the C axis is aligned in the direction of compression; in the case of extrusion, the C plane is aligned in the extrusion direction.

In this way, thermoelectric performance in the specified direction is improved.

Also, plastic processing at a suitable temperature causes simultaneous formation of crystal defects and recovery of crystal defects, as a result of which the size of the subcrystal grains constituting the structure of the thermoelectric semiconductor material becomes finer, being reduced to below a certain size, and the grain sizes of the subcrystal grains are uniformly unified to below a prescribed size, producing a fine structure. Such a fine structure is superior in terms of strength and enables fully satisfactory strength to be achieved, exceeding the strength of the powder sintered body prior to plastic processing.

Although such crystal defects and recovery thereof and, in addition, flow of crystal grains of powder sintered material are thought to occur in plastic processing of thermoelectric semiconductors, the details thereof are still unclear.

That is, increasing the amount of plastic deformation renders the structure of the subcrystal grains as seen by a polarizing microscope finer and more uniform; thus it is clear that the crystal defects and recovery thereof induced by plastic processing contribute greatly to improvement of alignment. In this connection, although, when the temperature is raised, crystal defects and their recovery are promoted, if the temperature of plastic processing is above the recrystallization temperature, although the movement and recovery of dislocations take place rapidly and the rate of deformation is high, on the other hand, grain growth takes place irrespective of alignment of the crystal grains, so the degree of alignment is in fact lowered.

As a result, in plastic processing of the thermoelectric semiconductor material, it is desirable that this should be performed at or below the optimum prescribed temperature therefor, and it is desirable that this should be below the recrystallization temperature at which the crystal grains grow and alignment is lost. However, on the other hand, if the temperature is too low, plastic deformation itself becomes slow, which is unsuitable for practical processing. Accordingly, a lower limit of the temperature also exists.

Thus, good thermoelectric performance in a specified direction is obtained by plastic processing at a suitable temperature, thereby enabling thermoelectric semiconductor material to be obtained which is of excellent performance while maintaining strength.

Consequently, using thermoelectric material of high mechanical strength and excellent alignment, a thermoelectric module of high reliability can be obtained. In this case, the thermoelectric performance of the thermoelectric module can be raised by arranging the pn element pairs such that the electric current or heat current flows in an orientation in which the C planes of the crystal grains are most aligned (orientation in which the thermoelectric performance is best), by joining p-type and n-type thermoelectric semiconductor materials by means of a pair of electrodes. That is, a thermoelectric module can be obtained in which the maximum temperature difference has a large value, providing a strong cooling effect.

Also, from the point of view of density ratio, the density ratio of the thermoelectric semiconductor material should desirably be at least 97%.

Specifically, if the density ratio of a thermoelectric semiconductor material is low, its thermal conductivity is lowered, and thermoelectric performance is lowered due to the increase in electrical resistance; furthermore, the strength of the material is also lowered. As a result, there exists a density ratio at which thermoelectric performance can be raised yet the strength of the material is unimpaired; it is satisfactory to make the density ratio at least 97% by plastic processing of the thermoelectric semiconductor material.

The "density ratio" means the ratio of the density (compressed powder density) of a thermoelectric semiconductor material such as a powder sintered body that has been subjected to plastic processing and the true density (ideal density) of a single crystal of the same composition as the thermoelectric semiconductor material after this plastic processing.

Also, since, according to the present invention, the thermoelectric semiconductor material is subjected to plastic processing, it can be flexibly adapted to any shape (for example doughnut-shaped) that the elements constituting the thermoelectric module are required to have, and molding can easily be performed.

Also, failure of thermoelectric modules arises most frequently from breakage of the p-type and n-type elements due to shearing stress acting on the thermoelectric module.

According to the present invention, the strength of the thermoelectric semiconductor material is raised so that the mean value of the shearing strength is more than a prescribed value and furthermore the statistical scatter (dispersion or standard deviation etc.) of the shearing strength is also kept within a fixed range, so element breakage can be prevented with high probability and durability and reliability of the thermoelectric module thereby improved.

Also, since, according to the invention, forming is achieved by plastic processing of a powder molding or powder sintered body rather than a single crystal, the composition ratios can be comparatively freely selected, and a material of high figure of merit Z can be obtained. Preferably the composition is any of $Bi_2Te_3$, $Bi_2Se_3$, $Sb_2Te_3$, $Sb_2Se_3$, $Bi_2S_3$, or $Sb_2S_3$, or a combination of two or three or four of these.

Also, according to the present invention, heat treatment may be performed after plastic processing of the thermoelectric semiconductor material. If this is done, residual strain is eliminated and re-arrangement (recovery) of dislocations produced by plastic processing proceeds further, enabling the electrical resistance to be lowered and the figure of merit Z to be further raised.

Also, the lowering in manufacturing yield due to cracking etc. can be greatly reduced compared with the case where unprocessed single crystal or polycrystalline material is employed.

Hereinbelow, the characteristics of thermoelectric semiconductor material and thermoelectric modules according to the present invention are described chiefly with reference to the case of $Bi_2Te_3$-based semiconductor material, but the present invention is not restricted by this description. BiSb-based semiconductor material could equally well be employed.

It should be noted that $Bi_2Te_3$-type thermoelectric semiconductor material as referred to herein means material represented by $Bi_{2-x}Sb_xTe_{3-y-z}Se_yS_z$ ($0 \leq x \leq 2$, $0 \leq y+z \leq 3$), and includes the case where impurities are present in the crystals. Likewise, BiSb-type semiconductor material means material expressed by $Bi_{1-x}Sb_x$ ($0<x<1$), and includes the case where impurities are present as dopants within the crystals.

Also, the scope of the present invention is not restricted to hot upset forging of powder sintered bodies obtained by hot pressing (pressing and sintering).

A pressed body obtained by pressing solid solution powder may be subjected to hot upset forging, or a sintered body obtained by sintering after pressing the solid solution powder may be subjected to hot upset forging. Further, material obtained by fusing and solidifying the material may be cut into desired solid solution blocks, which may then be directly subjected to hot upset forging.

Also, the scope of the present invention is not restricted to obtaining thermoelectric semiconductor material by hot forging.

The material to which hot forging according to the present invention may be applied includes magnetic material, dielectric material, or superconductive material of hexagonal crystal structure, laminar structure, or tungsten block structure, such as for example bismuth laminated ferroelectrics, or bismuth laminated high temperature superconductors.

BRIEF DESCRIPTION OF THE DRAWINGS

FIGS. 1(a) and 1(b) are diagrammatic views.

FIG. 3 is a micrograph of a thermoelectric semiconductor material before hot upset forging according to the present invention;

FIGS. 9(a) and 9(b) are views showing an upsetting device employed in the method of a second embodiment of the present invention;

DETAILED DESCRIPTION OF THE INVENTION

Embodiments of the present invention are described below with reference to the drawings.

Figure 2:
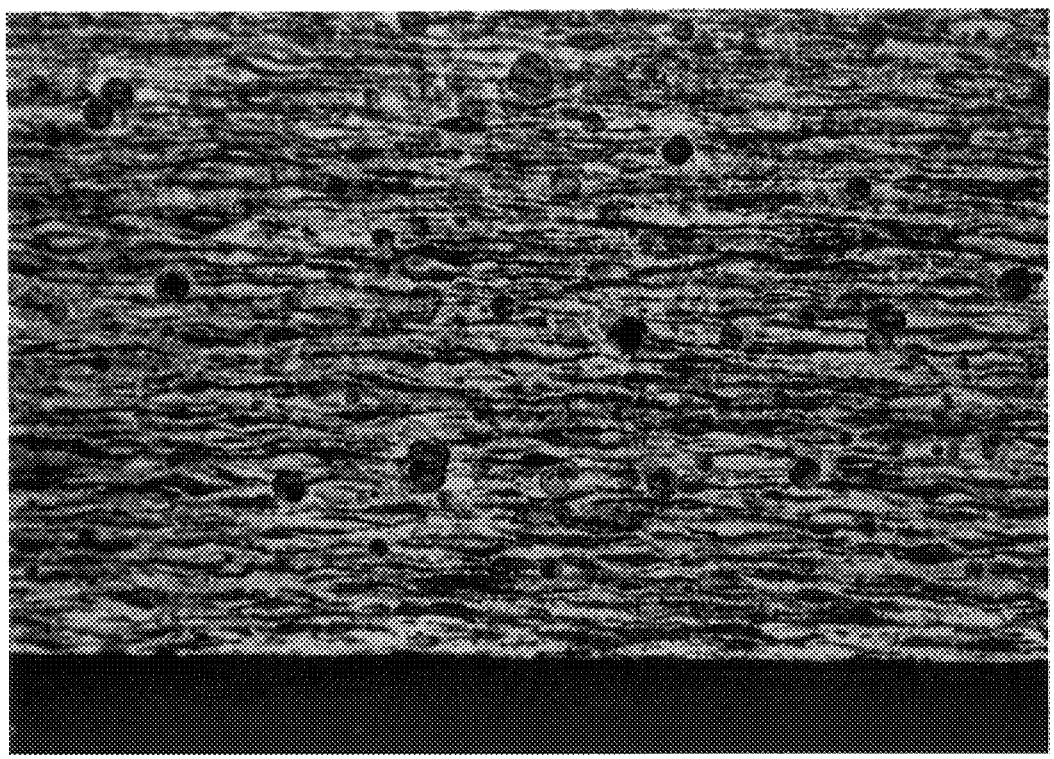
FIG. 2 is a micrograph of a thermoelectric semiconductor material after hot upset forging according to the present invention.

A feature of the present invention is that a sintered ingot produced by powder sintering and constituting a thermoelectric semiconductor material is processed to effect alignment of the crystal grains in layer fashion as shown in FIG. 2 by hot upset forging, which is one type of plastic processing, as shown by the diagrams of FIG. 1(a) and (b). FIG. 2 is a micrograph showing the condition after free forging and FIG. 3 is a micrograph showing the condition before free forging.

The photographs shown in these FIG. 2 and FIG. 3 are composition photographs obtained by respectively embedding in epoxy resin, grinding the respective material surfaces to specular surfaces and then etching in an acidic solution; the vertical direction in the photographs is the direction of application of pressure during forging and during sintering.

In the condition prior to forging of FIG. 3, a composition having a wave-like shape is observed. These wave-like grains are the crystal grains originating from the powder particles when the powder sintered material is formed.

In the condition after forging of FIG. 2, it can be seen that the crystal grains are aligned in the form of a layer perpendicular to the direction of application of pressure by longitudinal extension by the forging of the wave-shaped crystal grains seen in FIG. 3.

It should be noted that the circular holes in the photographs are produced by etching and do not indicate the composition itself.

Figure 4:
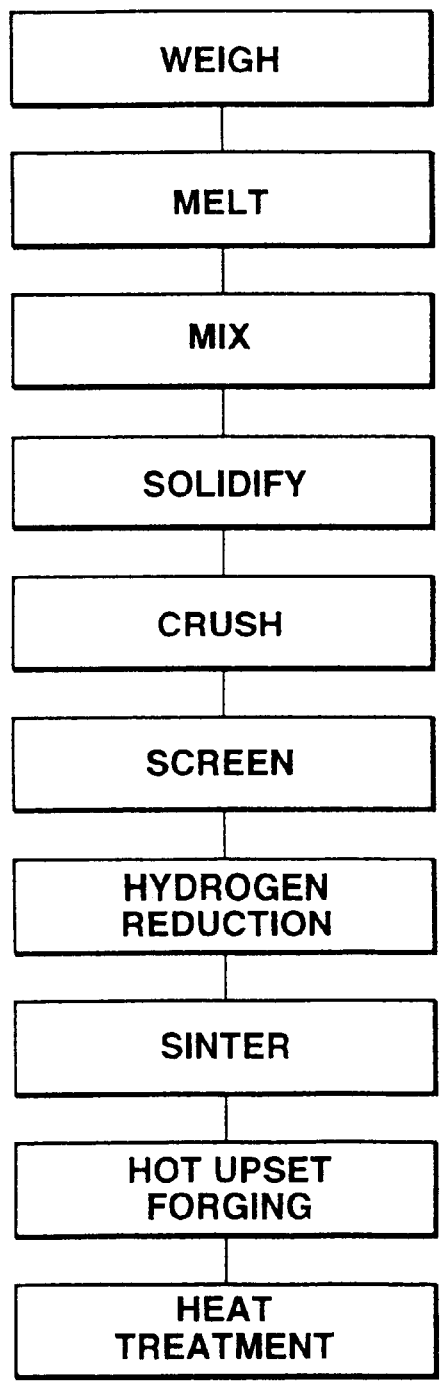
FIG. 4 is a view showing a flow chart of a method of manufacturing a thermoelectric semiconductor according to the present invention.

FIG. 4 is a flow chart showing a process for manufacturing n-type $Bi_2Te_3$ thermoelectric semiconductor material.

Specifically, as shown in FIG. 4, the elements bismuth Bi, tellurium Te, and selenium Se were weighed out to provide the stoichiometric ratios $Bi_2Te_{2.7}Se_{0.3}$ and a suitable amount of a chemical compound to adjust the carrier concentration was further added; a melt-grown material was manufactured by dissolving, mixing and solidifying. Powder of grain size about 34–106 μm was obtained by crushing this melt-grown material using a stamping mill or ball mill etc. and sieving using 150 mesh and 400 mesh sieves, selecting the material remaining on the 400 mesh sieve. Thereupon, after screening, a prescribed volume of powder was supplied into a glass ampoule of prescribed capacity under vacuum evacuation, and sealed in at a pressure of 0.9 atmosphere whilst introducing hydrogen; hydrogen reduction was then performed by heat treatment for 10 hours in a heating furnace at 350° C. This powder was then subjected to powder sintering in a hot press device in an argon atmosphere at a sintering temperature of 500° C., with an applied pressure of 750 kg/cm². The size of the sintered ingot was: cross-sectional area defined by 32 mm by 32 mm thickness of 20 mm. This material was of n type, the Seebeck coefficient of this ingot being negative. This was then forged by hot upset forging.

Figure 5A:
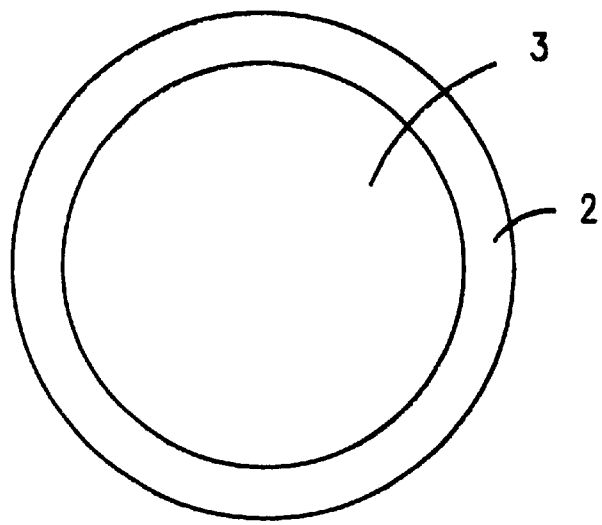
FIGS. 5(a) and 5(b) are views showing an upsetting device employed in a method according to a first embodiment of the present invention.
Figure 5B:
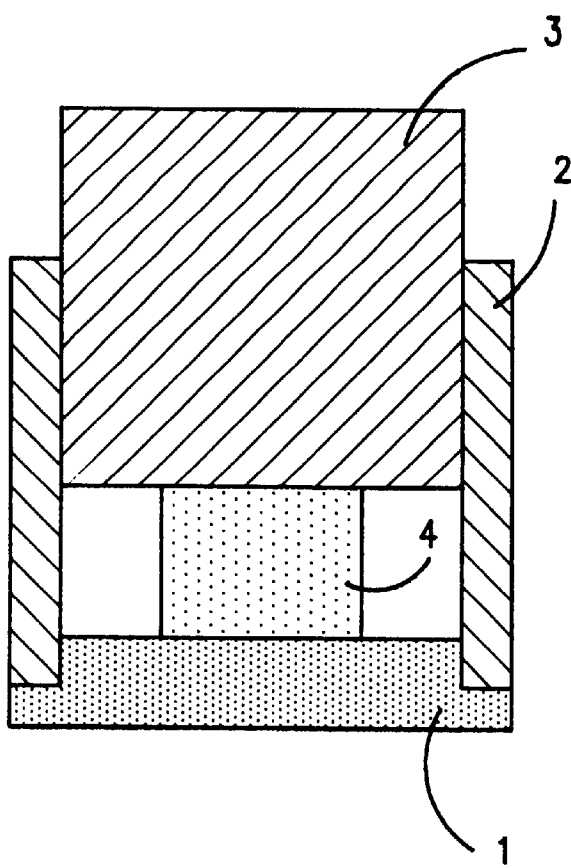
Figure 6:
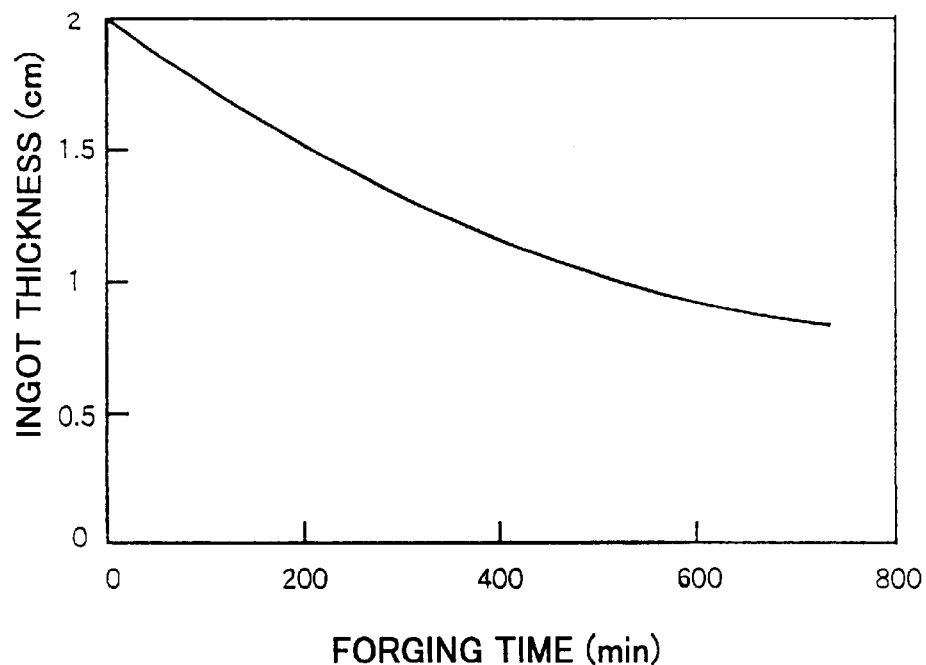
FIG. 6 is a view showing the results of measuring the relationship between forging time in hot upset forging according to the present invention and ingot thickness.
Figure 7:
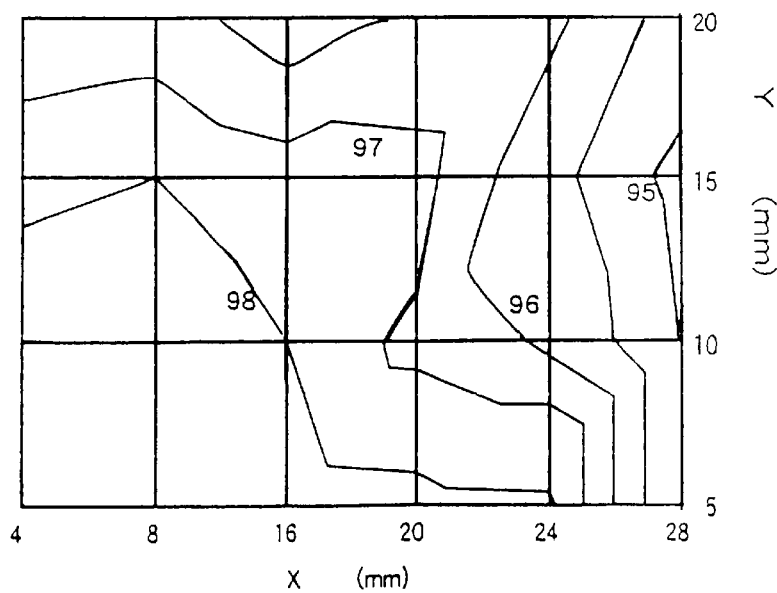
FIG. 7 is a view showing the distribution of density ratio of four half portions of this ingot in regard to a single crystal.

As shown in FIG. 5, the forging step was performed by arranging this ingot in an upsetting device made of cemented carbide, and pressing in the same direction as the direction of pressing on hot pressing from above at 450° C. in an argon atmosphere at 150 kg/cm². The sintered ingot is thereby compressed. FIG. 5(a) is a top view and FIG. 5(b) is a cross-sectional view. This upsetting device comprises a base 1, a cylindrical sleeve 2 erected at right angles to base 1, and a punch 3 formed so as to be inserted into this sleeve 2, and is so arranged that an ingot 4 as described above is placed on base 1 and is pressed by punch 3. This device is of super-hard construction and is heated by a heating device, not shown, to about 450° C. With this device, an ingot 4 is pressed from two directions only, namely, above and below, being in a free condition in the other directions, and is forged such that the C axis directions are aligned. FIG. 6 is a view showing the results of measuring the relationship between forging time and ingot thickness. The ingot thickness produced by pressing for 12 hours was about ½ i.e. about 8 mm, the bottom face area being approximately doubled to 48.5 mm square. FIG. 7 shows the distribution of density ratio in regard to a single crystal in four half portions of this ingot. Thermoelectric performance deteriorates when the density is lowered and the strength is also adversely affected, so the portion that is capable of being used is a portion in which the density ratio is at least 97%.

The thermoelectric performance of this hot-forged ingot and of the center of the ingot before forging were as shown in Table 1. In the case of this n-type material, the number of carriers is decreased due to the crystal defects produced by hot forging, thereby increasing the resistivity and the Seebeck coefficient, but the lattice defects due to forging were eliminated by heat treatment for 48 hours at 400° C. sealed with argon gas in a glass ampoule at 0.9 atmosphere, enabling a carrier concentration which was the same as that of the starting ingot to be obtained. This conclusion could be reached from the fact that the Seebeck coefficient was the same.

TABLE 1

|  | Hot Pressed Ingot | Hot Forging Only | Heat Treatment After Hot Forging |
|---|---|---|---|
| Resistivity (mΩ · cm) | 1.100 | 1.154 | 1.014 |
| Seebeck Coefficient (μV/deg) | −190 | −198 | −191 |
| Thermal Conductivity (mW/cmdeg) | 13.9 | 13.7 | 14.4 |
| Figure of Merit (× $10^{-3}$ 1/deg) | 2.36 | 2.48 | 2.50 |

Performance of the material after heat treatment was compared by performing hot forging with the compression ratio varied. The results are shown in Table 2.

TABLE 2

| Compression Ratio | 1/2 | 1/4 | 1/10 |
|---|---|---|---|
| Resistivity (mΩ · cm) | 1.014 | 0.969 | 0.92 |
| Seebeck Coefficient (μV/deg) | −190 | −190 | −191 |
| Thermal Conductivity (mW/cmdeg) | 14.4 | 14.6 | 15.0 |
| Figure of Merit (× $10^{-3}$ 1/deg) | 2.50 | 2.55 | 2.64 |

Figure 8:
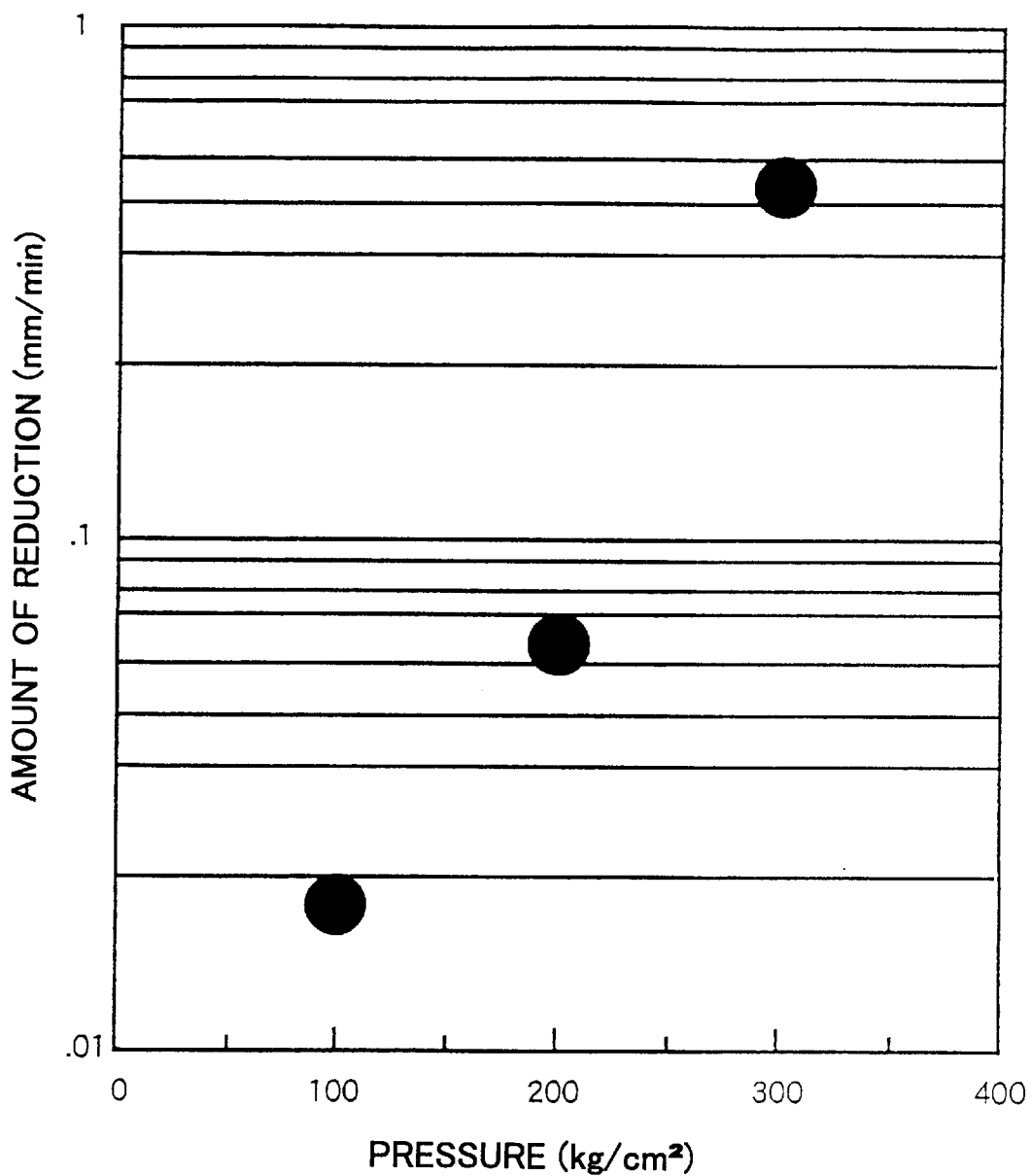
FIG. 8 is a view showing the relationship of pressing force in hot upset forging according to the present invention and amount of reduction of ingot thickness.

As is clear from Table 2, if the compression ratio is increased, the amount of plastic deformation becomes larger, the alignment is improved, and the thermoelectric performance is also improved. As shown in FIG. 8, by increasing the pressing force, the speed of compression (amount of diminution of thickness) is increased, and the pressing time is reduced, but cracks are produced in the peripheral region during processing, resulting in a diminution in the region of high density, so that the usable locations are in fact reduced. It is therefore desirable that application of pressure should be such that cracks are not produced. This force of pressing also depends on the frictional force of the portion in contact with the punch and the ingot and base. In order to perform extension in a smooth manner, carbon powder or BN powder etc. was applied to the bottom face of the punch and the upper face of the base. By this means, deformation can easily be performed without producing cracks.

In this way, with a method according to the present invention, yield can be raised without lowering of density due to cracking etc. on forging, and thermoelectric semiconductor material with excellent alignment can be obtained.

It should be noted that, although this hot forging step was performed in an argon atmosphere, there is no restriction to this and it could be performed under vacuum or in an atmosphere of another inert gas.

Figure 10:
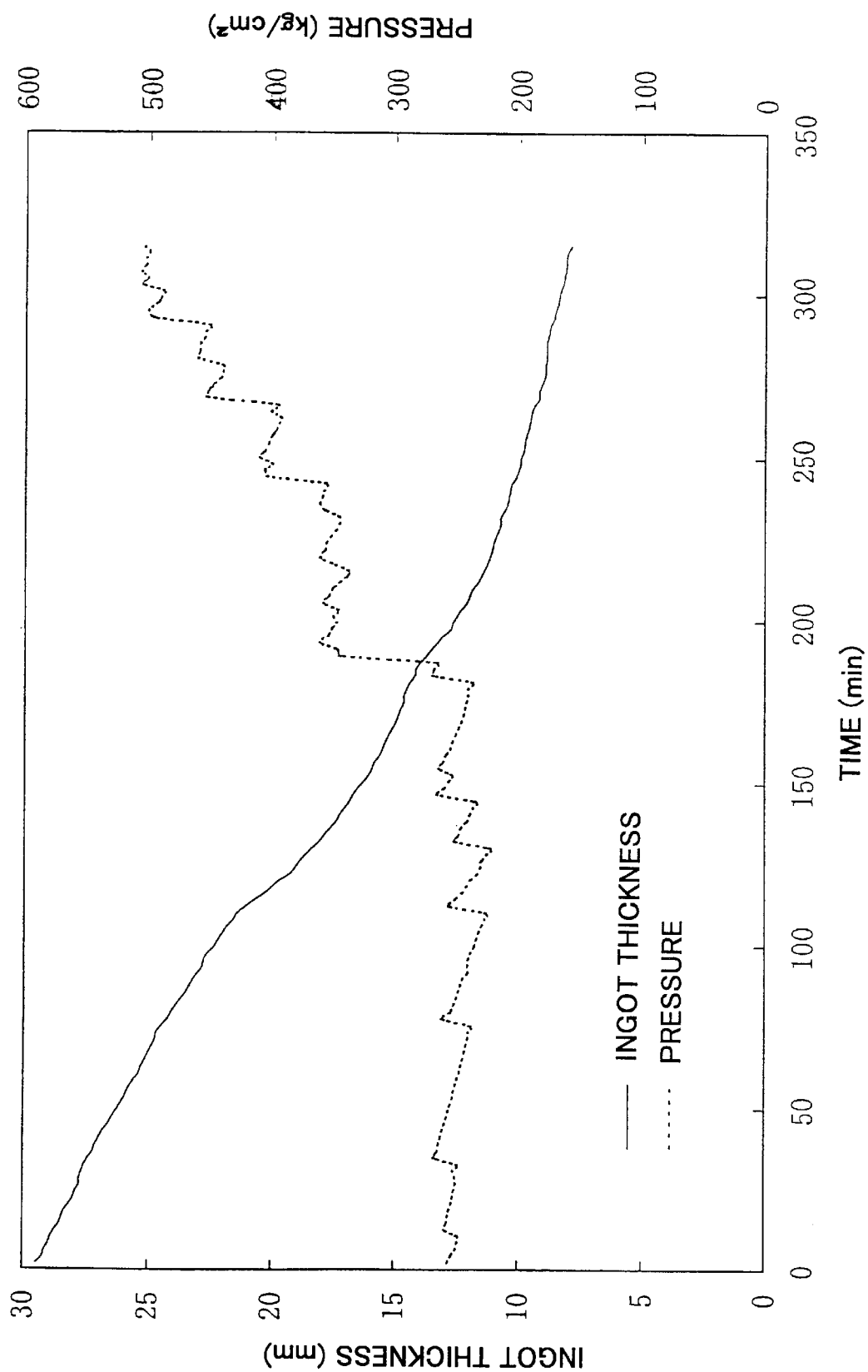
FIG. 10 is a view showing the relationship of pressure and time in a method according to an embodiment of the present invention with ingot thickness.
Figure 11:
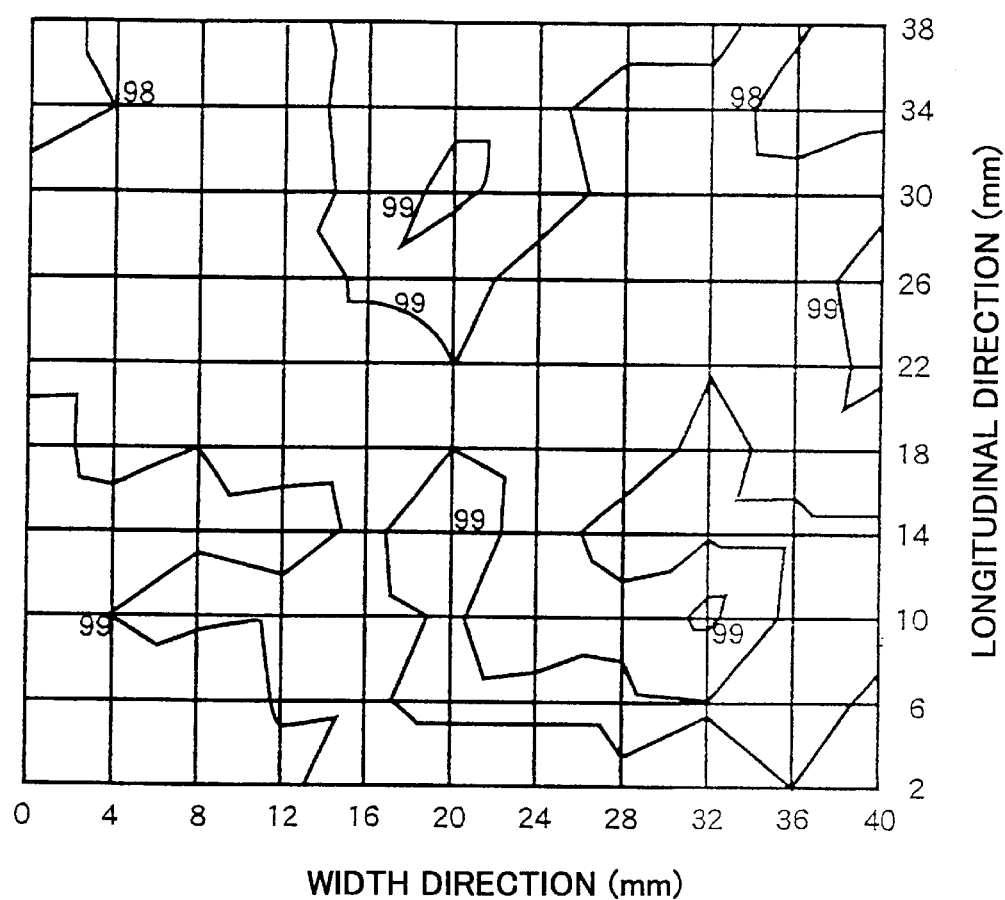
FIG. 11 is a view showing the distribution of density ratio in regard to a single crystal of four half portions of this ingot.

Next, as a second embodiment of the present invention, a method of upset forging will be described in which extension is made to occur freely in one axial direction only. In this method, as shown in FIG. 9, the forging step is effected by placing this ingot in a cemented carbide upsetting device and pressing in the same direction as the application of pressure during pressure sintering, for 5 hours at 100–500 kg/cm$^2$, at 450° C. The result of this is that the sintered ingot is compressed. FIG. 9(a) shows the condition before upset forging and FIG. 9(b) shows the condition after upset forging. This upsetting device comprises a base 11, a cylindrical sleeve 12 having a box-shaped hollow H in its interior, and a punch 13 formed such as to be inserted into hollow H of this sleeve 12; it is arranged such that ingot 14 is mounted on base 11 and is pressed by punch 13. This device is of super-hard construction and is arranged to be heated by a heating device, not shown, to about 450° C. The ingots were of thickness 30 mm, width 40 mm, and length in the direction of extension 18 mm. In this device, an ingot 14 is restrained from above and below and from the direction of the width of the hollow within the sleeve but, regarding the remaining two directions, these directions are in a free condition until [the ingot] contacts the wall of the sleeve; forging is performed such that the cleavage planes are aligned. FIG. 10 shows the results of measuring ingot thickness in relation to applied pressure and lapsed time in this process. As is clear from this Figure, the ingot thickness produced by pressing for a pressing period of 5 hours was about 7 mm, while the length direction was 80 mm, i.e. the same as the length in the direction of elongation of the mold, since pressure was applied until the ingot abutted the sleeve. A density ratio of at least 98% was reached by about 90% of this ingot. FIG. 11 shows the distribution of density ratio with respect to a single crystal of half of this ingot. The thermoelectric performance decreases when the density ratio decreases, and the material strength also becomes lower. In this example, the usable portion is the portion for which the density ratio is at least 97%, so practically all of the ingot can be used.

Table 3 shows the thermoelectric performance of the heat-treated ingot after this hot forging and of the center of the ingot before forging. In the case of this n-type material, the number of carriers is decreased due to crystal defects produced by hot forging, resulting in an increase in resistivity and the Seebeck coefficient. However, just as in the case of the first embodiment, by heat treatment in an argon gas atmosphere, the lattice defects produced by forging are eliminated, and the carrier concentration becomes the same as that of the starting ingot. This can be seen from the fact that the Seebeck coefficient is the same.

TABLE 3

|  | Hot Pressed Ingot | Hot Forging Center Part | Hot Forging End Part |
|---|---|---|---|
| Resistivity (mΩ · cm) | 1.200 | 0.950 | 1.050 |
| Seebeck Coefficient (μV/deg) | −200 | −200 | −198 |
| Thermal Conductivity (mW/cmdeg) | 13.8 | 15.0 | 14.2 |
| Figure of Merit (× $10^{-3}$ 1/deg) | 2.40 | 2.81 | 2.63 |

Next, a method in which a p-type element is formed will be described, as a third embodiment of the present invention. The elements bismuth Bi, tellurium Te, and antimony Sb were weighed out in the stoichiometric ratio $Bi_{0.4}Sb_{1.6}Te_3$, and a melt-grown material produced by adding an appropriate amount of Te to adjust the carrier concentration, dissolving, mixing and solidifying. This melt-grown material was crushed using a stamping mill or ball mill etc. and sieved using 150 mesh and 400 mesh sieves, selecting the material left on the 400 mesh sieve, to obtain powder of grain size adjusted to about 34–106 mm. In the case of a p-type material, the effect of fine grains and grain oxidation is small, so a hydrogen reduction step was not performed. This powder was then subjected to powder sintering with a sintering temperature of 500° C., with applied pressure of 750 kg/cm², using a hot press device. The sintered ingot was cut to a size of: height 30 mm, width 40 mm, length 18 mm, and placed in an upsetting device identical to that employed in the second embodiment, and subjected to forging by hot upset forging.

In the forging step, this ingot was placed in a cemented carbide upsetting device just as in the case shown in FIG. 9, and the sintered ingot was compressed by pressing in the same direction as the direction of pressing during pressure sintering, at 500° C., 100–500 kg/cm², for 5 hours. The thermoelectric performance of this hot-forged ingot and of the central portion of the ingot prior to forging are shown in Table 4. Heat treatment was not performed, since this p-type material was not found to show decrease in the number of carriers caused by hot forging to the same extent as the n-type material. If heat treatment is performed, the carrier concentration becomes less than that of the starting ingot.

TABLE 4

|  | Hot Pressed Ingot | Hot Forging Center Part | Hot Forging End Part |
|---|---|---|---|
| Resistivity (mΩ · cm) | 1.080 | 1.100 | 1.274 |
| Seebeck Coefficient (μV/deg) | 205 | 217 | 217 |
| Thermal Conductivity (mW/cmdeg) | 13.5 | 13.3 | 12.3 |
| Figure of Merit (× 10⁻³ 1/deg) | 2.9 | 3.2 | 3.0 |

Likewise, for $Bi_2Te_{2.85}Se_{0.15}$ and $Bi_{0.5}Sb_{1.5}Te_3$, the thermoelectric performance of the hot forged ingot and of the central part of the ingot before forging were measured, the results being respectively shown in Table 5 and Table 6.

TABLE 5

|  | Hot Pressed Ingot | Hot Forging Center Part | Hot Forging End Part |
|---|---|---|---|
| Resistivity (mΩ · cm) | 1.100 | 0.880 | .990 |
| Seebeck Coefficient (μV/deg) | −200 | −200 | −197 |
| Thermal Conductivity (mW/cmdeg) | 15.8 | 16.9 | 15.8 |
| Figure of Merit (× 10⁻³ 1/deg) | 2.35 | 2.70 | 2.48 |

TABLE 6

|  | Hot Pressed Ingot | Hot Forging Center Part | Hot Forging End Part |
|---|---|---|---|
| Resistivity (mΩ · cm) | 1.200 | 0.880 | 1.300 |
| Seebeck Coefficient (μV/deg) | 210 | 200 | 219 |

TABLE 6-continued

|  | Hot Pressed Ingot | Hot Forging Center Part | Hot Forging End Part |
|---|---|---|---|
| Thermal Conductivity (mW/cmdeg) | 13.0 | 13.2 | 12.7 |
| Figure of Merit (× 10⁻³ 1/deg) | 2.83 | 3.0 | 2.90 |

Figure 12:
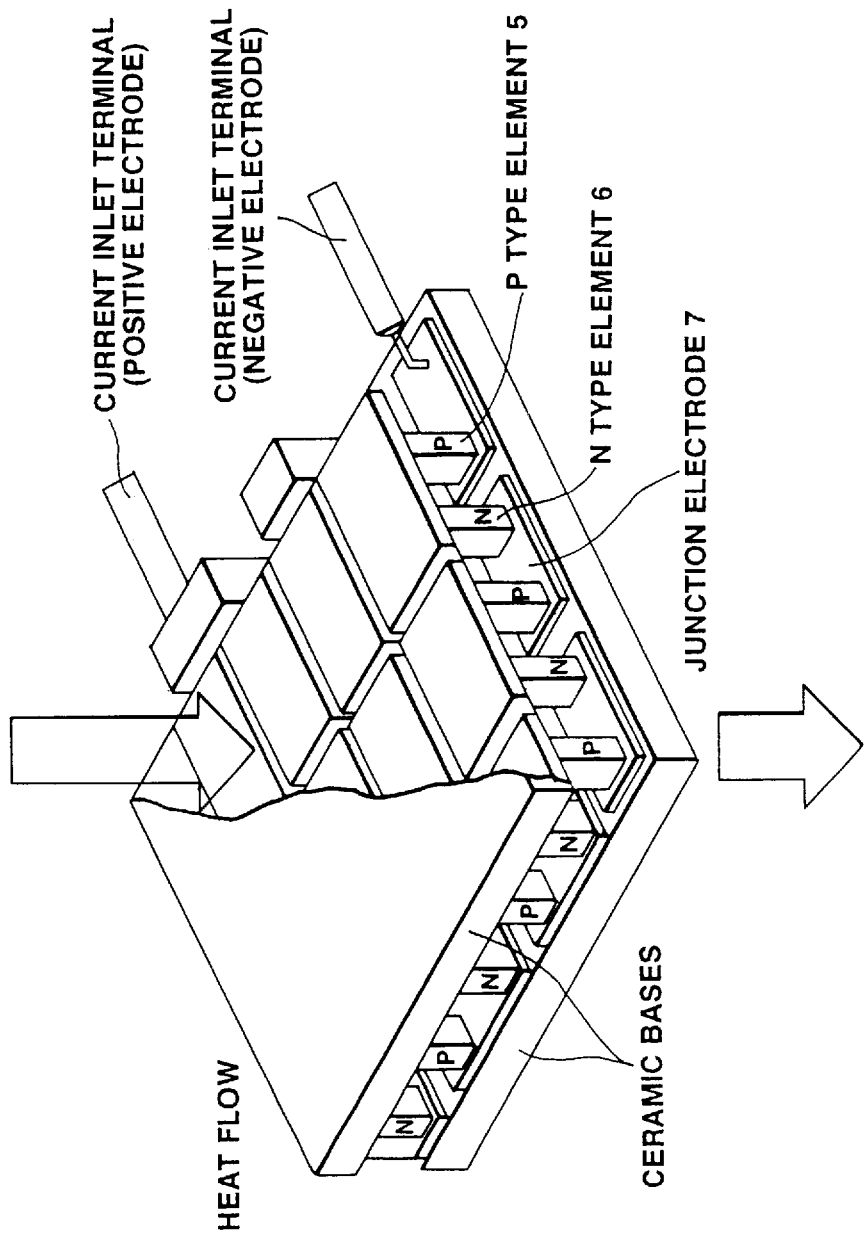
FIG. 12 is a view showing a thermoelectric module.

Next, using the portion of the n-type $Bi_2Te_{2.7}Se_{0.3}$ ingot manufactured by the method of the second embodiment as described above whose density was at least 97%, representing 80% of the ingot, wafers of thickness 1.3 mm were formed by slicing perpendicularly to the direction of extension. An electrode metal layer was formed on the front face and the back face of these wafers. Next, chips of 0.64 mm square were formed by dicing. A n-type element was obtained by randomly selecting from these (see Table 3). In addition, a p-type element (see Table 4) was obtained by processing to the same size a chip obtained from a p-type ingot of $Bi_{0.4}Sb_{1.6}Te_3$, formed by the method of the third embodiment. A thermoelectric module as shown in FIG. 12 was formed by mounting 18 pn element pairs each consisting of such an n-type element and p-type element.

Sixteen of such thermoelectric modules were formed and the maximum temperature difference was measured. The mean value of this maximum temperature difference was calculated and the relationship of this with gradient surface temperature is indicated by the curve a in FIG. 13. Curve b shows for comparison the results obtained by forming a thermoelectric module with the same material, performing dicing after hot pressing but without conducting hot upset forging, the other steps being exactly the same. In a region of radiant surface temperature 0° C.–80° C., the maximum temperature difference of the thermoelectric module formed by hot upset forging treatment greatly exceeded the maximum temperature difference of the module formed by hot pressing, proving that thermoelectric performance was improved by the hot upset forging in Table 3 and Table 4. The currents giving the maximum temperature differences were 1.5 to 1.6 A in the case of both modules. The standard deviation of the maximum temperature difference was 0.4 to 0.5° C. Also, when for example the radiant surface temperature was 27° C., excellent results were recorded, the maximum temperature difference of the thermoelectric module formed by hot upset forging treatment being over 75° C.

A study of the strength of thermoelectric modules formed as described above was made.

Failure of the thermoelectric module generally resulted from breakage of the p-type and n-type elements when shearing stress was applied to the thermoelectric module in question. Accordingly, as shown in FIG. 17, the shearing strength of these p-type elements and n-type elements was measured, employing a sample material obtained by soldering a p-type element 5 or n-type element 6 to one side of a ceramic plate 15 obtained by the process of manufacturing a thermoelectric module.

Figure 17A:
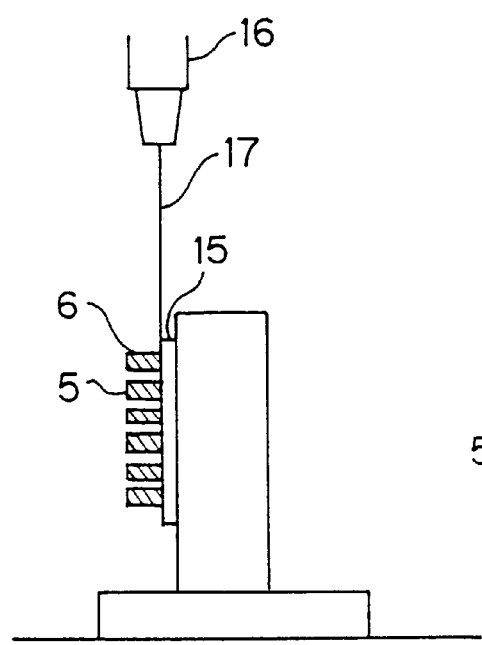
FIGS. 17(a) and 17(b) are views given in explanation of how the strength of a thermoelectric module manufactured according to an embodiment of the present invention is measured.
Figure 17B:
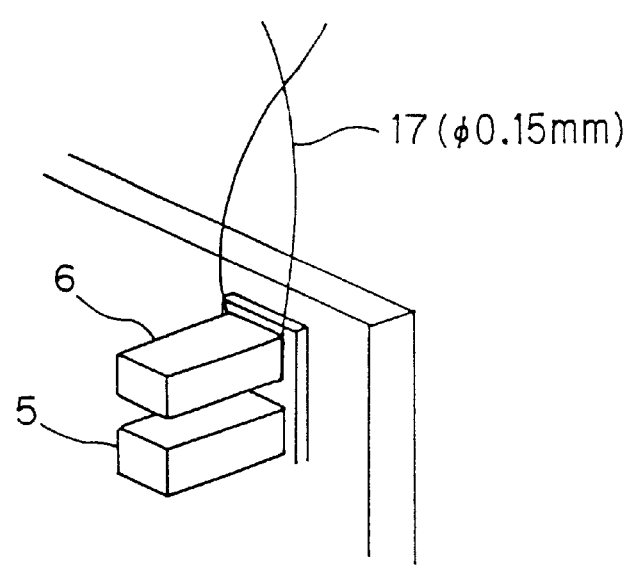

Specifically, as shown by the side view thereof in FIG. 17(*a*) and the partial perspective view of FIG. 17(*b*), the shearing strength was measured, using a push-pull gauge 16, when pulling up with a speed of 10 mm/min a wire 17 of thickness 0.15 mm attached to the root of p-type element 5 or n-type element 6.

Next, Table 10 shows the results of measuring, using a push-pull gauge, the shearing strength of p-type elements and n-type elements produced using a forged ingot obtained by hot upset forging.

Also, the following Table 11 shows the results of measurement using a shearing strength meter of the shearing strength of p-type elements and n-type elements produced from a sintered ingot of the same material but in which no hot upset forging was performed after hot pressing.

Also, next, Table 12 shows the results obtained by measurement using a shearing strength meter, of the shearing strength of p-type elements and n-type elements produced using melt-grown material obtained by producing unidirectional solidified melt-grown material by Stockbarger's method instead of a hot press, using the same raw material.

TABLE 10

Shearing Strength of Elements Employing Hot Forged Material

| | P-type Element | N-Type Element |
|---|---|---|
| Mean Value of Shearing Strength (g/mm$^2$) | 1472 | 2185 |
| Standard Deviation of Shearing Strength (g/mm) | 112 | 158 |
| Number of Measured Elements | 52 | 52 |

TABLE 11

Shearing Strength of Elements Employing Hot Forged Material

| | P-type Element | N-Type Element |
|---|---|---|
| Mean Value of Shearing Strength (g/mm$^2$) | 1430 | 1914 |
| Standard Deviation of Shearing Strength (g/mm$^2$) | 132 | 224 |
| Number of Measured Elements | 65 | 65 |

TABLE 12

Shearing Strength of Elements Employing Hot Forged Material

| | P-type Element | N-Type Element |
|---|---|---|
| Mean Value of Shearing Strength (g/mm$^2$) | 1413 | 1176 |
| Standard Deviation of Shearing Strength (g/mm$^2$) | 429 | 347 |
| Number of Measured Elements | 53 | 53 |

Comparing these Tables, it can be seen that the shearing strength of n-type elements 6 was larger when these were constituted by hot forged material or hot pressed material than in the case where melt-grown material elements were employed (2185 and 1914 respectively, compared with 1176); the strength of the hot forged material elements was even better than that of the hot pressed material elements (2185 compared with 1914). It can further be seen that the standard deviation of the shearing strength decreased in the order: melt-grown material elements, hot pressed material elements, hot forged material elements (from 347 to 224 and from 224 to 158).

In contrast, in the case of the p-type elements 5, although the difference was only slight, the magnitude of the shearing strength increased in the order: melt-grown material elements, hot pressed material elements, hot forged material elements (from 1413 to 1430, and from 1430 to 1472). The standard deviation of the shearing strength also decreased in the order: melt-grown material elements, hot pressed material elements, hot forged material elements (from 429 to 132, and from 132 to 112).

The significance of this is that the probability of failure below the mean value of the shearing strength is high since, when the standard deviation of the shearing strength increases the probability of failure becomes higher even below the mean value of the shearing strength. It should be noted that other parameters could be used to evaluate the statistical scatter of shearing strength instead of the standard deviation, such as for example the dispersion.

It can therefore be concluded that not only do elements produced using hot forged material have higher shearing strength than elements of other material but also their reliability is higher since the probability of failure below the mean value of the shearing strength is low.

Therefore, by employing hot forged material for the thermoelectric module, breakage of modules during assembly can be minimized, high durability can be obtained, and reliability improved.

Also, thermoelectric modules were manufactured by forming respective n-type elements and p-type elements in the same way (see Table 5 and Table 6), using $Bi_2Te_{2.85}Se_{0.15}$ and $Bi_{0.5}Sb_{1.5}Te_3$ in the same way. The mean value of the maximum temperature difference of these thermoelectric modules was calculated and the relationship of this with radiant surface temperature is shown by the curve a in FIG. 14. Also, for comparison, curve b shows the results of forming a thermoelectric module of identical material but performing dicing after hot pressing without performing hot upset forging, but conducting all the other steps in exactly the same way. In the region of radiant surface temperature 0°C.–80° C., the maximum temperature difference of the thermoelectric modules formed by hot upset forging processing exceeded the maximum temperature difference of modules formed by hot pressing. The currents giving rise to the maximum temperature difference were 1.3 to 1.4 A in the case of both modules.

Figure 13:
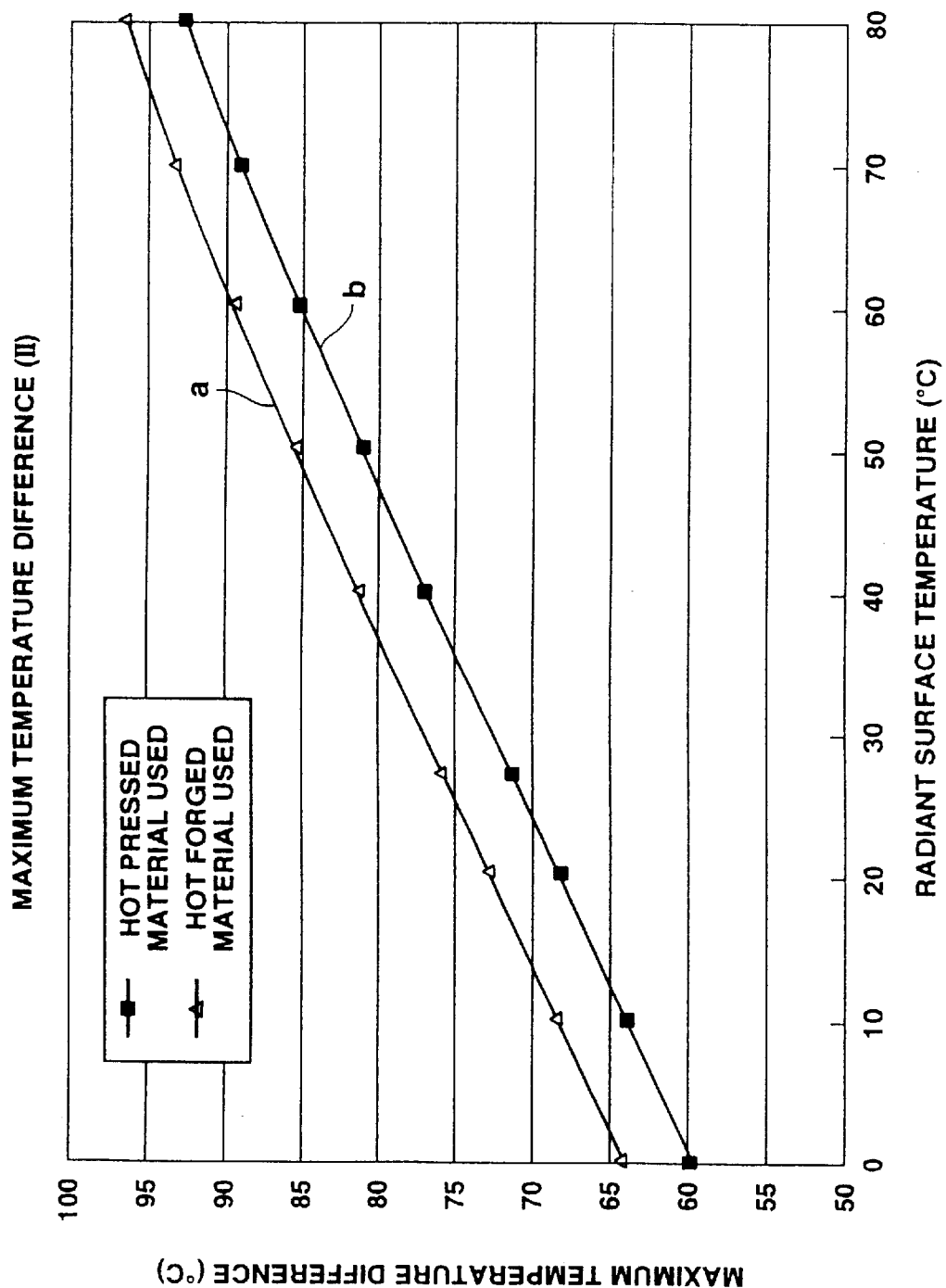
FIG. 13 is a view showing the relationship between the heat radiation surface temperature of a thermoelectric module formed using a thermoelectric element material formed by a method according to the present invention with maximum temperature difference.
Figure 14:
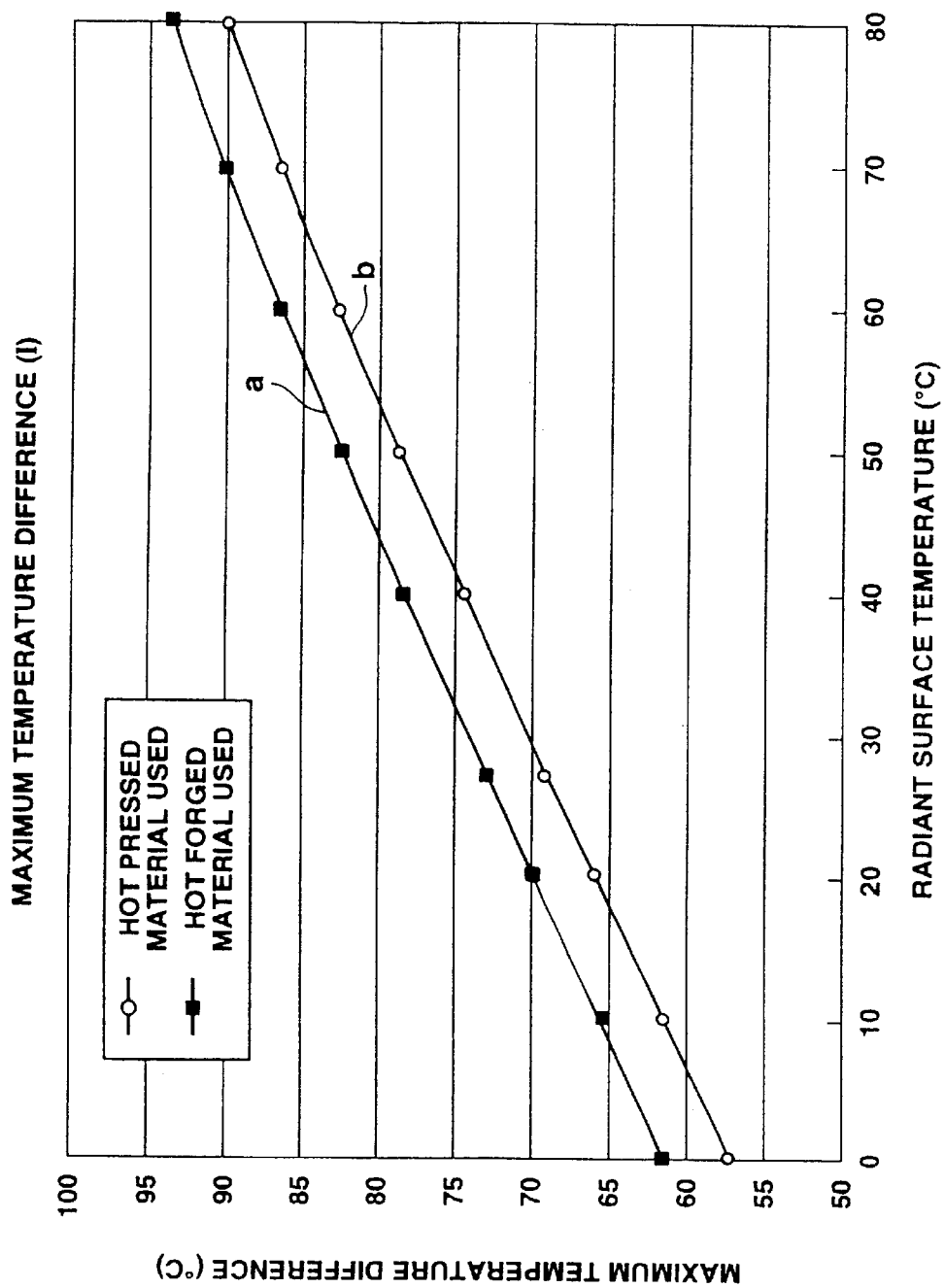
FIG. 14 is a view showing the relationship of heat radiation surface temperature of a thermoelectric module formed using a thermoelectric element material formed by a method according to the present invention with maximum temperature difference.

By comparing FIG. 13 and FIG. 14, it can be seen that, although there is some variation depending on material, in both cases, the present invention is beneficial.

As a result of further experiments, the present inventors elucidated the effect on the following parameters of performance. In general terms, these were as follows.

(1) Density Ratio

When the density of the sintered ingot decreases, thermal conductivity decreases, and thermoelectric performance decreases due to increase in electrical resistance. Also, the material strength is lowered.

A range of density ratio therefore exists in which thermoelectric performance can be improved and material strength is not impaired; it has been found that the final density produced by hot forging of the sintered ingot should be at least 97%. It has been found that a final density ratio of this level can be achieved by hot forging of a sintered ingot of density ratio at least 97%.

The term "density ratio" means the ratio of the density of the compressed powder after plastic processing and the true density (ideal density) of a substance of the same composition as this compressed powder (single crystals prior to crushing).

(2) Plastic Processing Temperature

In hot forging processing and warm forging processing, as the plastic processing proceeds, apart from crystal distortion, crystal recovery proceeds concurrently. In hot plastic processing of thermoelectric semiconductors, it is believed that flow of the powder grain boundaries or crystal grain boundaries of the sintered material occurs in addition to this crystal distortion and recovery, but the details thereof are still unclear.

That is, it has been found that increasing the hot forging ratio makes the structure when observed by a polarizing microscope more uniform, and the crystal distortion and recovery produced by plastic processing greatly contribute to improved alignment. In this connection, although crystal distortion and recovery are promoted when the temperature becomes high, above the recrystallization temperature, grain growth of the crystal grains occurs irrespective of alignment, resulting in a lowering of the degree of alignment, and the material strength is also lowered. When the temperature becomes high, the deformation speed of the ingot is increased. That is, when the temperature is high, the structure becomes fluid and plastic deformation takes place before alignment of orientation can occur; this prevents any further increase in alignment.

On the other hand, when the temperature is too low, there is the problem that plastic deformation itself becomes slow, such as to be unsuitable for practical processing.

It thus became clear that there exists an optimum temperature range for plastic processing of the sintered ingot, and that it is necessary that this should be below the grain growth temperature, at which crystallite increases, causing alignment to be lost.

Specifically, it was found that it should be in a range of below 550° C. but above 350° C., at which plastic deformation can occur at a practically useful rate.

It should be noted that it is believed that it is desirable that the temperature range of hot pressing and the temperature range of plastic processing should be the same.

(3) Plastic processing load

Increasing the load that is applied to the sintered ingot increases the rate of deformation. However, as the load is increased, frictional resistance increases, resulting in buckling of the ingot. Also, if the load is weak so that the deformation rate is slow, no marked improvement is seen in alignment, possibly because flow occurs only at grain boundaries. The deformation rate is determined by the initial loading pressure that is initially applied to the sintered ingot. Also, it is necessary that this initial load pressure should be a force greater than the yield stress of the sintered ingot.

It was thus found that an optimum range of the initial load pressure exists, this range being a range of above 70 kg/cm$^2$ but below 350 kg/cm$^2$.

(4) Forging Process

Although an upset forging step is a basic precondition of the present invention, it was found that the density ratio of (1) above could be further improved by suitably adding a mold forging process to this upset forging step.

Specifically, it was found that, by, after the sintered ingot had been extended in a free direction by upset forging, further subjecting it to pressure in a condition in which this free direction was restrained by a jig or the like made it possible to effect a recovery of the density ratio after this had dropped, thereby achieving an improvement in density ratio.

It was also discovered that, likewise, improvement in density ratio by recovery after the initial drop of density ratio could be achieved by subjecting the sintered ingot to a hot mold forging step after the hot upset forging.

(5) Number of Times of Forging

It was also discovered that the thermoelectric performance could be raised by further improving alignment by increasing the number of forging steps or progressively increasing the compression ratio.

(1)–(5) above will be further described below with reference to specific embodiments.

Fourth Embodiment

First of all, a specific example of improved performance due to the achieving of a density ratio of 97% or more in (1) above will be described.

In this embodiment, an n-type thermoelectric semiconductor of composition $Bi_2Te_{2.7}Se_{0.30}$ identical with that of the second embodiment described above was crushed with mean grain size of 20 μm and the crushed product was then powder-sintered by hot pressing with a sintering temperature of 500° C., pressing force of 750 kg/cm . A product of mean grain size (20 μm) smaller than that of the second embodiment was employed.

Figure 15:
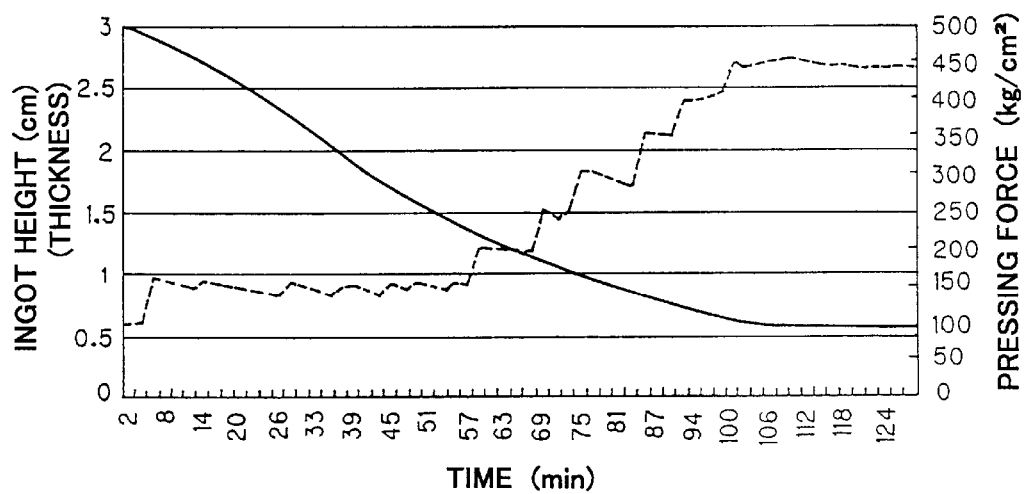
FIG. 15 is a view showing the time changes of pressure and ingot height in a method according to an embodiment of the present invention.

After this, just as in the case of the second embodiment, hot forging was performed in which the load pressures shown in FIG. 15 were applied at 400° C., using an upsetting device in which free extension was effected in one axial direction only, as shown in FIG. 9. Specifically, as the load pressure, the initial load was 100 kg/cm$^2$, this being finally increased to 450 kg/cm$^2$.

After this, this forged ingot was subjected to annealing in an argon filled glass sealed tube for 148 hours at 400° C.

Next, Table 7 shows the results of comparing the second embodiment and this fourth embodiment. In Table 7 "hot pressing 1" indicates the case where only hot pressing is performed in the second embodiment, the hot forging step being omitted, while "hot forging 1" indicates the case where a hot forging step was performed in the second embodiment. Also, "hot pressing 2" indicates the case where only hot pressing was performed in the fourth embodiment, the hot forging step being omitted, and "hot forging 2" indicates the case where a hot forging step was performed in the fourth embodiment.

TABLE 7

|  | Hot Pressing 1 | Hot Forging 1 | Hot Pressing 2 | Hot Forging 2 |
|---|---|---|---|---|
| Resistivity (mΩ · cm) | 0.950 | 0.950 | 1.283 | 1.056 |
| Seebeck Coefficient (μV/deg) | −200 | −200 | −192 | −192 |
| Thermal Conductivity | 13.8 | 15.0 | 13.8 | 14.4 |
| Anisotropy Ratio of Resistance | 1.7 | 2.25 | 1.01 | 2.42 |
| Density Ratio | 99.8% | 99.3% | 96.8% | 96.8% |
| Figure of Merit (× 10$^{-3}$/deg) | 2.40 | 2.81 | 2.08 | 2.45 |

In the above, the anisotropy ratio of resistance is a value indicating the directionality of the resistance; larger values of this indicate a marked improvement in crystal alignment.

Also, as an evaluation criterion of the figure of merit Z, a threshold value of 2.54 was selected. A figure of merit Z of 2.45 or more was evaluated as improved thermoelectric performance.

As can be seen from this Table, in this fourth embodiment, since a comparatively fine powder (mean grain size 20 μm) was employed, the density ratio of a sintered ingot that had been subjected to hot forging was low (96.8%), and the anisotropy ratio of resistance, which indicates the degree of alignment of the crystals, was also low (1.01).

It was also found that, when this sintered ingot was subjected to forging in a uniaxial direction, compared with the second embodiment, the speed of processing was faster in proportion to the lowering of forging temperature (400° C. as compared with 450°C. in the second embodiment) (see FIG. 10 and FIG. 15).

It can also be seen that although, in the fourth embodiment, the density ratio of the forged ingot after hot forging was the same density (96.8%) as that of the sintered ingot prior to forging, the figure of merit was improved (2.45). This is believed to be due to improvement in crystal alignment due to forging. The increase (2.42) in the anisotropy ratio of the resistance is because of this.

However, as compared with the forged ingot after hot forging in the second embodiment, it was found that the figure of merit was lower (2.45 as against 2.81 in the second embodiment), since the density ratio was lower.

This lowering of the figure of merit in the fourth embodiment compared with the second embodiment in spite of the improvement in anisotropy ratio of the resistance may be explained as follows. Specifically, although the figure of merit Z is determined by the two factors: anisotropy ratio of resistance and density ratio, the contribution of the density ratio is larger than the contribution of the anisotropy ratio of resistance.

Consequently, in this fourth embodiment, in which the density ratio is less than 97%, although the anisotropy ratio of the resistance is improved, the figure of merit Z is unable to rise much beyond the evaluation criterion of 2.45.

From the above, the conclusion was obtained that, in order to improve thermoelectric performance, it is desirable to make the density ratio of the sintered ingot prior to hot forging at least 97%. The conclusion was also obtained that it is desirable that the density ratio of the forged ingot finally obtained by hot forging should be at least 97%. Also, the conclusion was obtained that it is desirable to perform hot forging of a sintered ingot of density ratio at least 97% so as to make its final density ratio at least that of the sintered ingot prior to this forging.

Fifth Embodiment

Next, specific examples will be described in which an improvement in performance is achieved by increasing the number of times that the forging step of (5) above is performed.

Figure 16:
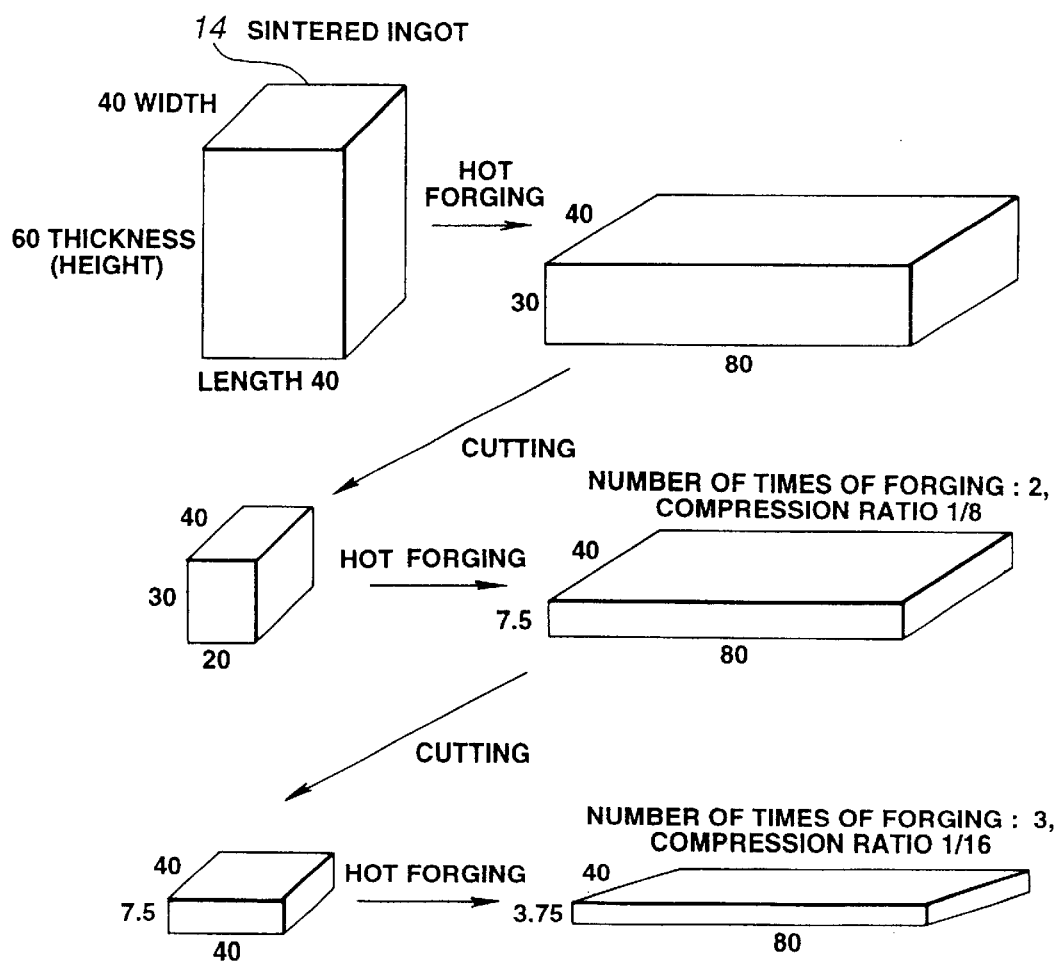
FIG. 16 is a view showing what happens when the forging step of an embodiment of the present invention is repeated.

In this embodiment, n-type thermoelectric semiconductor material of the same composition $Bi_2Te_{2.7}Se_{0.30}$ as in the second embodiment described above was sintered by the same method of manufacture as in the case of the second embodiment. As shown in FIG. 16, the sintered ingot 14 that was thus obtained had a height (thickness) of 60 mm, width 40 mm, and length in the direction of extension of 40 mm.

Forge-processed material of large compression ratio was successively manufactured by subjecting such a sintered ingot 14 to hot forging once, twice and three times. Specifically, the first forging resulted in a compression ratio of ½, the second forging in a compression ratio of ⅛, and the third forging in a compression ratio of 1/16.

The forged ingot after this final forging was then subjected to heat treatment for 24 hours at 400° C. under an argon-replaced atmosphere.

Table 8 below shows the mean values of thermoelectric performance and anisotropy of resistance of those portions of the forged ingot whose density ratio exceeded 97%.

TABLE 8

| Number of Forging | 1 | 2 | 3 |
|---|---|---|---|
| Compression Ratio | 1/5 | 1/8 | 1/16 |
| Resistivity (mΩ · cm) | 1.006 | 0.88 | 0.86 |
| Seebeck Coefficient (µV/deg) | −198 | −191 | −190 |
| Thermal Conductivity (mW/cm · deg) | 15.2 | 15.9 | 16.0 |
| Figure of Merit (× 10⁻³ /deg) | 2.56 | 2.61 | 2.62 |
| Anisotropy Ratio of Resistance | 2.19 | 2.52 | 2.55 |

For the data in this Table 8 where the number of times of forging was once (compression ratio ½), the mean values of the portions whose density ratio was more than 97% in the forged ingot obtained in the second embodiment were employed.

As can be seen from this Table, when the compression ratio is increased, the amount of plastic deformation becomes larger, alignment is improved, and thermoelectric performance is improved (from a figure of merit of 2.19 to 2.52 and from 2.52 to 2.55).

Some change in carrier concentration also occurs due to the increase in compression ratio. This can be understood by considering the change of the Seebeck coefficient in accordance with the compression ratio.

The reason why, even though the anisotropy ratio of resistance was larger for the forged ingots that had been subjected to forging a plurality of times (at 2.52 and 2.55 in comparison with the value of 2.19 of the ingot that had been forged once), the figure of merit was not very greatly increased (2.61 and 2.62 in comparison with 2.56 for the ingot that had been forged once) is believed to be that, whereas the composition of the sintered ingot constituting the starting material was formed with the optimum carrier concentration that gives rise to maximum thermoelectric performance, in the case of the ingots that were forged a plurality of times, the composition obtained gave a carrier concentration departing somewhat from this optimum carrier concentration.

That is, this can be understood as caused by change of the carriers of the sintered ingot of the starting material to a concentration matching the compression ratio.

Sixth Embodiment

Next, specific examples of improvement in performance depending on the number of times of forging just as in the case of the fifth embodiment will be described for the case where a p-type material is employed.

In this embodiment, p-type thermoelectric semiconductor material of the same composition $Bi_{0.4}Sb_{1.6}Te_3$ as in the case of the third embodiment described above was sintered in the same method of manufacture as in the case of the third embodiment. The sintered ingot 14 which was thus obtained, as shown in FIG. 16, was of height (thickness) 60 mm, width 40 mm, and length in the direction of extension 40 mm.

This sintered ingot 14 was used to produce forged materials of progressively larger compression ratio by hot forging once, twice and three times. Specifically, by the first forging, a compression ratio of ½ was produced, by the second forging a compression ratio of ⅛, and by the third forging a compression ratio of 1/16.

The forged ingots after this final forging were subjected to heat treatment for 24 hours at 400° C. in an argon-replaced atmosphere.

Table 9 below shows the mean values of thermoelectric performance and resistance anisotropy of those parts in the forged ingots which were of density ratio more than 97%.

TABLE 9

| Number of Forging | 1 | 2 | 3 |
|---|---|---|---|
| Compression Ratio | 1/2 | 1/8 | 1/16 |
| Resistivity (mΩ · cm) | 1.1 | 0.95 | 0.84 |
| Seebeck Coefficient (µV/deg) | 217 | 207 | 200 |
| Thermal Conductivity (mW/cm · deg) | 13.3 | 14 | 14.2 |
| Figure of Merit (× 10⁻³ /deg) | 3.2 | 3.22 | 3.35 |
| Anisotropy Ratio of Resistance | 1.38 | 1.57 | 1.70 |

For the data where the number of times of forging was once (compression ratio ½) shown in Table 9, the mean values of portions where the density ratio in the forged ingot obtained in the third embodiment was 97% or more were employed.

As can be seen from this Table, when the compression ratio increases, plastic deformation increases, alignment is improved and thermoelectric performance is improved (figure of merit improved from 3.2 to 3.22 and from 3.22 to 3.35).

Seventh Embodiment

Next, the effect of hot press sintering temperature on performance was studied.

In this embodiment, an n-type thermoelectric semiconductor of the same composition $Bi_2Te_{2.7}Se_{0.30}$ as in the case of the second embodiment described above was crushed with mean grain size 40 μm and powder-sintered by hot pressing with a pressing force of 750 kg/cm$^2$ The hot pressing was performed using four different sintering temperature conditions, namely, 400° C., 450° C., 500° C. and 550° C.

After this, in the same way as in the second embodiment, pressing was performed using an upsetting device in which the material was freely extended in one axial direction only as shown in FIG. 9 at 450° C. under a load pressure of 100 kg/cm$^2$–450 kg/cm$^2$.

The forged ingot after this forging was then subjected to annealing at 400° C. for 24 hours in an argon filled glass sealed tube.

The values of the physical properties of the central portion ("forged product" in the Table) of the forged ingot that was thus obtained and of the sintered ingot ("pressed product" in the Table) after hot pressing are shown in the following Tables 13, 14, 15 and 16 for the respective sintering temperatures 400° C., 450° C., 500° C. and 550° C.

TABLE 13

|  | Pressed Product | Forged Product |
| --- | --- | --- |
| Resistivity (mΩ · cm) | 1.93 | 1.62 |
| Seebeck Coefficient (μV/deg) | −236 | −235 |
| Thermal Conductivity (mW/cm · deg) | 13.8 | 14.1 |
| Figure of Merit (× 10$^{-3}$ /deg) | 2.09 | 2.58 |
| Anisotropy Ratio of Resistance | 1.87 | 2.38 |
| Density Ratio (%) | 98.4 | 99.6 |

TABLE 14

|  | Pressed Product | Forged Product |
| --- | --- | --- |
| Resistivity (mΩ · cm) | 1.85 | 1.52 |
| Seebeck Coefficient (μV/deg) | −237 | −235 |
| Thermal Conductivity (mW/cm · deg) | 14 | 14.1 |
| Figure of Merit (× 10$^{-3}$ /deg) | 2.17 | 2.58 |
| Anisotropy Ratio of Resistance | 1.87 | 2.38 |
| Density Ratio (%) | 98.5 | 99.9 |

TABLE 15

|  | Pressed Product | Forged Product |
| --- | --- | --- |
| Resistivity (mΩ · cm) | 1.79 | 1.48 |
| Seebeck Coefficient (μV/deg) | −238 | −235 |
| Thermal Conductivity (mW/cm · deg) | 14 | 14.2 |
| Figure of Merit (× 10$^{-3}$ /deg) | 2.26 | 2.65 |
| Anisotropy Ratio of Resistance | 1.83 | 2.49 |
| Density Ratio (%) | 99.5 | 99.2 |

TABLE 16

|  | Pressed Product | Forged Product |
| --- | --- | --- |
| Resistivity (mΩ · cm) | 1.86 | 1.57 |
| Seebeck Coefficient (μV/deg) | −239 | −232 |
| Thermal Conductivity (mW/cm · deg) | 13.9 | 14.1 |
| Figure of Merit (× 10$^{-3}$ /deg) | 2.19 | 2.43 |

TABLE 16-continued

|  | Pressed Product | Forged Product |
| --- | --- | --- |
| Anisotropy Ratio of Resistance | 1.34 | 2.25 |
| Density Ratio (%) | 99.6 | 99.1 |

From the above Tables, it can be seen that, with forged ingots that have been subjected to hot upset forging, a density ratio of at least 99% is achieved and material strength and thermoelectric performance are improved, irrespective of the production conditions (sintering temperature conditions) of the sintered ingot constituting the starting material of the forging step.

Furthermore, it can be seen that, in the case of sintered ingots constituting the starting material whose density ratio was about 98% after hot pressing (in the case of sintering temperatures of 400° C. and 450° C.), the density ratio was increased by hot upset forging (in the case of sintering temperature 400° C., increased from 98.4% to 99.6%, and, in the case of sintering temperature 450° C., increased from 98.5% to 99.9%).

Crystal alignment (anisotropy ratio of resistance) was found to be improved and increased by the performance of hot upset forging, irrespective of the manufacturing conditions (sintering temperature conditions) of the sintered ingot constituting the raw material of the forging step.

If the hot pressing temperature is high, the composition changes due to recrystallization during hot pressing, and this in fact lowers the anisotropy ratio of resistance (the anisotropy ratio of resistance of the sintered ingots in the case of a sintering temperature of 550° C. was 1.34). Consequently, although alignment was improved (increased from 1.34 to 2.25) when hot forging was performed using sintered ingots whose resistance anisotropy ratio had been thus lowered, since the alignment prior to commencement of forging was itself low (i.e. the resistance anisotropy ratio of the sintered ingot was low), a low figure of merit was obtained (2.43, which was below the evaluation criterion of 2.45). For example, the figure of merit of a forged ingot of sintering temperature 550° C. was 2.43 (resistance anisotropy ratio of the sintered ingot: 1.34), which was lower than the figure of merit of 2.65 of a forged ingot of sintering temperature 500° C. (resistance anisotropy ratio of the sintered ingot: 1.83).

Eighth Embodiment

Next, specific examples will be described in which the density ratio was increased and the thermoelectric performance increased by adding a mold forging process to the upset forging process, as described in (4) above.

In this embodiment, an n-type thermoelectric semiconductor material of the same composition $Bi_2Te_{2.7}Se_{0.30}$ as in the case of the first embodiment described above was sintered by the same method of manufacture as in the case of the first embodiment and second embodiment (sintering temperature 500° C., pressing force 750 kg/cm$^2$). From the thus-obtained powder sintered bodies, just as in the case of the second embodiment, two sintered ingots of height (thickness) 30 mm, width 40 mm, and length in the direction of extension 18 mm were cut and, subjecting these to respectively different forging steps, just as in the second embodiment, they were hot-forged at 450° C. using an upsetting device in which free extension was possible in one axial direction only, shown in FIG. 9.

Figure 18:
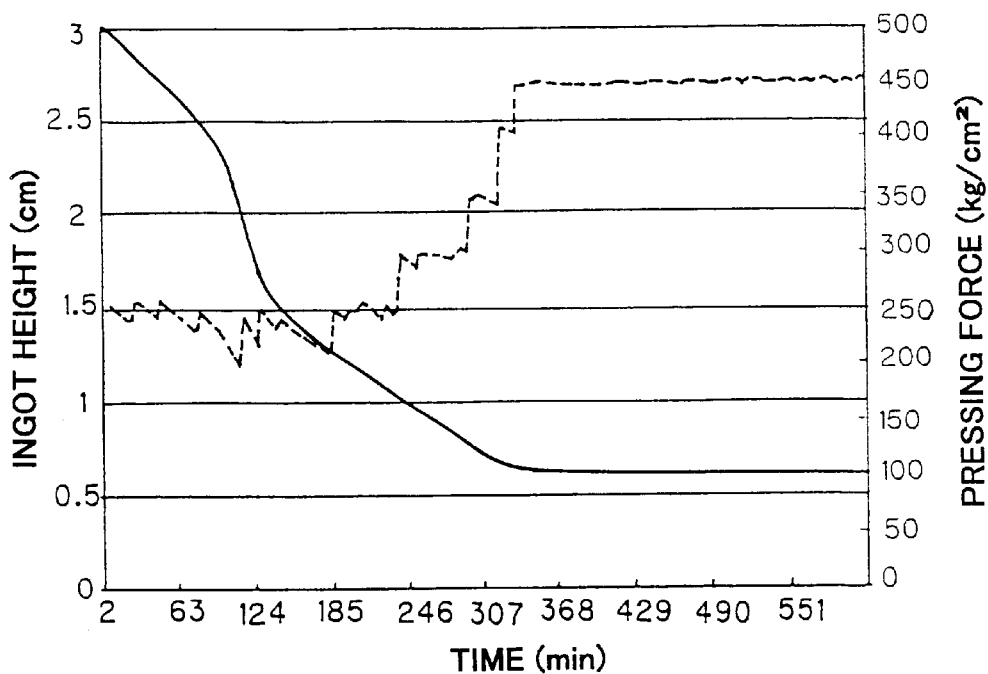
FIG. 18 is a view showing the change with time of pressure and ingot height in a method according to an embodiment of the present invention.

FIG. 18 shows the change in ingot height (solid line) and the change in load pressure (broken line) for one of the two sintered ingots when its direction of extension was restricted during the progress of extension by means of a jig (wall) added to the upsetting device, and pressing was then further continued while hot. Specifically, it was arranged for the latter half of the forging step to be performed by mold forging by, after the time point in the latter half of the upset forging in which the extending end of the ingot became restricted by the wall of the jig (i.e. a time point about 315 minutes after the commencement of forging), further continuing with pressing for about 5 hours and the load pressure raised to 450 kg/cm².

It can be seen from this Figure that since in the latter half of the forging step extension was not performed no change was found in the ingot height.

Figure 19:
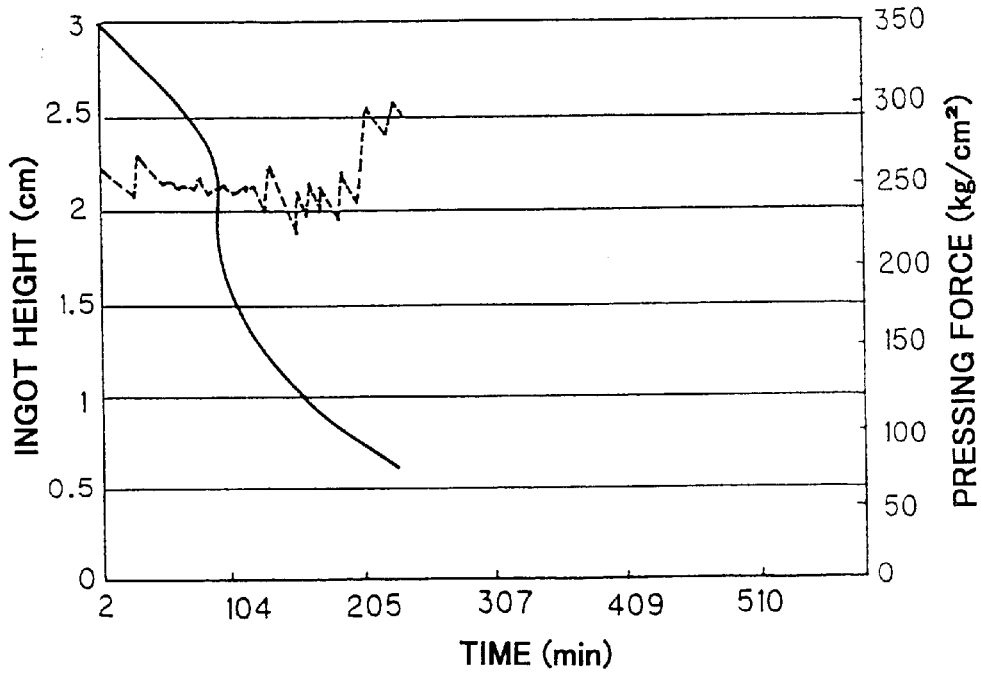
FIG. 19 is a view showing the change with time of pressure and ingot height in a method according to an embodiment of the present invention.

In contrast, FIG. 19 shows the change in ingot height and the change in load pressure when the other ingot of the two sintered ingots was likewise subjected to extension, but extension was halted (forging interrupted) before the extending end abutted the jig.

In both FIG. 18 and FIG. 19, the initial load pressure was 250 kg/cm².

Observing the forged ingots obtained in the forging step shown in FIG. 18, it can be seen that since pressing was carried out for a long time using a forging mold, the end portions were formed in square shape, and the surface was smooth. In contrast, in the case of the forged ingot obtained by a step in which forging was discontinued midway as shown in FIG. 19, the end portions were arcuate and a large number of fine cracks were observed in the surface.

Figure 20:
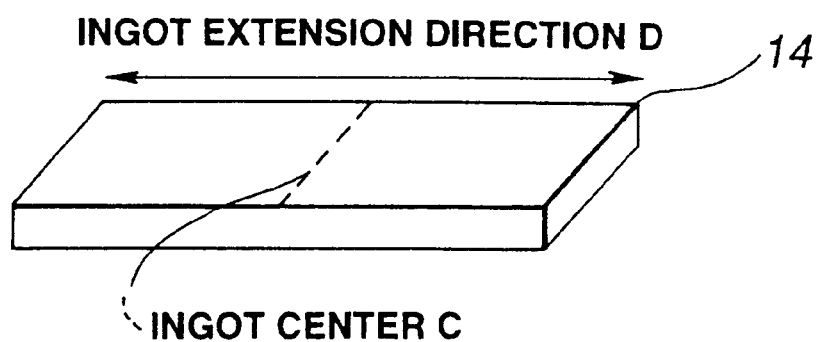
FIG. 20 is a view showing a measurement piece whereby the values of the physical properties of a forged ingot are measured.

Respective measurement pieces shown in FIG. 20 were cut from the two forged ingots 14 obtained by these different forging steps, and the physical properties: resistivity, density ratio, resistivity anisotropy ratio, Seebeck coefficient and power factor were measured for each of these measurement pieces. The results are shown in Tables 17 and 18 below. "Power factor" is the value obtained by dividing the square of the Seebeck coefficient by the resistivity: larger values of this imply better thermoelectric performance. As the criterion of "good thermoelectric performance" a power factor of 3.2 or more was selected.

Although scarcely any statistical scatter was observed in the physical properties of the measurement pieces (forged ingot 14) in regard to the height direction and width direction, statistical scatter in the distribution of the physical properties was seen in regard to the direction of extension D. In Tables 17 and 18 the values of the physical properties shown were obtained by taking the average in the width direction at various positions in the direction of extension D.

Table 17 shows the physical properties of the forged ingot obtained in the forging step shown in FIG. 18 at various distances in the direction of extension D from the center portion C of forged ingot 14 shown in FIG. 20.

Table 18 likewise shows the physical properties of the forged ingot obtained by the forging step shown in FIG. 19 at various distances in the direction of extension D from the center portion C of forged ingot 14.

TABLE 17

| Distance from the Central Part (mm) | Resistivity (mΩ · cm) | Seebeck Coefficient (μV/deg) | Density Ratio (%) | Anisotropy Ratio of Resistivity | Power Factor × $10^{-5}$ (W/cmK²) |
|---|---|---|---|---|---|
| 2 | 0.984 | −195 | 98.8 | 2.49 | 3.99 |
| 6 | 0.961 | −195 | 98.8 | 2.35 | 3.94 |
| 10 | 0.978 | −194 | 99.4 | 2.24 | 3.83 |
| 14 | 0.969 | −192 | 99.1 | 2.30 | 3.82 |
| 18 | 0.971 | −191 | 99.1 | 2.25 | 3.75 |
| 22 | 0.989 | −190 | 99.2 | 2.09 | 3.66 |
| 26 | 1.002 | −190 | 99.1 | 1.98 | 3.60 |

TABLE 17-continued

| Distance from the Central Part (mm) | Resistivity (mΩ · cm) | Seebeck Coefficient (μV/deg) | Density Ratio (%) | Anisotropy Ratio of Resistivity | Power Factor × $10^{-5}$ (W/cmK²) |
|---|---|---|---|---|---|
| 30 | 1.073 | −188 | 98.8 | 1.66 | 3.28 |
| 34 | 1.194 | −186 | 99.1 | 1.28 | 2.90 |

TABLE 18

| Distance from the Center Part (mm) | Resistivity (mΩ · cm) | Seebeck Coefficient (μV/deg) | Density Ratio (%) | Anisotropy Ratio of Resistivity | Power Factor × $10^{-5}$ (W/cmK²) |
|---|---|---|---|---|---|
| 2 | 0.993 | −195 | 97.7 | 2.34 | 3.82 |
| 6 | 0.992 | −193 | 97.6 | 2.31 | 3.77 |
| 10 | 1.005 | −193 | 97.4 | 2.23 | 3.70 |
| 14 | 1.026 | −192 | 97.0 | 2.12 | 3.59 |
| 18 | 1.023 | −190 | 97.2 | 2.06 | 3.54 |
| 22 | 1.122 | −188 | 96.5 | 1.85 | 3.16 |

As can be seen from these Tables, in the case of the forged ingot of Table 17 in which mold forging was performed in the latter half, the density ratio of all parts of the ingot was more than 98%; from this alone, the improvement in material strength and thermoelectric performance can be seen.

However, it was found that the anisotropy ratio of resistance decreased progressively from the center of the ingot going towards the ends, from which it can be seen that there was a progressive deterioration of alignment of crystal orientation. Also, just as in the case of the anisotropy ratio of resistance, the absolute value of the Seebeck coefficient decreases from the center of the ingot towards its ends, and it is found that resistivity increases going towards to the ends.

The reason for this progressive decrease in the Seebeck coefficient as the ends are approached is believed to be that the number of lattice defects increases due to forging as the ends are approached. Also, the reason for the progressive increase in resistivity as the ends are approached is believed to be deterioration in alignment of the crystal grains as the ends are approached.

Also, the power factor decreases progressively from the center of the ingot going towards the ends and from this fact also it can be seen that crystal alignment deteriorates and the thermoelectric performance decreases. However, a value of more than 3.6, which exceeds the evaluation criterion of 3.2 for the power factor is maintained from the center of the ingot up to a distance of 26 mm, from which it can be seen that the range in which use as a thermoelectric material is possible is wide.

In contrast, it can be seen that, in the case of the forged ingot of Table 18 obtained by interrupting forging before performing mold forging, the density ratio is lower than in Table 17. It should be noted that, in Table 18, the data for distances exceeding 22 mm are omitted since the density ratio at distances exceeding 22 mm from the ingot center was too low (density ratio less than 97%).

The reason why, even though the anisotropy ratio of resistance and the Seebeck coefficient are both practically the same as in Table 17 in the central region of the ingot (for example at a location at a distance of 2 mm from the center of the ingot), the resistivity is larger (0.993 as compared with 0.948) is believed to be that the density ratio is lower than that in Table 17 (97.7 as compared with 98.8). The reason for the drop in the power factor compared with Table 17 (3.82 compared with 3.99) is likewise believed to be the effect of the lowering of density ratio. From the fact that a power factor of more than 3.6 is only maintained for a distance of 10 mm from the center of the ingot, it can be seen that the range of usability as a thermoelectric material is smaller than in the case of Table 17.

From the results of the above comparison, it can be seen that not only the alignment but also the density ratio has a considerable effect on thermoelectric performance.

Also, considering the density ratio shown in Table 18 as being the density ratio up to midway through the extension, while the density ratio shown in Table 17 is the density ratio when, after extending midway, mold forging is further performed, it can be seen that even if the density ratio when the extension has proceeded midway has dropped, the density ratio can be improved and recovered by further subjecting this to mold forging.

Such a recovery of density ratio was likewise ascertained even for the case of p-type material, which is of different composition.

Although it was assumed above that the ingot was freely extended in one axial directions; it is possible, as in the first embodiment, for free extension to be allowed in two axial directions, the extension into these two directions then being simultaneously restrained.

Figure 30A:
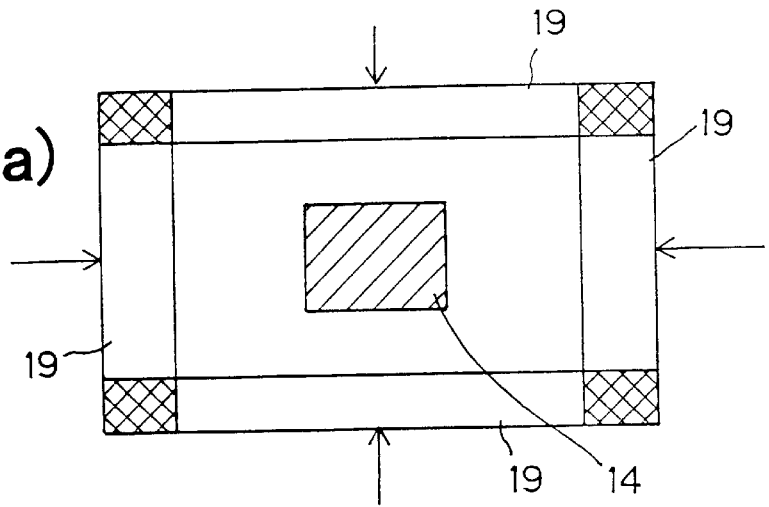
FIGS. 30(a) and 30(b) are views given in explanation of an upsetting device according to an embodiment of the present invention.
Figure 30B:
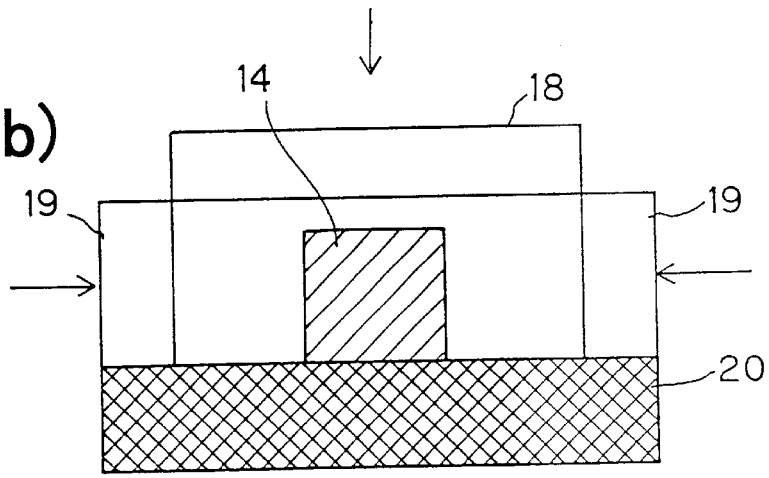
Figure 31A:
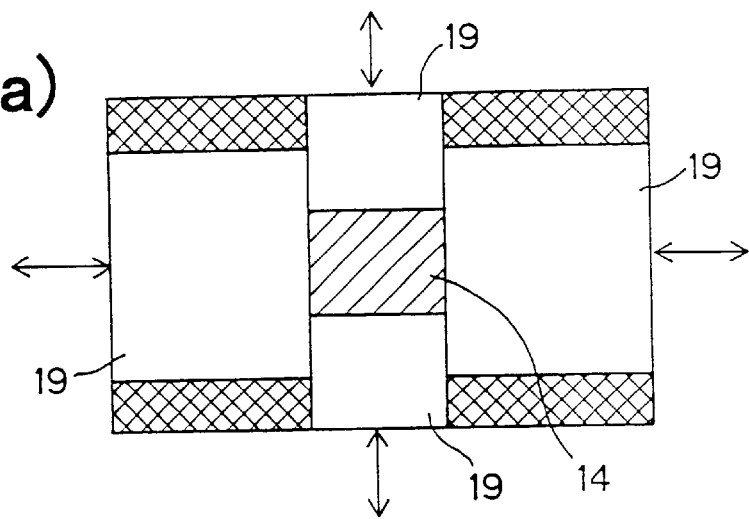
FIGS. 31(a) and 31(b) are views given in explanation of an upsetting device according to an embodiment of the present invention.
Figure 31B:
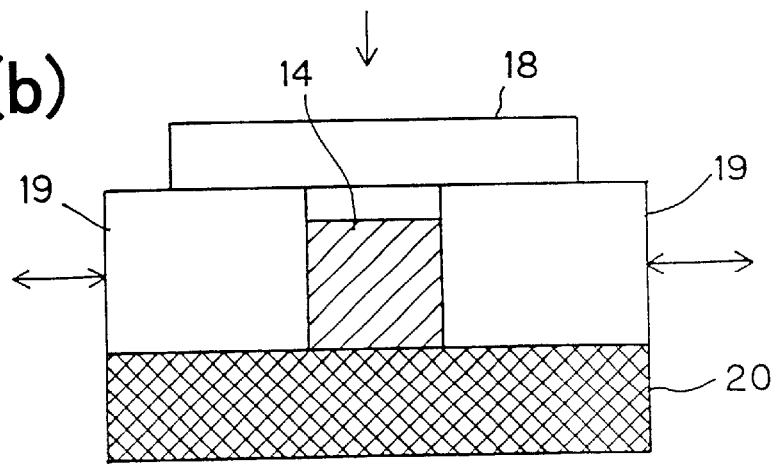

FIG. 30 and FIG. 31 show the construction of an upsetting device in which extension is restrained in both directions in this way. FIG. 30 is a view showing a free extension condition in which sintered ingot 14 is unrestrained; FIG. 31 is a view showing a condition in which sintered ingot 14 is restrained from extension in both the vertical and left/right axial directions in the Figure. Views (a) of FIG. 30 and 31 are plan views of the upsetting device, while views (b) of FIG. 30 and FIG. 31 are side views of the upsetting device.

Specifically, as shown in these FIGS. 30 and 31, the upsetting device comprises a die 20 on which sintered ingot 14 is placed, a punch 18 whereby this sintered ingot 14 is compressed from above, and four side walls 19 that prevent free extension, respectively contacting each side face of sintered ingot 14, by being driven as shown by the arrows.

In the first half of the forging step, hot forging is performed in a free extension condition as shown in FIG. 30; in the latter half of the forging step, as shown in FIG. 31, the four side walls 19 are driven so that hot forging is continued in a condition in which free extension in the two axial directions of sintered ingot 14 is prevented by these four side walls 19 (the descended condition of punch 18 is maintained).

Even when free extension in two axial directions is prevented in this way in the latter half of the forging step, just as in the case of the embodiment described above in which free extension was prevented in one axial direction in the latter half of the forging step, a density ratio of the forged ingot of more than 97% can be brought about, enabling thermoelectric performance to be improved.

Although in the embodiments described above the latter half of the forging step was performed by mold forging, embodiments are also possible in which a mold forging step is performed after carrying out the upset forging step.

A case in which this is performed using the upsetting device shown in FIG. 30 and FIG. 31 is described below.

Specifically, hot upset forging is performed in a free extension condition as shown in FIG. 30 in the initial upset forging state. Punch 18 is then lifted, putting sintered ingot 14 into an uncompressed condition. In the subsequent mold forging step, as shown in FIG. 31, the four side walls 19 are driven and, in a condition with free extension in two axial directions of sintered ingot 14 prevented by means of these four side walls 19, punch 18 is again lowered. In this way, hot mold forging is performed by compressing sintered ingot 14 in the vertical direction.

It should be noted that the hot upset forging step and hot mold forging step can be repeated a plurality of times.

Even when a mold forging step is performed in this way immediately after the upset forging step, just as in the case of the embodiment in which free extension is prevented in the latter of the forging step as described above, a density ratio of the forged ingot of more than 97% can be brought about, enabling the thermoelectric performance to be improved.

Ninth Embodiment

Next, the range of plastic processing temperatures whereby thermoelectric performance can be improved referred to in (2) above and the range of plastic processing loads where thermoelectric performance can be improved referred to in (3) above will be described with reference to specific examples.

Table 19 below shows the ingot deformation rate when hot forging is performed under the conditions 1–7 in which temperature and initial load pressure are varied. Hot forging was performed under the conditions shown in Table 19 below, using an upsetting device shown in FIG. 9 in which free extension was allowed in one axial direction only. The hot pressing step was the same as in the second embodiment; for the hot forging step, sintered ingots were cut just as in the case of the second embodiment, of height (thickness) 30 mm, width 40 mm, and length in the direction of extension 18 mm.

TABLE 19

| Condition | Temperature (° C.) | Initial Loading Pressure (Kg/cm$^2$) | Rate of Ingot Deformation (mm/sec) |
|---|---|---|---|
| 1 | 450 | 250 | $2.08 \times 10^{-4}$ |
| 2 | 450 | 125 | $1.42 \times 10^{-4}$ |
| 3 | 450 | 350 | $4.99 \times 10^{-3}$ |
| 4 | 400 | 250 | $1.87 \times 10^{-4}$ |
| 5 | 500 | 125 | $1.31 \times 10^{-3}$ |
| 6 | 500 | 250 | $1.44 \times 10^{-2}$ |
| 7 | 500 | 350 | $4.44 \times 10^{-2}$ |

In the above, condition 1 represents the data when the hot forging step is performed under the same conditions as in the case of the second embodiment described above. The load pressure change and ingot height change during the forging step are as shown in FIG. 10.

Also, Table 20 below shows the values of the physical properties of the sintered ingots constituting the starting materials for forging of each of the conditions 1–7.

TABLE 20

| Condition | Resistivity (mΩ · cm) | Seebeck Coefficient (μV/deg) | Anisotropy Ratio of Resistivity | Power Factor $\times 10^{-5}$ (W/cmK$^2$) |
|---|---|---|---|---|
| 1 | 1.200 | −200 | 1.70 | 3.33 |
| 2 | 1.200 | −200 | 1.70 | 3.22 |
| 3 | 1.238 | −204 | 1.74 | 3.36 |
| 4 | 1.250 | −198 | 1.72 | 3.22 |
| 5 | 1.250 | −198 | 1.72 | 3.22 |
| 6 | 1.303 | −203 | 1.73 | 3.17 |
| 7 | 1.238 | −204 | 1.74 | 3.36 |

Figure 21:
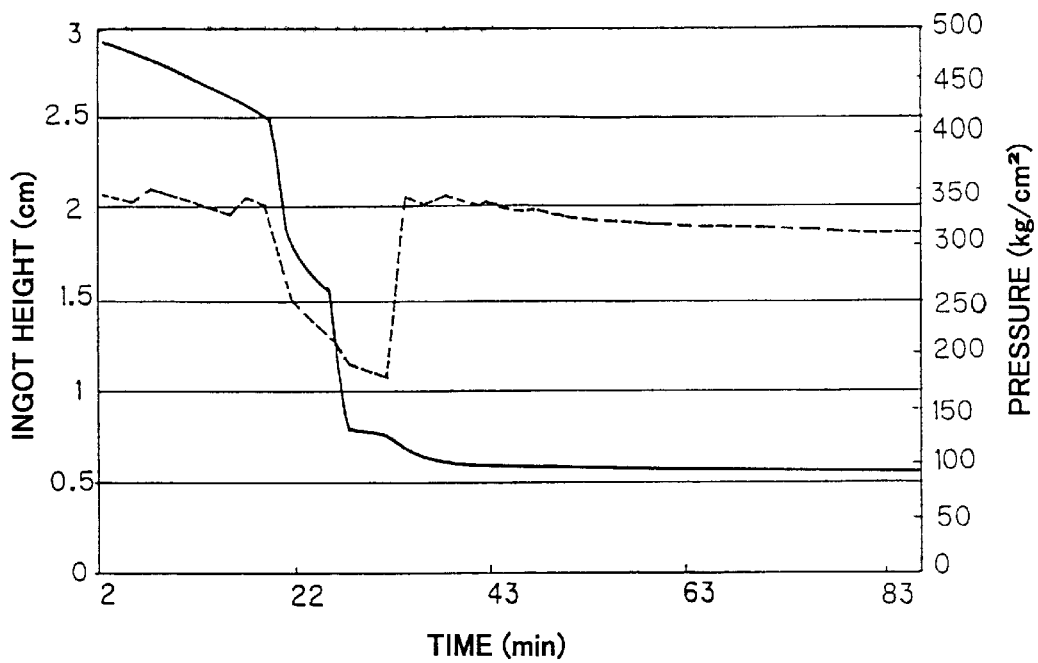
FIG. 21 is a view showing the variation with time of pressure and ingot height in a method according to an embodiment of the present invention.
Figure 22:
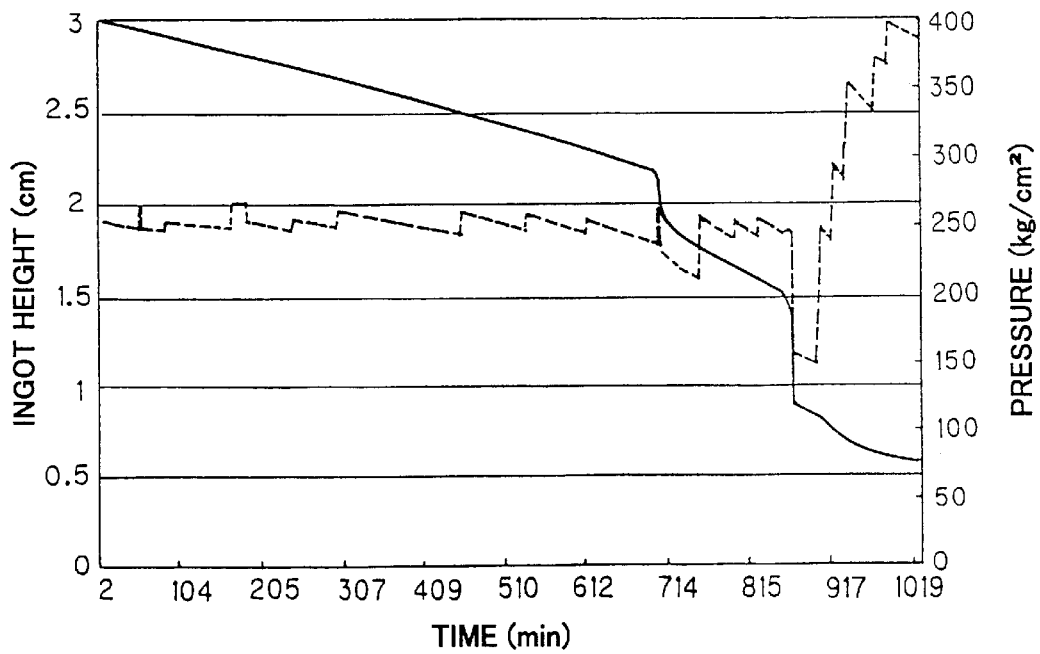
FIG. 22 is a view showing the changes with time of pressure and ingot height in a method according to an embodiment of the present invention.
Figure 23:
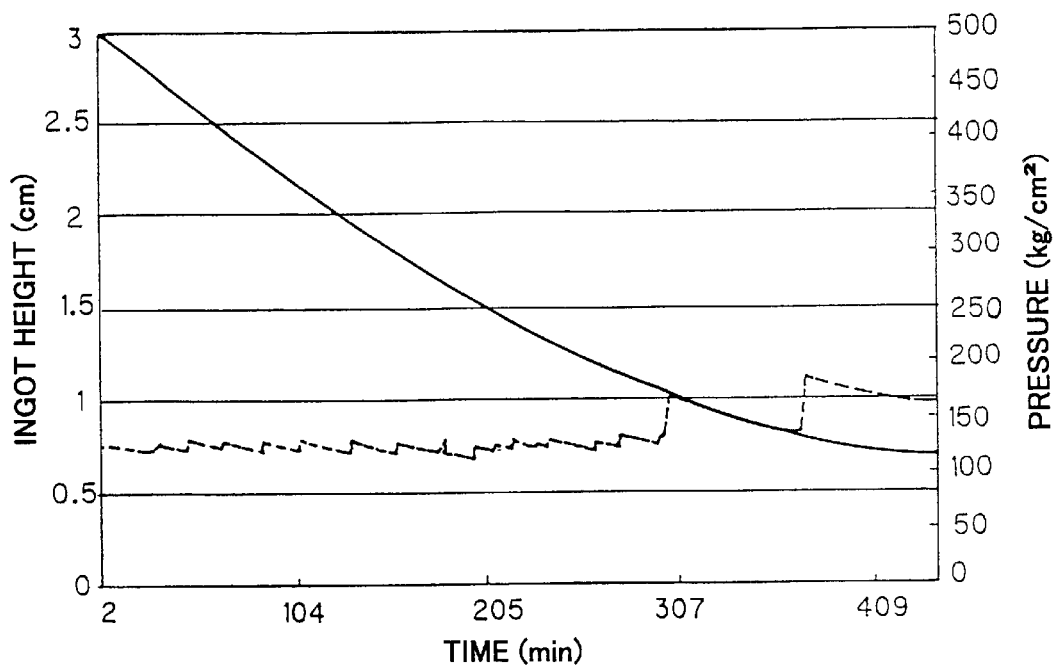
FIG. 23 is a view showing the changes with time of pressure and ingot height in a method according to an embodiment of the present invention.
Figure 24:
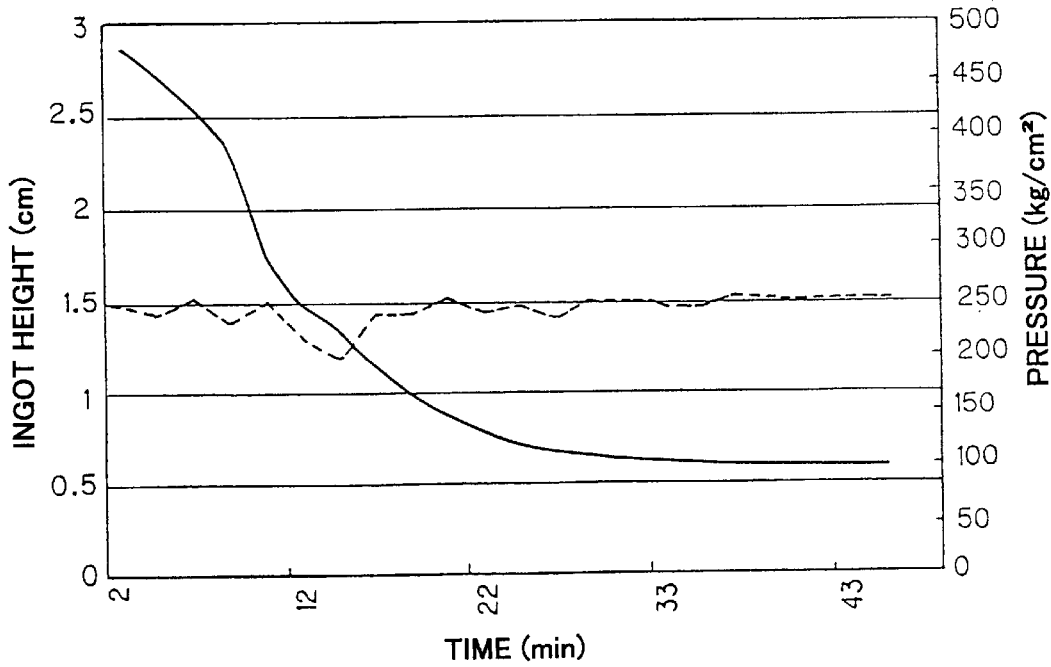
FIG. 24 is a view showing the changes with time of pressure and ingot height in a method according to an embodiment of the present invention.
Figure 25:
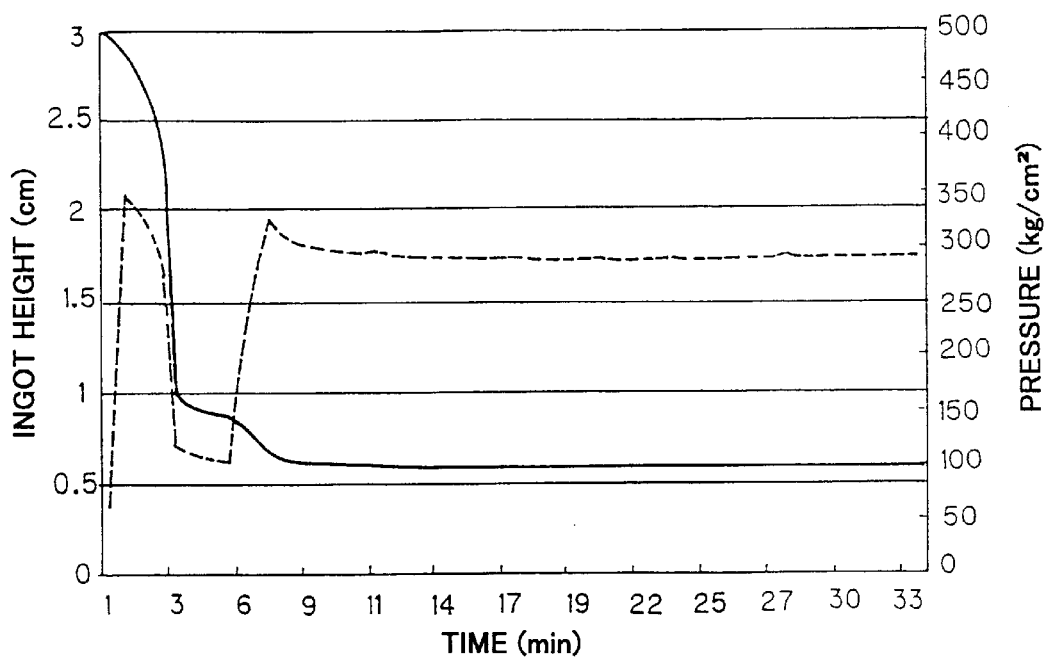
FIG. 25 is a view showing the changes with time of pressure and ingot height in a method according to an embodiment of the present invention.

FIG. 21 shows the load pressure change (broken line) and the ingot height change (solid line) during the forging step under condition 3. FIG. 22 shows the change in load pressure (broken line) and the change in ingot height (solid line) during the forging step under fourth condition. FIG. 23 shows the change in load pressure (broken line) and the change in ingot height (solid line) during the forging step under the fifth condition. FIG. 24 show the change in load pressure (broken line) and the change in the ingot height (solid line) during the forging step under the sixth condition. And FIG. 25 shows the change in load presssure (broken line) and the change in ingot height (solid line) during the forging step under the seventh condition.

As is clear from Table 19 above, if the temperature is increased the ingot deformation rate becomes faster, and, if the initial loading pressure is the same, the ingot deformation practically the same. However, it can be seen from FIG. 21–FIG. 25 that buckling occurs depending on the shape of the sintered ingot constituting the starting material for forging.

In particular, under conditions for which the deformation rate of the ingot is large, considerable buckling was observed. For example, in the case of condition 3 and condition 7, for which the ingot deformation rate is large, as can be seen from FIG. 21 and FIG. 25, considerable buckling is produced.

Buckling is produced because, due to frictional force of the vertical faces of the ingot, the vicinity of the vertical faces constitutes a rigid body region, whereas the vicinity of the unrestrained faces constitutes a deformation region; discontinuity of rate of deformation is therefore produced at the boundary of these regions, causing the ingot to become barrel-shaped shaped until finally the ingot shears at this boundary. The cracks produced by shearing are recovered by the subsequent pressing or by the molding pressing (mold forging) after the free forging described in the eighth embodiment, but it is necessary to prevent shearing in order to avoid occurrence of buckling.

Buckling can be prevented by employing as the sintered ingot constituting the starting material for forging an ingot of small ingot height in relation to the pressing area. However, if it is desired to obtain a large forging ratio, using a sintered ingot of such a shape acts diadvantageously.

Table 21–Table 27 below show the physical properties of forged ingots after forging under condition 1~condition 7 above.

TABLE 21

| Distance from the Center Part (mm) | Resistivity (mΩ · cm) | Seebeck Coefficient (μV/deg) | Density Ratio (%) | Anisotropy Ratio of Resistivity | Power Factor × $10^{-5}$ (W/cmK$^2$) |
|---|---|---|---|---|---|
| 2 | 0.974 | −200 | 98.8 | 2.25 | 4.12 |
| 6 | 0.984 | −201 | 99.2 | 2.28 | 4.09 |
| 10 | 0.990 | −201 | 98.8 | 2.28 | 4.08 |
| 14 | 0.993 | −200 | 99.2 | 2.28 | 4.05 |
| 18 | 1.003 | −198 | 98.8 | 2.19 | 3.96 |
| 22 | 0.994 | −198 | 98.8 | 2.15 | 3.95 |
| 26 | 1.008 | −198 | 98.9 | 2.11 | 3.89 |
| 30 | 1.038 | −197 | 98.7 | 2.00 | 3.73 |
| 34 | 1.068 | −195 | 98.4 | 1.81 | 3.57 |
| 38 | 1.086 | −194 | 98.7 | 1.66 | 3.47 |

TABLE 22

| Distance from the Center Part (mm) | Resistivity (mΩ · cm) | Seebeck Coefficient (μV/deg) | Density Ratio (%) | Anisotropy Ratio of Resistivity | Power Factor × $10^{-5}$ (W/cmK$^2$) |
|---|---|---|---|---|---|
| 2 | 1.046 | −193 | 98.8 | 2.38 | 3.63 |
| 6 | 1.044 | −199 | 99.2 | 2.46 | 3.78 |
| 10 | 1.058 | −198 | 98.8 | 2.41 | 3.71 |
| 14 | 1.073 | −198 | 99.2 | 2.34 | 3.64 |
| 18 | 1.068 | −197 | 98.8 | 2.32 | 3.62 |
| 22 | 1.079 | −194 | 98.8 | 2.21 | 3.49 |
| 26 | 1.120 | −192 | 98.9 | 2.10 | 3.29 |

TABLE 23

| Distance from the Center Part (mm) | Resistivity (mΩ · cm) | Seebeck Coefficient (μV/deg) | Density Ratio (%) | Anisotropy Ratio of Resistivity | Power Factor × $10^{-5}$ (W/cmK$^2$) |
|---|---|---|---|---|---|
| 2 | 1.223 | −202.6 | 99.6 | 2.04 | 3.39 |
| 6 | 1.085 | −202.6 | 99.3 | 2.31 | 3.79 |
| 10 | 1.235 | −201.2 | 99.5 | 1.73 | 3.28 |
| 14 | 1.189 | −200.8 | 99.3 | 1.89 | 3.39 |
| 18 | 1.224 | −201.7 | 99.4 | 1.93 | 3.32 |
| 22 | 1.326 | −200.0 | 98.9 | 1.67 | 3.02 |
| 26 | 1.291 | −198.6 | 99.2 | 1.48 | 3.09 |
| 30 | 1.468 | −198.3 | 98.3 | 1.32 | 2.69 |

TABLE 24

| Distance from the Center Part (mm) | Resistivity (mΩ · cm) | Seebeck Coefficient (μV/deg) | Density Ratio (%) | Anisotropy Ratio of Resistivity | Power Factor × $10^{-5}$ (W/cmK$^2$) |
|---|---|---|---|---|---|
| 2 | 1.124 | −197.6 | 99.5 | 1.98 | 3.46 |
| 6 | 1.081 | −197.0 | 99.5 | 2.01 | 3.59 |
| 10 | 1.111 | −195.5 | 99.4 | 2.00 | 3.45 |
| 14 | 1.095 | −195.6 | 99.5 | 2.01 | 3.49 |
| 18 | 1.419 | −191.5 | 97.4 | 1.39 | 2.59 |
| 22 | 1.425 | −190.7 | 97.6 | 1.08 | 2.55 |
| 26 | 1.593 | −190.6 | 94.9 | 1.09 | 2.29 |
| 30 | 2.027 | −189.0 | 98.1 | 0.66 | 1.76 |

TABLE 25

| Distance from the Center Part (mm) | Resistivity (mΩ · cm) | Seebeck Coefficient (μV/deg) | Density Ratio (%) | Anisotropy Ratio of Resistivity | Power Factor × $10^{-5}$ (W/cmK$^2$) |
|---|---|---|---|---|---|
| 2 | 1.063 | −205 | 99.0 | 2.31 | 3.94 |
| 6 | 1.079 | −204 | 98.3 | 2.31 | 3.86 |
| 10 | 1.085 | −204 | 98.3 | 2.30 | 3.83 |
| 14 | 1.086 | −202 | 98.2 | 2.28 | 3.77 |
| 18 | 1.078 | −201 | 97.4 | 2.28 | 3.76 |
| 22 | 1.080 | −200 | 96.4 | 2.22 | 3.69 |
| 26 | 1.092 | −197 | 95.7 | 2.17 | 3.56 |
| 30 | 1.135 | −196 | 95.0 | 2.08 | 3.39 |

TABLE 26

| Distance from the Center Part (mm) | Resistivity (mΩ · cm) | Seebeck Coefficient (μV/deg) | Density Ratio (%) | Anisotropy Ratio of Resistivity | Power Factor × $10^{-5}$ (W/cmK$^2$) |
|---|---|---|---|---|---|
| 2 | 1.051 | −204 | 99.5 | 2.45 | 3.95 |
| 6 | 1.077 | −203 | 98.9 | 2.42 | 3.83 |

TABLE 26-continued

| Distance from the Center Part (mm) | Resistivity (mΩ·cm) | Seebeck Coefficient (μV/deg) | Density Ratio (%) | Anisotropy Ratio of Resistivity | Power Factor × 10⁻⁵ (W/cmK²) |
|---|---|---|---|---|---|
| 10 | 1.086 | −203 | 99.2 | 2.29 | 3.83 |
| 14 | 1.115 | −202 | 99.2 | 2.26 | 3.67 |
| 18 | 1.101 | −203 | 99.5 | 2.20 | 3.75 |
| 22 | 1.118 | −203 | 99.1 | 2.16 | 3.68 |
| 26 | 1.132 | −202 | 98.6 | 2.10 | 3.59 |
| 30 | 1.173 | −199 | 98.0 | 1.93 | 3.38 |

TABLE 27

| Distance from the Center Part (mm) | Resistivity (mΩ·cm) | Seebeck Coefficient (μV/deg) | Density Ratio (%) | Anisotropy Ratio of Resistivity | Power Factor × 10⁻⁵ (W/cmK²) |
|---|---|---|---|---|---|
| 2 | 1.166 | −203 | 99.7 | 2.15 | 3.53 |
| 6 | 1.189 | −202 | 99.6 | 2.14 | 3.44 |
| 10 | 1.180 | −202 | 99.2 | 2.00 | 3.46 |
| 14 | 1.241 | −201 | 99.0 | 1.52 | 3.26 |
| 18 | 1.744 | −198 | 99.1 | 0.77 | 2.25 |
| 22 | 1.945 | −196 | 99.4 | 0.87 | 1.98 |
| 26 | 1.828 | −198 | 99.0 | 0.72 | 2.15 |
| 30 | 1.857 | −197 | 99.2 | 0.81 | 2.09 |

Specifically, after forging under conditions 1–7, the measurement pieces shown in FIG. 20 were respectively cut from the respective forged ingots 14 obtained by performing heat treatment for 24 hours at 400° C., and the physical properties, namely, resistivity, density ratio, anisotropy ratio of resistivity, Seebeck coefficient, and power factor of these measurement pieces were determined. The results are shown in Table 21–27 above.

Although scarcely any statistical scatter was seen in the physical properties of the measurement pieces (forged ingots 14) in the height direction or width direction, statistical scatter was seen in the distribution of these physical properties in the direction of extension D. In Tables 21–27, the physical properties are shown at various distances in the direction of extension D, averaging in the width direction.

As can be seen by comparing the values of the anisotropy ratio of resistance of the sintered ingots constituting the starting materials of the forging of Table 20 and the values of the anisotropy ratio of resistance of the forged ingots after forging shown in Table 21–27, the anisotropy ratio of resistance in the central portion of the forged ingots is larger than it was before forging for all of the conditions 1–7. It can therefore be seen that alignment of crystal grains is improved by forging. For example, in the case of condition 2, the anisotropy ratio of resistance is increased from 1.70 to 2.38 at a location 2 mm from the center of the ingot.

Also, under each of conditions 1–7, the power factor is increased by forging, and it may be inferred by analogy that thermoelectric performance is improved due to the improvement in alignment of the crystal grains. For example, in the case of condition 2, the power factor is increased from 3.22 to 3.63 at a location 2 mm from the center of the ingot.

In this respect, it is clear from the comparison results of Table 20 and Table 23 and from the comparison results of Table 20 and 27 that, in the case of condition 3 and condition 7, improvement in alignment is only found in part of the central region of the forged ingot. For example, the power factor under condition 3 only becomes bigger after forging than the value (3.53) before forging at a location 6 mm from the center of the forged ingot (becoming 3.79 at this location).

It is believed that the reason for this is that, as described above, considerable buckling occurs (see FIG. 21 and FIG. 25) in the hot forging step as described above, causing fracture and separation of the ingot; on this separation, the separated portions are rotated, so the alignment of the crystals in these portions is altered.

However, even under forging conditions in which such buckling is likely to occur, by using a sintered ingot of a shape in which buckling is unlikely, as described above, buckling can be avoided and an improvement in alignment is possible. This is because the alignment of the center of the ingot which is not susceptible to the effect of buckling is originally good.

Regarding forging temperature, higher forging temperatures make it easier for plastic deformation to proceed, but the temperature must be below the temperature of grain growth, at which growth of the crystal grains causes alignment to be lost. Specifically, from the results of this ninth embodiment and the first–eight embodiments, it is desirable that it should be below 550° C.

Contrariwise, when the forging temperature is low, plastic deformation is slowed down or practically eliminated, but forging is possible at any temperature at which hot press sintering is possible. Specifically, from the results of this ninth embodiment and the first–eight embodiments, it is desirable that this should be above 350° C.

Regarding the low pressure during forging, it is necessary that the initial load pressure should provide a force greater than the yield stress of the sintered ingot. Furthermore, the load pressure must be a load pressure that can make the ingot deformation rate below the ingot deformation rate that produces cracking. Specifically, from the results of this ninth embodiment and of the first–eighth embodiments, it is desirable that it should be in the range of 70 kg/cm² to 350 kg/cm².

Also, as shown in FIG. 21–FIG. 25, in this embodiment, buckling can be kept to a minimum by changing the load pressure in accordance with the change in ingot shape (height) during forging. From the results of this ninth embodiment and the first–eighth embodiments, it can be seen that, in order to avoid buckling etc., the sintered ingot should not be pressed with an initial loading pressure exceeding 500 kg/cm² during forging.

Next, an embodiment in which the forging conditions were altered in like manner for a p-type material will be described.

Specifically, a p-type thermoelectric semiconductor material of the same composition $Bi_{0.4}Sb_{1.6}Te_3$ as in the case of the third embodiment was sintered by the same method of manufacture as in the third embodiment. Hot forging was then conducted under the conditions 8–12 shown in Table 28 below, using an upsetting device in which free extension was allowed in one axial direction only shown in FIG. 9, after cutting the sintered ingot to a height (thickness) of 30 mm, width 40 mm, and length in the direction of extension of 18 mm, in the same way as in the third embodiment.

Table 28 below shows the ingot deformation rate when hot forging was conducted under conditions 8–12 with the temperature and initial load pressure varied.

TABLE 28

| Condition | Temperature (° C.) | Initial Loading Pressure (Kg/cm²) | Rate of Ingot Deformation (mm/sec) |
|---|---|---|---|
| 8 | 500 | 150 | 1.14 × 10⁻³ |
| 9 | 500 | 70 | 3.04 × 10⁻⁴ |

TABLE 28-continued

| Condition | Temperature (° C.) | Initial Loading Pressure (Kg/cm²) | Rate of Ingot Deformation (mm/sec) |
|---|---|---|---|
| 10 | 500 | 150 | 5.03 × 10⁻³ |
| 11 | 450 | 100 | 2.26 × 10⁻⁴ |
| 12 | 520 | 100 | 6.47 × 10⁻³ |

Condition 8 represents the data obtained by conducting the hot forging step under the same conditions as in the case of the third embodiment described above.

Table 29 below shows the physical properties of the sintered ingots constituting the starting materials for forging for each of conditions 8–12.

TABLE 29

| Condition | Resistivity (mΩ · cm) | Seebeck Coefficient (μV/deg) | Anisotropy Ratio of Resistivity | Power Factor × 10⁻⁵ (W/cmK²) |
|---|---|---|---|---|
| 8 | 0.939 | 196 | 1.20 | 4.09 |
| 9 | 0.939 | 196 | 1.20 | 4.09 |
| 10 | 0.816 | 185 | 1.20 | 4.17 |
| 11 | 0.816 | 185 | 1.20 | 4.17 |
| 12 | 0.827 | 185 | 1.21 | 4.17 |

Figure 26:
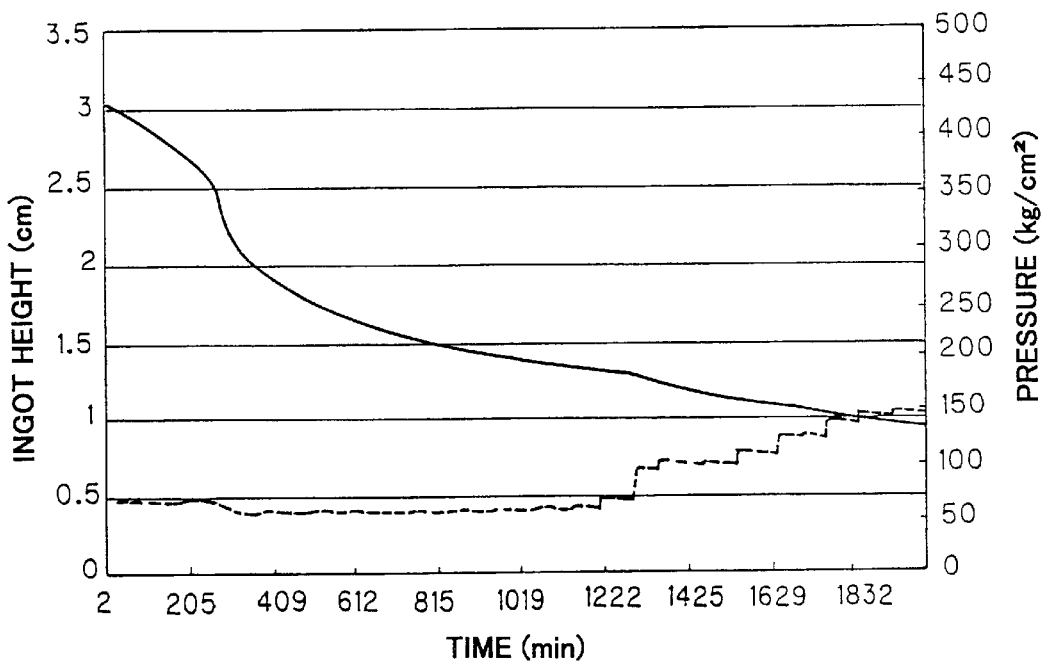
FIG. 26 is a view showing the changes with time of pressure and ingot height in a method according to an embodiment of the present invention.
Figure 27:
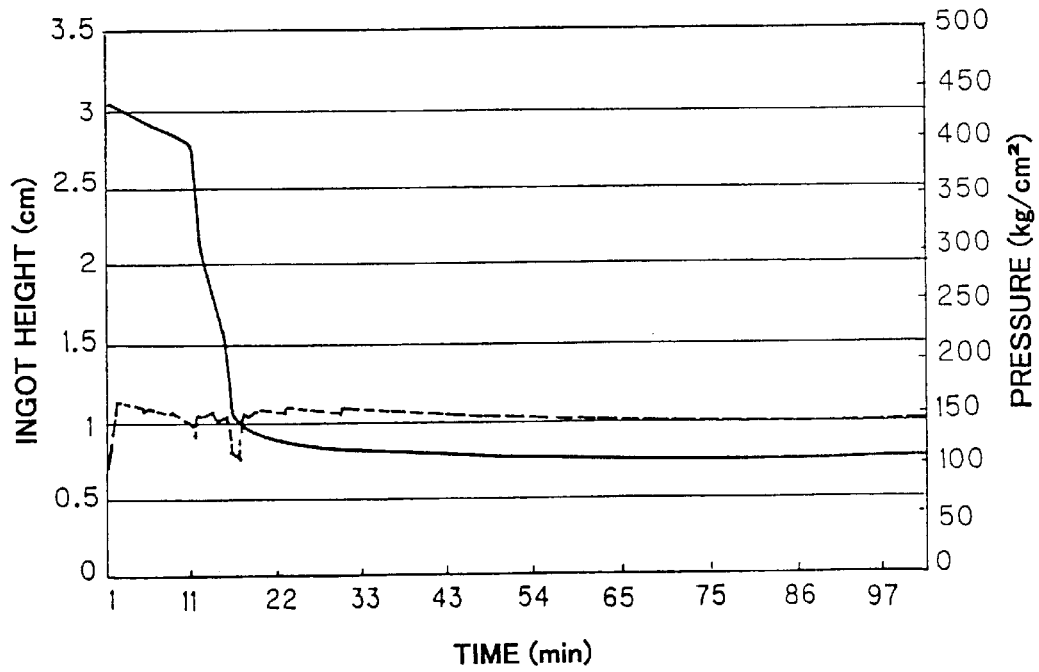
FIG. 27 is a view showing the changes with time of pressure and ingot height in a method according to an embodiment of the present invention.
Figure 28:
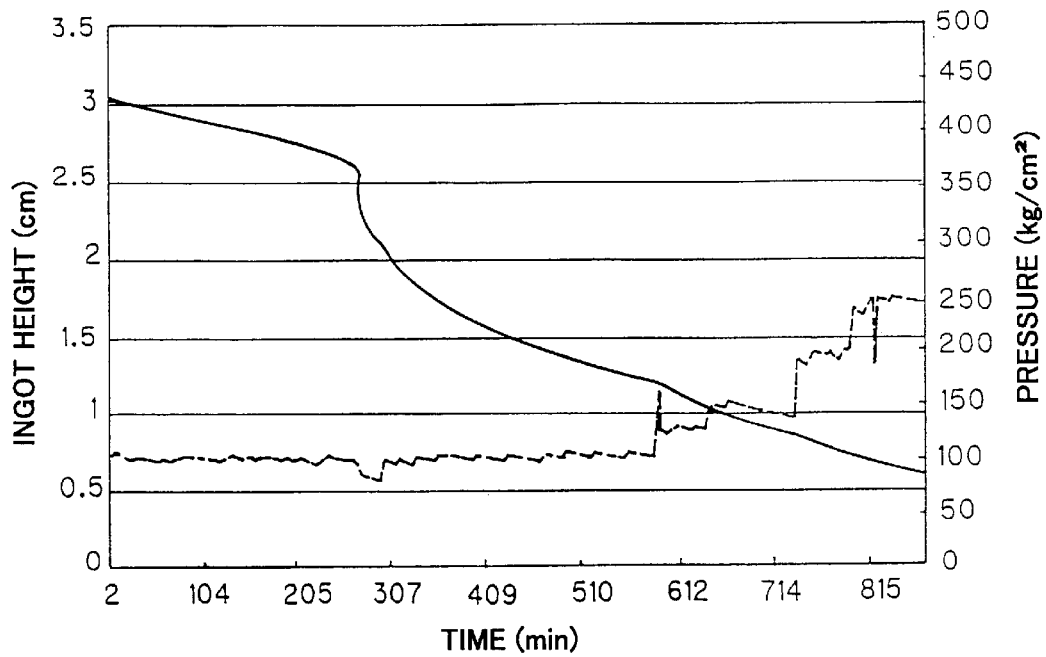
FIG. 28 is a view showing the changes with time of pressure and ingot height in a method according to an embodiment of the present invention.
Figure 29:
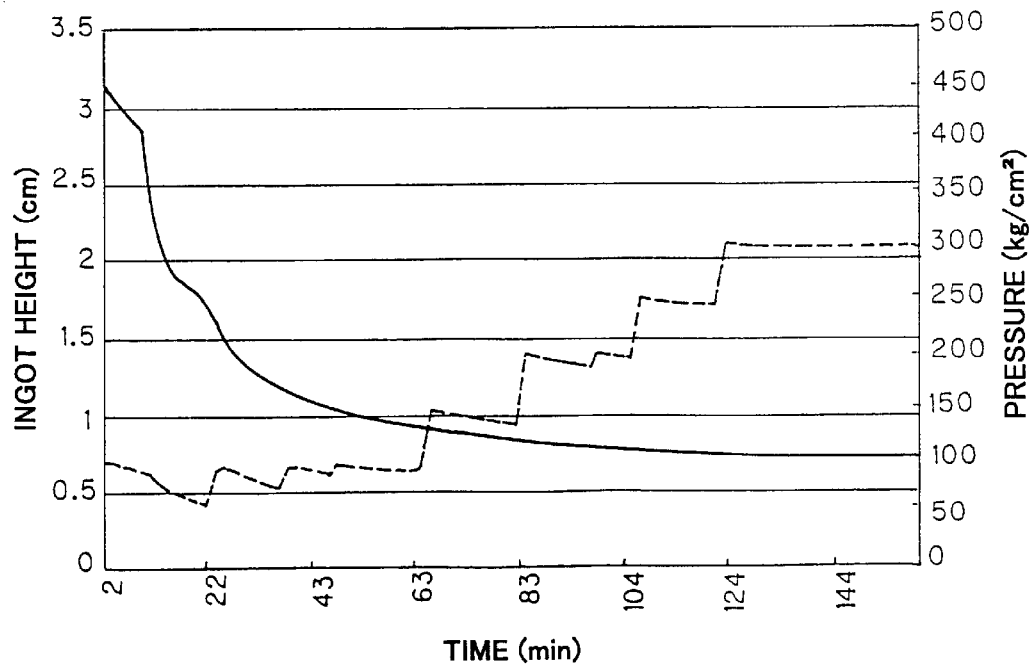
FIG. 29 is a view showing the changes with time of pressure and ingot height in a method according to an embodiment of the present invention.

FIG. 26 shows the load pressure change (broken line) during the forging step and the ingot height change (solid line) under condition 9. FIG. 27 shows the load pressure change (broken line) and ingot height change (solid line) during the forging step under condition 10. FIG. 28 shows the load pressure change (broken line) and ingot height change (solid line) during the forging step under condition 11. FIG. 29 shows the load pressure change (broken line) and ingot height change (solid line) during the forging step under condition 12.

Large buckling is seen in particular in conditions of large rate of deformation of the ingot. For example, it is found that large buckling occurs, as can be seen from FIG. 27, in the case of condition 10, in which the ingot deformation rate is large.

Tables 30–34 below show the physical properties of forged ingots forged under condition 8–condition 12 above.

TABLE 30

| Distance from the Central Part (mm) | Resistivity (mΩ · cm) | Seebeck Coefficient (μV/deg) | Density Ratio (%) | Anisotropy Ratio of Resistivity | Power Factor × 10⁻⁵ (W/cmK²) |
|---|---|---|---|---|---|
| 2 | 0.901 | 200 | 98.6 | 1.42 | 4.44 |
| 6 | 0.915 | 200 | 98.5 | 1.40 | 4.37 |
| 10 | 0.921 | 198 | 97.8 | 1.39 | 4.25 |
| 14 | 0.966 | 200 | 96.7 | 1.38 | 4.12 |
| 18 | 0.934 | 199 | 97.6 | 1.39 | 4.25 |
| 22 | 1.221 | 206 | 92.1 | 1.26 | 3.47 |
| 26 | 1.457 | 209 | 86.6 | 1.22 | 3.01 |

TABLE 31

| Distance from the Central Part (mm) | Resistivity (mΩ · cm) | Seebeck Coefficient (μV/deg) | Density Ratio (%) | Anisotropy Ratio of Resistivity | Power Factor × 10⁻⁵ (W/cmK²) |
|---|---|---|---|---|---|
| 2 | 0.804 | 191 | 99.9 | 1.52 | 4.51 |
| 6 | 0.823 | 191 | 100.2 | 1.43 | 4.46 |
| 10 | 0.863 | 191 | 98.7 | 1.28 | 4.21 |
| 14 | 0.871 | 192 | 100.7 | 1.35 | 4.25 |
| 18 | 0.911 | 195 | 98.0 | 1.33 | 4.16 |
| 22 | 0.963 | 195 | 96.1 | 1.26 | 3.95 |
| 26 | 1.072 | 196 | 95.2 | 1.16 | 3.60 |

TABLE 32

| Distance from the Central Part (mm) | Resistivity (mΩ · cm) | Seebeck Coefficient (μV/deg) | Density Ratio (%) | Anisotropy Ratio of Resistivity | Power Factor × 10⁻⁵ (W/cmK²) |
|---|---|---|---|---|---|
| 2 | 0.846 | 197 | 99.9 | 1.57 | 4.60 |
| 6 | 0.850 | 197 | 98.4 | 1.57 | 4.56 |
| 10 | 0.879 | 196 | 98.6 | 1.49 | 4.39 |
| 14 | 0.927 | 197 | 99.1 | 1.38 | 4.18 |
| 18 | 0.914 | 197 | 98.7 | 1.41 | 4.23 |
| 22 | 0.950 | 196 | 97.8 | 1.52 | 4.03 |
| 26 | 1.191 | 197 | 93.0 | 1.14 | 3.25 |

TABLE 33

| Distance from the Central Part (mm) | Resistivity (mΩ · cm) | Seebeck Coefficient (μV/deg) | Density Ratio (%) | Anisotropy Ratio of Resistivity | Power Factor × 10⁻⁵ (W/cmK²) |
|---|---|---|---|---|---|
| 2 | 0.846 | 197 | 99.9 | 1.57 | 4.60 |
| 6 | 0.850 | 197 | 98.4 | 1.57 | 4.56 |
| 10 | 0.879 | 196 | 98.6 | 1.49 | 4.39 |
| 14 | 0.927 | 197 | 99.1 | 1.38 | 4.18 |
| 18 | 0.914 | 197 | 98.7 | 1.41 | 4.23 |
| 22 | 0.950 | 196 | 97.8 | 1.52 | 4.03 |
| 26 | 1.191 | 197 | 93.0 | 1.14 | 3.25 |

TABLE 34

| Distance from the Central Part (mm) | Resistivity (mΩ · cm) | Seebeck Coefficient (μV/deg) | Density Ratio (%) | Anisotropy Ratio of Resistivity | Power Factor × 10⁻⁵ (W/cmK²) |
|---|---|---|---|---|---|
| 2 | 0.691 | 179 | 99.2 | 1.80 | 4.64 |
| 6 | 0.687 | 179 | 99.3 | 1.77 | 4.67 |
| 10 | 0.697 | 179 | 99.0 | 1.76 | 4.62 |
| 14 | 0.721 | 180 | 99.7 | 1.69 | 4.47 |
| 18 | 0.738 | 180 | 99.3 | 1.64 | 4.39 |
| 22 | 0.764 | 181 | 99.2 | 1.56 | 4.31 |
| 26 | 0.778 | 181 | 99.6 | 1.52 | 4.21 |

Specifically, after forging under conditions 8–12, respective measurement pieces shown in FIG. 20 were cut from the forged ingots 14 obtained, and the physical properties: resistivity, density ratio, anisotropy ratio of resistivity, Seebeck coefficient and power factor were measured for each of these measurement pieces. The results are shown in Tables 30–34 above.

Although scarcely any statistical scatter of the physical properties was seen in the height direction and width direction of the measurement pieces (forged ingots 14), statistical scatter was seen in the distribution of the physical properties in the direction of extension D.

The values of the physical properties are shown in Tables 30–34 at various distances in the direction of extension D, taking an average in the width direction.

As can be seen by comparing the value of the anisotropy ratio of resistance of the sintered ingot constituting the starting material of Table 29 and the anisotropy ratio of resistance of the forged ingots after forging shown in Tables 30–34, for all the conditions 8–12, the anisotropy ratio of resistance at the center of the forged ingot is larger than prior to forging; thus it can be seen that crystallite alignment is improved by forging.

It was also found that for p-type material, in comparison with n-type material, the range in which an improvement in alignment was seen extended further towards the ends of the forged ingot, not so much effect of buckling as in the case of the n-type material was seen, and alignment was improved.

It should be noted that, although in the fourth~ninth embodiments described above, $Bi_2Te_3$ based thermoelectric semiconductor material was chiefly taken as example, similar results are obtained when BiSb based thermoelectric semiconductor material is employed.

Tenth Embodiment

Next, the degree of alignment of the C planes of the crystal grains of the forged product obtained by the second embodiment was studied.

In this case, sintered ingot 20 was taken as the ingot prior to forging obtained in the second embodiment and forged ingot 30 was taken as the forged ingot.

The degree of alignment of the C planes of the subcrystal grains constituting the structures of sintered ingot 20 and forged ingot 30 was measured using X-ray analysis.

Figure 32:
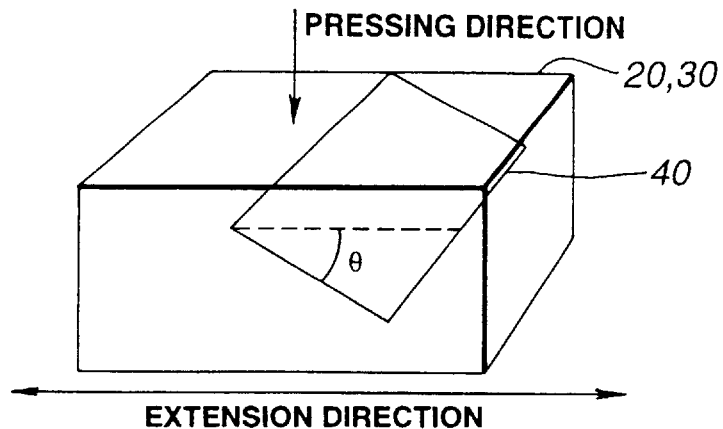
FIG. 32 is a view given in explanation of measurement of alignment distribution using X-ray analysis.

Specifically, as shown in FIG. 32, in the case of sintered ingot 20, a plate-shaped sample 40 was cut having a largest face at an angle of 0° to 90 with respect to the pressed face, and in the case of forged ingot 30 a plate-shaped sample 40 was cut having a largest face at an angle of 0° to 90° with respect to the direction of extension in the central portion of ingot 30. The size of these largest faces was the same for all samples.

The largest face of this plate-shaped sample 40 was subjected to X-ray diffraction using an X-ray diffractometer.

The intensity of reflection of crystalline C planes (planes perpendicular to the C axis) of a plate-shaped sample 40 cut at an angle θ is proportional to the volume of subcrystal grains inclined at θ.

That is, the angle θ and intensity of reflection were interpolated by the method of maximum squares of third order or more, by calculating the integrated intensity of the X-ray diffraction peak striking the (006) plane (C plane) of each plate-shaped sample 40, and then plotting this intensity value for the angle θ made by the maximum face of each plate-shaped sample 40 and the direction of extension. An orientation distribution function was generated by normalizing the values of this approximation function integrated from 0° to 90° to 100%. This orientation distribution function is shown in FIG. 33.

Figure 33:
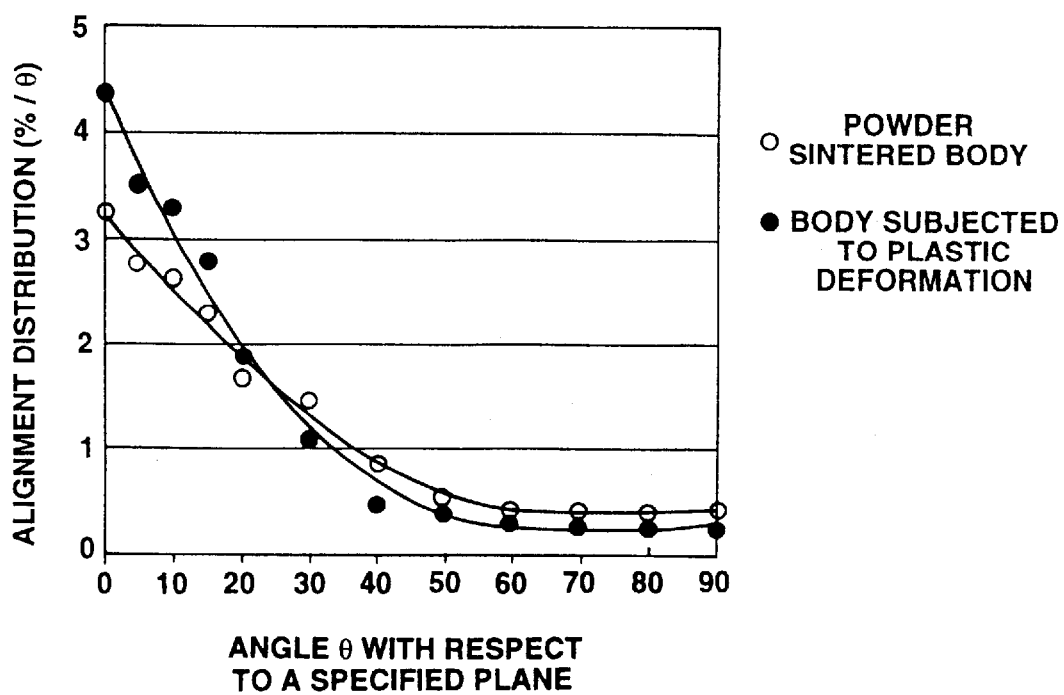
FIG. 33 is a graph showing an alignment distribution function.

In FIG. 33, the white circles indicate powder sintered ingot 20, while the black circles indicate forged ingot 30obtained by plastic deformation.

The volumetric proportion of subcrystal grains oriented at angle θ with respect to a specified plane can be found from the curve shown in FIG. 33.

Table 36 below shows the degree of alignment of the crystal grains of the two ingots 20, 30 found from the orientation distribution function shown in this FIG. 33.

TABLE 36

|  | Within ± 30° (%) | Within ± 15° (%) |
| --- | --- | --- |
| N-type Powdered Sintered Body | 66 | 40 |
| P-type Powdered Sintered Body | 55 | 31 |
| N-type Unidirectional Extended Material | 78 | 51 |
| P-type Unidirectional Extended Material (Inferred Values) | 77 | 45 |

In this Table 36, what is meant by, for example, "78% within ±30°", in terms of the relationship with FIG. 33, is the proportion with respect to the total area of the area when the curve indicated by black circles in FIG. 33 is integrated from θ=0° to θ=30°. Also, in terms of the relationship with degree of alignment of the C plane of subcrystal grains constituting the structure of the n-type semiconductor material, this means that C planes of subcrystal grains representing about 78% as a volumetric percentage of the subcrystal grains constituting the structure are aligned within a range of ±30° with respect to a specified plane (compression plane) or specified axis (direction of extension).

Thus, it can be seen from this Table that, whereas in the case of n-type sintered ingot 20, of the subcrystal grains constituting the structure, in volumetric percentage terms, the C planes of only under 70% (66%) of the subcrystal grains are oriented within a range of ±30° with respect to a specified plane (pressed face), in the case of the n-type forged ingot 30, of the subcrystal grains constituting the structure, the C planes of nearly 80% in volumetric percentage terms (78%) of the subcrystals constituting the structure are oriented within a range of ±30° with respect to the specified plane (compression face) or specified axis (direction of extension). It should be noted that it is desirable for n-type forged ingot 30 that, of the subcrystal grains constituting the structure, the C planes of 80% or more in volumetric percentage terms of the subcrystal grains should be oriented within a range of ±30° with respect to the specified plane (compression face) or specified axis (direction of extension).

Also, in the case of the n-type sintered ingot 20, whereas, of the subcrystal grains constituting the structure, in volumetric percentage terms, the C planes of only some 40% or less (40%) of the subcrystal grains were oriented within a range of ±15° with respect to a specified plane (pressing face), in the case of n-type forged ingot 30, of the subcrystal grains constituting the structure, the C planes of some 50% or more (51%) in volumetric percentage terms of the subcrystal grains were found to be oriented within a range of ±15° with respect to the specified plane (compression face) or specified axis (direction of extension).

From the above, it can be seen that alignment is greatly improved by plastic processing.

Eleventh Embodiment

Next, the degree of alignment of the C planes of crystal grains will be studied with reference to specific practical examples, for p-type thermoelectric semiconductor material obtained by the third embodiment.

The degree of alignment of the subcrystal grains of two ingots 20, 30 of p-type semiconductor measured in the same way as in the case of the n-type semiconductor material of the tenth embodiment described above is shown in Table 36 described above.

As is clear from this Table, in the case of p-type sintered ingot 20, of the subcrystal grains constituting the structure, in volumetric percentage terms, the C planes of only less than 60% (55%) of the subcrystal grains were oriented within ±30° with respect to the specified plane (pressed face), but, in contrast, in the case of p-type forged ingot 30, of the subcrystal grains constituting the structure, the C planes of nearly 80% (77%) of the subcrystal grains, in volumetric percentage terms, were oriented within ±30° with respect to the specified plane (compression face) or specified axis (direction of extension). It should be noted that it is desirable for the p-type forged ingot 30 that, of the subcrystal grains constituting the structure the C planes of, in volumetric terms, at least 80% of the subcrystal grains should be oriented within ±30° with respect to the specified plane (compression face) or specified axis (direction of extension).

Also, whereas, in the case of the p-type sintered ingot 20, it was found that, of the subcrystal grains constituting the structure, in volumetric percentage terms, the C planes of under 40% (31%) of the subcrystal grains were oriented within a range of ±150 with respect to the specified plane (pressed face), in the case of the p-type forged ingot 30, of the subcrystal grains constituting the structure, nearly 50% in volumetric percentage terms (45%) of the C planes of the subcrystal grains were oriented within a range of ±15° with respect to the specified plane (compression face) or specified axis (direction of extension).

It should be noted that it is desirable for p-type forged ingot 30 that, of the subcrystal grains constituting the structure, in volumetric percentage terms, the C planes of at least 50% of the subcrystal grains should be oriented within a range of ±15° with respect to the specified plane (compression face) or specified axis (direction of extension).

From the above, it can be seen that an improvement in alignment is achieved by the plastic processing.

Twelfth Embodiment

Next, the size of the subcrystal grains constituting the structure of the semiconductor material obtained in the second and third embodiments described above will be studied with reference to practical examples.

Figure 34A:
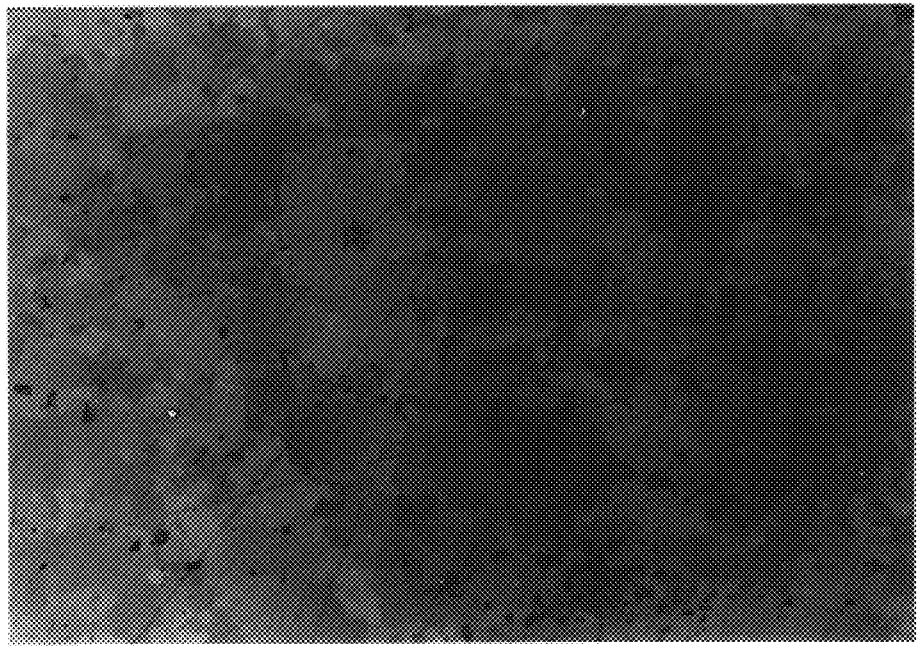
FIGS. 34(a) and 34(b) are micrographs showing the structure of a thermoelectric semiconductor material according to the present invention, being a photograph used for comparing structures before and after plastic processing.
Figure 34B:

FIG. 34(*a*) is a photograph of the structure observed using a polarizing microscope of a plane parallel to the direction of pressing (pressing direction) during sintering of a powder sintered body of n-type semiconductor material prior to plastic processing in the second embodiment.

The grains of various different sizes and shapes are the crystal grains referred to herein and the crystal grains are constituted by single crystals. That is, no subcrystal grains are present.

In contrast, FIG. 34(*b*) is a photograph of the structure likewise observed with a polarizing microscope of a plane parallel to the direction of pressing for extension and deformation (direction of compression) and direction of extension of n-type semiconductor material (powdered sintered material subjected to extension in one direction) after sintering processing in the second embodiment.

In this case, the grains of various sizes seen in FIG. 34(*a*) are made finer down to a fixed size; such grains constitute the subcrystal grains referred to in this specification. It is believed that the elongate crystal grains originating from the sintered powder seen in FIG. 2 are constituted by such fine subcrystat grains.

As can be seen by comparing these FIGS. 34(*a*) and (*b*), clearly, the size of the subcrystal grains shown in FIG. 34(*b*) is smaller than the sizes of the subcrystal grains shown in FIG. 34(*a*) and furthermore the grain size of the subcrystal grains shown in FIG. 34(*b*) is more uniform and more contained within a fixed size range than the grain size of the subcrystal grains shown in FIG. 34(*a*). Thus it can be seen that a fine uniform structure is generated by plastic deformation.

This generation of a fine uniform structure thanks to plastic deformation is the same as in the case of the p-type semiconductor material of the third embodiment.

It should be noted that FIG. 34 shows the case where pressing was effected in the vertical direction.

The structure of a fracture face of a p-type semiconductor material according to the third embodiment will next be studied.

Figure 35A:
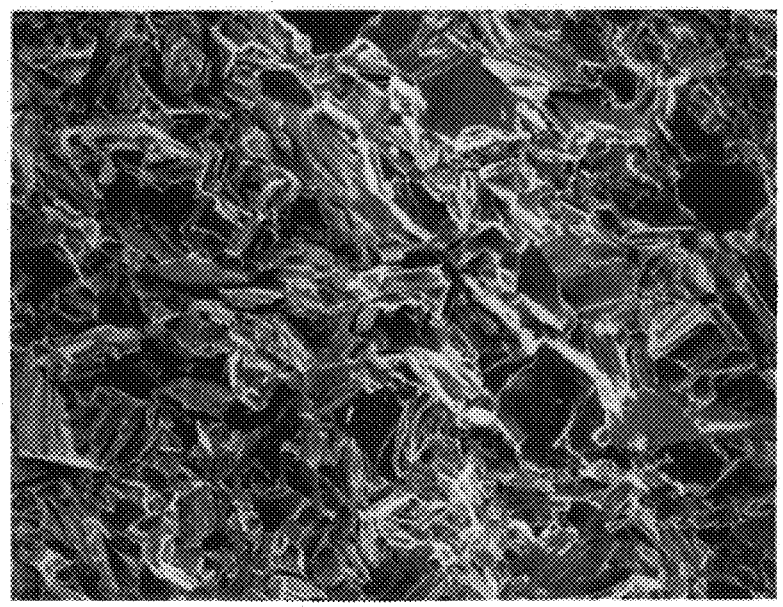
FIGS. 35(a) and 35(b) are micrographs showing the structure of a fractured face of a thermoelectric semiconductor material according to the present invention, being a photograph used for comparison of the structures before and after plastic processing.
Figure 35B:
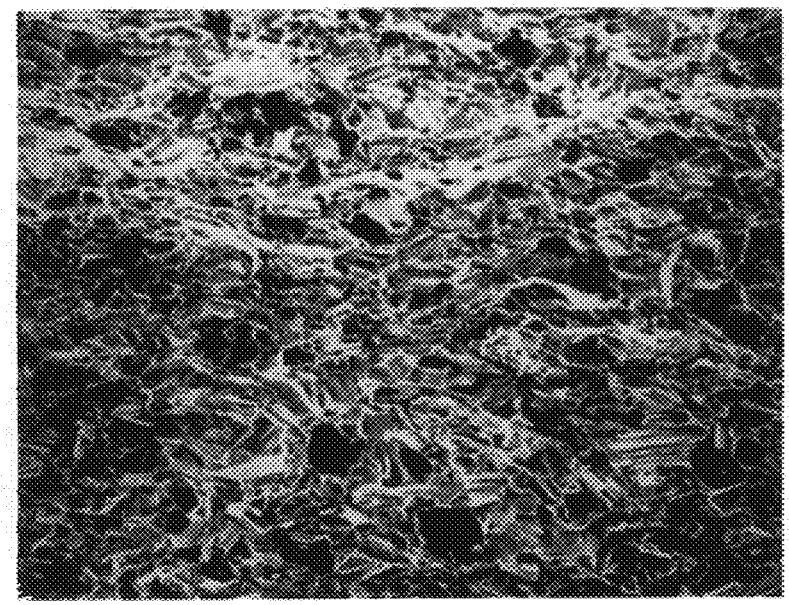

FIG. 35(*a*) is a photograph obtained using an electron microscope of a fracture face parallel to the direction of pressing (pressing direction) during sintering obtained by deliberately breaking a powder sintered body of p-type semiconductor material prior to plastic processing in the third embodiment.

In contrast, FIG. 35(*b*) is a photograph obtained using an electron microscope of a fracture face parallel to the direction of application of pressure for extension deformation (direction of compression) and the direction of extension obtained by deliberately breaking a p-type semiconductor material (obtained by unidirectional extension deformation of a powder sintered body) after plastic processing in the third embodiment. Both of these photographs are at a magnification of 200 times.

It can be clearly seen by comparing these FIGS. 35(*a*) and (*b*) that the directions of the cleavage planes of the material shown in FIG. 35(*b*) are aligned in one direction to a greater extent than the directions of the cleavage planes of the material shown in FIG. 35(*a*). That is, whereas, in the case of the material shown in FIG. 35(*a*) that had not been subjected to plastic processing, the directions of the cleavage planes face all directions, in the case of the material shown in FIG. 35(*b*), which had been subjected to plastic processing (unidirectional extension deformation), most of the cleavage planes are aligned parallel to the direction of extension. Also, regarding the subcrystal grains, it can be seen that those in FIG. 35(*b*) have been made finer than those of FIG. 35(*a*). FIG. 35 shows the case where pressing was effected in the vertical direction.

FIGS. 36(*a*) and (*b*) are photographs in which the observed fracture face was altered.

Specifically, FIG. 36(*a*) is a photograph obtained using an electron microscope of a fracture face perpendicular to the direction of application of pressure (pressing direction) during sintering, obtained by deliberately fracturing a powdered sintered body of p-type semiconductor material prior to plastic processing in the third embodiment.

In contrast, FIG. 36(*b*) is a photograph obtained using an electron microscope of a fracture face perpendicular to the direction of application of pressure in order to effect extension deformation (compression direction) obtained by deliberately fracturing a p-type semiconductor material (obtained by unidirectional extension deformation of a powder sintered body) after plastic processing in the third embodiment. The magnification of these photographs is 200 times in each case.

Figure 36A:
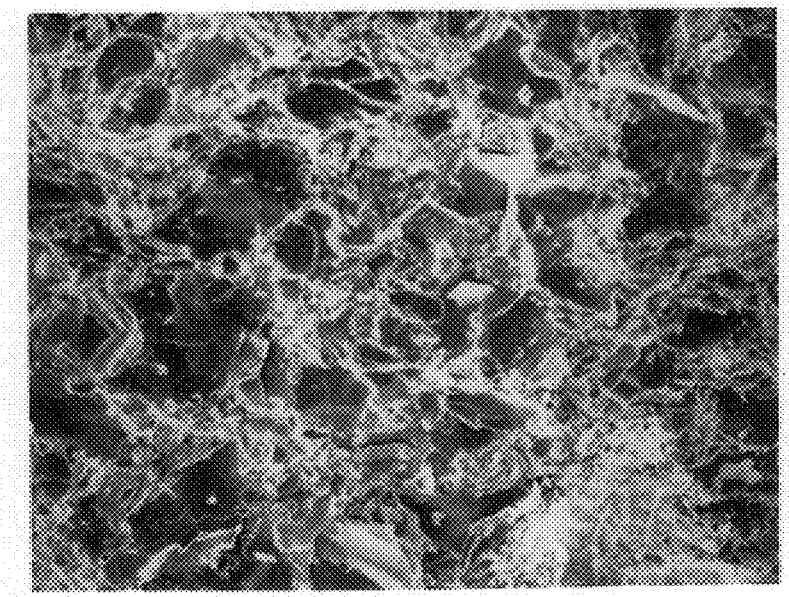
FIGS. 36(a) and 36(b) are micrographs showing the structure of a fractured face different from that of FIGS. 35(a) and 35(b) of a thermoelectric semiconductor material according to the present invention, being a photograph used for comparison of structures before and after plastic processing.
Figure 36B:
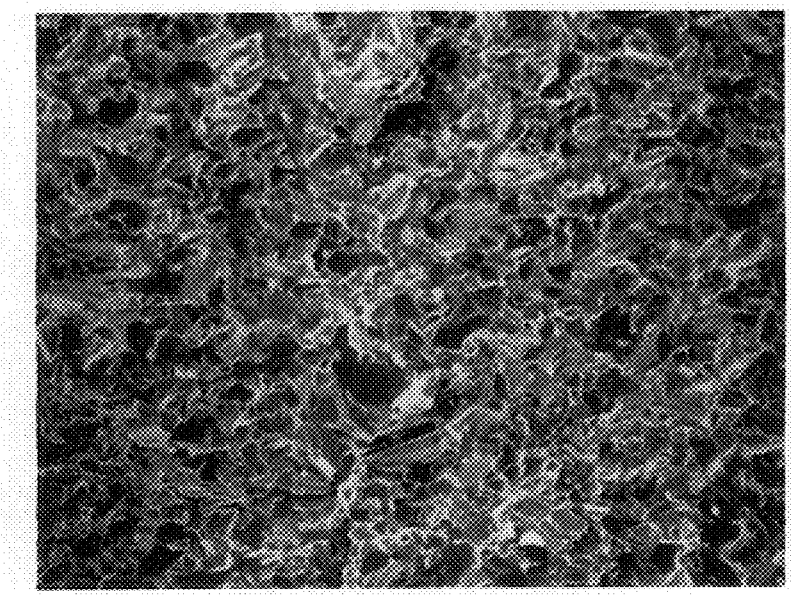

As is clear by comparing these FIGS. 36(*a*) and (*b*), the directions of the cleavage planes of the material shown in FIG. 36(*b*) are aligned in one direction to a greater extent than the directions of the cleavage planes of the material shown in FIG. 36(*a*). That is, whereas the material that was not subjected to plastic processing shown in FIG. 36(*a*) has the directions of its cleavage planes oriented in all directions, in the case of the material which was subjected to plastic processing (unidirectional extension deformation) shown in FIG. 36(*b*), most of the cleavage planes are aligned parallel to the direction of extension. Also, regarding the subcrystal grains, it can be seen that increase in fineness has proceeded to a greater extent in respect of FIG. 36(b) than in respect of FIG. 36(a).

Thus it can be seen that the cleavage planes are aligned by plastic processing and alignment is improved by plastic processing.

This alignment of the cleavage planes thanks to plastic deformation and improvement in alignment thanks to plastic processing is the same as in the case of the n-type semiconductor material of the second embodiment.

Semiconductor material whose structure has been made finer in this way by plastic deformation and whose cleavage planes have become aligned is excellent not only in respect of thermoelectric performance but also in regard to strength; material having fully satisfactory strength exceeding the strength of powder sintered material prior to plastic processing can be obtained. As mentioned above, this is supported by the experimental result that the shearing strength of the product that has been subjected to plastic processing is higher than that of the product which has not been thus processed.

In the first-twelfth embodiments described above, it was chiefly assumed that plastic processing was performed on a powder sintered material produced by hot pressing (press sintering), but the subject of the plastic processing of the present invention can be chosen at will so long as it is a thermoelectric semiconductor material having a hexagonal crystal structure. For example, it can be applied to powder molded bodies in general. In this case, in contrast to powdered sintered bodies, pressing and heating do not matter.

Consequently, although in these embodiments, it was chiefly assumed that the powder sintered body obtained by hot pressing was subjected to hot upset forging, the present invention is not restricted to this.

A pressed body obtained by pressing a solid solution powder may be subjected to hot upset forging, or a sintered body obtained by pressing and then sintering a solid solution powder may be subjected to hot upset forging. Further, as shown in the comparative examples, a material obtained by melting, followed by solidification (melt-grown material) could be cut out in the form of desired solid solution blocks, these being directly subjected to hot upset forging.

Also, in the embodiments, the description was given assuming that the thermoelectric semiconductor material was obtained by hot forging. However, the hot forging method described in these embodiments can be applied to all materials.

The materials to which the hot forging of the present invention can be applied include magnetic materials, dielectric materials, or superconducting materials of hexagonal crystal structure, laminar structure, or tungsten block structure, such as for example bismuth laminar ferroelectrics, or bismuth laminar high temperature superconductors.

Also, in the embodiments, it was chiefly assumed that the plastic processing consisted in hot upset forging. However, the present invention could be applied to various types of plastic processing. For example, in the case of forging, there is no restriction to hot or upset forging and the invention could be applied to warm or mold forging. Further, it could be performed by rolling or extrusion etc.

Also, in the embodiments, plastic processing was used to make the size of the crystal grains constituting the structure of the thermoelectric semiconductor material finer, below a fixed size, and the grain sizes of the subcrystal grains were made uniform below a prescribed size, thereby increasing the strength by means of a finer structure. However, in order to achieve this, temperature conditions could be applied to the plastic processing.

Also, thermoelectric performance can be improved while maintaining strength, by adding a density ratio condition to the hot semiconductor material produced in these embodiments. Specifically, as mentioned in the embodiments, the density ratio of the thermoelectric semiconductor material is desirably at least 97%.

Also, although, in the embodiments, as shown in FIG. 12, rectangular prismatic elements 5, 6 were molded by plastic processing of thermoelectric semiconductor material, according to the present invention, molding to any desired shape is possible. That is, making use of the characteristics of plastic processing, the invention can be flexibly applied to any shape demanded for the elements constituting the thermoelectric module and molding can be performed without difficulty. For example, even if the shape of the elements is doughnut-shaped, this can be formed without difficulty.

Also, whereas in the embodiments the compositions $Bi_2Te_2Se_{0.3}$, $Bi_{0.4}Sb_{1.6}Te_3$, $Bi_2Te_{2.85}Se_{0.15}$, $Bi_{0.5}Sb_{1.5}Te_3$ were chiefly described, any of the compositions $Bi_2Te_3$, $Bi_2Se_3$, $Sb_2Te_3$, $Sb_2Se_3$, $Bi_2S_3$ or $Sb_2S_3$ could be employed. Also, a composition obtained by combining two, three or four of these $Bi_2Te_3$, $Bi_2Se_3$, $Sb_2Te_3$, $Sb_2Se_3$, $Bi_2S_3$ or $Sb_2S_3$ could be employed. Cases where impurities are included as dopants are also included.

Furthermore, even if isotropic thermoelectric materials (for example, PbTe-based, Si—Ge-based, or $CoSb_3$-based thermoelectric materials) are employed, by performing plastic processing according to the embodiments, the grain size of the crystals can be made uniform below a prescribed size, the structure can be made finer, and the benefit of increased strength can be obtained.

As described above, with the present invention, it is possible to obtain thermoelectric semiconductor material in high manufacturing yield with a high degree of alignment.

What is claimed is:

1. A method of manufacturing a thermoelectric semiconductor material comprising:

a heating step in which material powder is mixed so as to have a desired composition, and melted by heating;

a solidification step, in which a solid solution ingot of thermoelectric semiconductor material having a rhombohedral structure is formed;

a crushing step in which the solid solution ingot is crushed to form a solid solution powder;

a screening step in which the grain size of the solid solution powder is made uniform;

a sintering step in which the solid solution powder whose grain size has been made uniform is subjected to pressing and sintering; and a hot upset forging step in which hot upset forging is performed by subjecting the powder sintered body to plastic deformation while hot, and extending it, so that the crystal grains or subcrystal grains constituting the crystal grains of the powder sintered structure are aligned in a crystal orientation of excellent figure of merit for providing a thermoelectric material of satisfactory strength and performance, and the density ratio of the powder sintered body is finally at least 97%.

2. The method of manufacturing a thermoelectric semiconductor material according to claim 1, wherein the hot upset forging step is an upset forging step wherein the powder sintered body is extended in one axial direction only, while hot.

3. The method of manufacturing a thermoelectric semiconductor material according to claim 1, wherein a solid solution ingot of $Bi_2Te_3$-based thermoelectric semiconductor material is formed by heating and melting a mixture whose chief constituents are bismuth, antimony, tellurium, and selenium of desired composition by means of the heating step and the solidification step.

4. The method of manufacturing a thermoelectric semiconductor material according to claim 3 comprising, after the screening step and before the sintering step, a hydrogen reduction step in which the solid solution powder is subjected to heat treatment in a hydrogen atmosphere.

5. The method of manufacturing a thermoelectric semiconductor material according to claim 1, wherein a solid solution ingot of BiSb-based thermoelectric semiconductor material is formed by heating and melting a mixture whose chief constituents are bismuth and antimony, of desired composition by means of the heating step and the solidification step.

6. The method of manufacturing a thermoelectric semiconductor material according to claim 1, wherein the hot upset forging step is a step in which hot upset forging is performed of the powder sintered body below a grain growth temperature.

7. The method of manufacturing a thermoelectric semiconductor material according to claim 1, wherein the hot upset forging step is a step in which hot upset forging is performed of the powder sintered body at above 350° C. but below 550° C.

8. The method of manufacturing a thermoelectric semiconductor material according to claim 1, wherein the hot upset forging step is a step in which hot upset forging is performed on the powder sintered body with a load pressure of not more than 500 kg/cm$^2$.

9. The method of manufacturing a thermoelectric semiconductor material according to claim 1, wherein the hot upset forging step is a step in which hot upset forging is performed on the powder sintered body at above 350° C. but below 550° C. with a load pressure of not more than 500 kg/cm$^2$.

10. The method of manufacturing a thermoelectric semiconductor material according to claim 1, wherein the hot upset forging step is a step in which hot upset forging is performed on the powder sintered body with an initial load pressure of not less than 70 kg/cm$^2$ but not more than 350 kg/cm$^2$.

11. The method of manufacturing a thermoelectric semiconductor material according to claim 1, wherein the hot upset forging step is a step in which hot upset forging is performed on the powder sintered body at above 350° C. but below 550° C. with an initial load pressure of not less than 70 kg/cm$^2$ but not more than 350 kg/cm$^2$.

12. A method of manufacturing a thermoelectric semiconductor material comprising:

a heating step in which material powder is mixed so as to have a desired composition, and melted by heating;

a solidification step, in which a solid solution ingot of thermoelectric semiconductor material having a rhombohedral structure is formed;

a crushing step in which the solid solution ingot is crushed to form a solid solution powder;

a screening step in which the grain size of the solid solution powder is made uniform;

a sintering step in which the solid solution powder whose grain size has been made uniform is subjected to pressing and sintering; and a hot upset forging step in which the powder sintered body is subjected to plastic deformation while hot, and extended whilst pressing in a direction coinciding with a direction of pressing in the sintering step, so that the crystal grains or subcrystal grains constituting the crystal grains of the powder sintered structure are aligned in a crystal orientation of excellent figure of merit for providing a thermoelectric material of satisfactory strength and performance.

13. The method of manufacturing a thermoelectric semiconductor material according to claim 12, wherein the hot upset forging step is an upset forging step in which the powder sintered body is extended in one direction only while hot.

14. A method of manufacturing a thermoelectric semiconductor material comprising:

a heating step in which material powder is mixed so as to have a desired composition, and melted by heating;

a solidification step, in which a solid solution ingot of thermoelectric semiconductor material having a rhombohedral structure is formed;

a crushing step in which the solid solution ingot is crushed to form a solid solution powder;

a screening step in which the grain size of the solid solution powder is made uniform;

a sintering step in which the solid solution powder whose grain size has been made uniform is subjected to pressing and sintering; and a hot upset forging step in which the powder sintered body is subjected to plastic deformation while hot, and extended, so that crystal grains or subcrystal grains constituting the crystal grains of the powder sintered structure are aligned in a crystal orientation of excellent figure of merit for providing a thermoelectric material of satisfactory strength and performance; and a further heat treatment step in which heat treatment is performed after the hot upset forging step.

15. A thermoelectric semiconductor material characterized in that crystal grains or subcrystal grains constituting the crystal grains of a powder sintered structure are aligned in a crystal orientation of excellent figure of merit by subjecting a powder sintered body of BiSb-based thermoelectric semiconductor material to plastic deformation by hot upset forging, and wherein a density ratio of the powder sintered body is finally made to be at least 97%.

16. A thermoelectric semiconductor material characterized in that c axes of crystal grains or subcrystal grains constituting the crystal grains of a powder sintered structure are aligned by subjecting a powder sintered body of $Bi_2Te_3$-based thermoelectric semiconductor material to plastic deformation by hot upset forging and wherein a density ratio of the powder sintered body is finally made to be at least 97%.

17. A thermoelectric semiconductor material characterized in that crystal grains or subcrystal grains constituting the crystal grains of a powder sintered structure are aligned in a crystal orientation of excellent figure of merit by subjecting a powder sintered body of BiSb-based thermoelectric semiconductor material to plastic deformation by hot upset forging in a condition in which the material can only extend in one axial direction, and wherein a density ratio of the powder sintered body is finally made to be at least 97%.

18. A thermoelectric semiconductor material characterized in that c axes of crystal grains or subcrystal grains constituting the crystal grains of a powder sintered structure are aligned by subjecting a powder sintered body of $Bi_2Te_3$-based thermoelectric semiconductor material to plastic deformation by hot upset forging in a condition in which the material can only extend in one axial direction, and wherein a density ratio of the powder sintered body is finally made to be at least 97%.

19. A thermoelectric module comprising:

p-type and n-type thermoelectric semiconductor materials arranged such that cleavage planes of crystal grains or subcrystal grains constituting the crystal grains of powder sintered structure are aligned, by plastic deformation performed by respective hot upset forging of powder sintered bodies of the p-type and n-type thermoelectric semiconductor materials having a rhombohedral structure, a density ratio of the powder sintered body being finally made to be at least 97%; and in each case, a pair of electrodes mutually oppositely fixed at a top face and a bottom face of the p-type and n-type thermoelectric semiconductor materials, so that a current flows along the cleavage planes.

20. A thermoelectric module comprising:

p-type and n-type thermoelectric semiconductor materials wherein c axes of crystal grains or subcrystal grains constituting the crystal grains of a powder sintered structure are aligned by plastic deformation performed by respective hot upset forging of powder sintered bodies of p-type and n-type $Bi_2Te_3$-type thermoelectric semiconductor materials, a density ratio of the powder sintered body being finally made to be at least 97%; and in each case, a pair of electrodes mutually oppositely fixed at a top face and a bottom face of the p-type and n-type thermoelectric semiconductor materials, so that a current flows along a direction perpendicular to the c axes.

21. A method of manufacturing a thermoelectric semiconductor material comprising:

a heating step in which material powder is mixed so as to have a desired composition, and melted by heating;

a solidification step, in which a solid solution ingot of thermoelectric semiconductor material having a rhombohedral structure is formed;

a crushing step in which the solid solution ingot is crushed to form a solid solution powder;

a screening step in which the grain size of the solid solution powder is made uniform;

a sintering step in which the solid solution powder whose grain size has been made uniform is subjected to pressing and sintering; and a hot upset forging step in which the powder sintered body is subjected to plastic deformation while hot, and extended, so that crystal grains or subcrystal grains constituting the crystal grains of the powder sintered structure are aligned in a crystal orientation of excellent figure of merit for providing a thermoelectric material of satisfactory strength and performance; and wherein the powder sintered body of density ratio not less than 97% is finally made to be of the density ratio or more by hot upset forging.

22. The method of manufacturing a thermoelectric semiconductor material according to claim 21, wherein a solid solution ingot of $Bi_2Te_3$-based thermoelectric semiconductor material is formed by heating and melting a mixture whose chief constituents are bismuth, antimony, tellurium, and selenium of desired composition, by the heating step and the solidification step.

23. The method of manufacturing a thermoelectric semiconductor material according to claim 21, wherein a solid solution ingot of BiSb-based thermoelectric semiconductor material is formed by heating and melting a mixture whose chief constituents are bismuth and antimony of desired composition, by the heating step and the solidification step.

24. A method of manufacturing a thermoelectric semiconductor material comprising:

a heating step in which material powder is mixed so as to have a desired composition, and melted by heating;

a solidification step, in which a solid solution ingot of thermoelectric semiconductor material having a rhombohedral structure is formed;

a crushing step in which the solid solution ingot is crushed to form a solid solution powder;

a screening step in which the grain size of the solid solution powder is made uniform;

a sintering step in which the solid solution powder whose grain size has been made uniform is subjected to pressing and sintering; and a hot upset forging step in which the powder sintered body is subjected to plastic deformation while hot, and extended in a free direction and then is further pressed in a condition in which the free direction is restrained, so that crystal grains or subcrystal grains constituting the crystal grains of the powder sintered structure are aligned in a crystal orientation of excellent figure of merit for providing a thermoelectric material of satisfactory strength and performance.

25. The method of manufacturing a thermoelectric semiconductor material according to claim 24, wherein a solid solution ingot of $Bi_2Te_3$-based thermoelectric semiconductor material is formed by heating and melting a mixture whose chief constituents are bismuth, antimony, tellurium and selenium, of desired composition, by the heating step and the solidification step.

26. The method of manufacturing a thermoelectric semiconductor material according to claim 24, wherein a solid solution ingot of BiSb-based thermoelectric semiconductor material is formed by heating and melting a mixture whose chief constituents are bismuth and antimony of desired composition by the heating step and the solidification step.

27. A method of manufacturing a thermoelectric semiconductor material comprising:

a heating step in which material powder is mixed so as to have a desired composition, and melted by heating;

a solidification step, in which a solid solution ingot of thermoelectric semiconductor material having a rhombohedral structure is formed;

a crushing step in which the solid solution ingot is crushed to form a solid solution powder;

a screening step in which the grain size of the solid solution powder is made uniform;

a sintering step in which the solid solution powder whose grain size has been made uniform is subjected to pressing and sintering;

a hot upset forging step in which the powder sintered body is subjected to plastic deformation while hot, and extended, so that crystal grains or subcrystal grains constituting the crystal grains of the powder sintered structure are aligned in a crystal orientation of excellent figure of merit for providing a thermoelectric material of satisfactory strength and performance; and a hot mold forging step after the hot upset forging step, the powder sintered body is further subjected to a hot mold forging step in which it is forged inserted into a mold while hot.

28. The method of manufacturing a thermoelectric semiconductor material according to claim 27, wherein a solid solution ingot of $Bi_2Te_3$-based thermoelectric semiconductor material is formed by heating and melting a mixture whose chief constituents are bismuth, antimony, tellurium and selenium of desired composition, by the heating step and the solidification step.

29. The method of manufacturing a thermoelectric semiconductor material according to claim 27, wherein a solid solution ingot of BiSb-based thermoelectric semiconductor material is formed by heating and melting a mixture whose chief constituents are bismuth and antimony of desired composition, by the heating step and the solidification step.

30. A method of manufacturing a thermoelectric semiconductor material comprising:

a heating step in which material powder is mixed so as to have a desired composition, and melted by heating;

a solidification step, in which a solid solution ingot of thermoelectric semiconductor material having a rhombohedral structure is formed;

a crushing step in which the solid solution ingot is crushed to for a solid solution powder;

a screening step in which the grain size of the solid solution powder is made uniform;

a sintering step in which the solid solution powder whose grain size has been made uniform is subjected to pressing and sintering; and a hot upset forging step in which the powder sintered body is subjected to plastic deformation while hot, and extended, so that crystal grains or subcrystal grains constituting the crystal grains of powder sintered structure are aligned in a crystal orientation of excellent figure of merit for providing a thermoelectric material of satisfactory strength and performance; and wherein the hot upset forging step is repeated a plurality of times.

31. The method of manufacturing a thermoelectric semiconductor material according to claim 30, wherein the hot upset forging step is an upset forging step in which the powder sintered body is extended in one axial direction only while hot.

32. The method of manufacturing a thermoelectric semiconductor material according to claim 30, wherein a solid solution ingot of $Bi_2Te_3$-based thermoelectric semiconductor material is formed by heating and melting a mixture whose chief constituents are bismuth, antimony, tellurium and selenium of desired composition, by the heating step and the solidification step.

33. The method of manufacturing a thermoelectric semiconductor material according to claim 30, wherein a solid solution ingot of BiSb-based thermoelectric semiconductor material is formed by heating and melting a mixture whose chief constituents are bismuth and antimony of desired composition by the heating step and the solidification step.

34. A thermoelectric semiconductor material characterized in that a density ratio of not less than 97% is obtained by plastic deformation of a powder sintered body of BiSb-based thermoelectric semiconductor material by hot upset forging.

35. A thermoelectric semiconductor material characterized in that a density ratio of not less than 97% is obtained by plastic deformation of a powder sintered body of $Bi_2Te_3$-based thermoelectric semiconductor material by hot upset forging.

36. A method of manufacturing a thermoelectric semiconductor material comprising:

a heating step in which material powder is mixed so as to have a desired composition, and melted by heating;

a solidification step in which a solid solution ingot of thermoelectric semiconductor material having a rhombohedral is formed;

a crushing step in which the solid solution ingot is crushed to form a solid solution powder;

a screening step in which the grain size of the solid solution powder is made uniform;

a pressing step in which the solid solution powder whose grain size has been made uniform is subjected to pressing; and a hot upset forging step in which the powder pressed body is sintered while hot and concurrently subjected to plastic deformation, and extended, thereby sintering while aligning crystal grains or subcrystal grains constituting the crystal grains of the powder sintered structure in a crystal orientation of excellent figure of merit for providing a thermoelectric material of satisfactory strength and performance.

37. The method of manufacturing a thermoelectric semiconductor material of claim 36, wherein the hot upset forging step is a step in which hot upset forging is performed below a recrystallization temperature.

38. The method of manufacturing a thermoelectric semiconductor material according to claim 36, wherein the hot upset forging step is a step in which hot upset forging is performed at above 350° C. but below 550° C.

39. The method of manufacturing a thermoelectric semiconductor material according to claim 36, wherein the hot upset forging step is a step in which hot upset forging is performed with a load pressure of not more than 500 kg/cm².

40. The method of manufacturing a thermoelectric semiconductor material according to claim 35, wherein the hot upset forging step is a step in which hot upset forging is performed on the powder sintered body at above 350° C. but below 550° C. with a load pressure of not more than 500 kg/cm².

41. A method of manufacturing a thermoelectric semiconductor material comprising:

a heating step in which material powder is mixed so as to have a desired composition, and melted by heating;

a solidification step, in which a solid solution ingot of thermoelectric semiconductor material having a rhombohedral structure is formed;

a crushing step in which the solid solution ingot is crushed to form a solid solution powder;

a screening step in which the grain size of the solid solution powder is made uniform;

a pressing step in which the solid solution powder whose grain size has been made uniform is subjected to pressing;

a sintering step in which the pressed body is sintered; and a hot upset forging step in which the sintered body is subjected to plastic deformation while hot, and extended, thereby performing hot upset forging so that crystal grains or subcrystal grains constituting the crystal grains of the powder sintered structure are aligned in a crystal orientation of excellent figure of merit for providing a thermoelectric material of satisfactory strength and performance, a density ratio of the powder sintered body being finally made to be at least 97%.

42. A method of manufacturing a thermoelectric semiconductor material comprising:

a heating step in which material powder is mixed so as to have a desired composition, and melted by heating;

a solidification step, in which a solid solution ingot of thermoelectric semiconductor material having a rhombohedral structure is formed;

a cutting step in which the solid solution ingot is cut to a solid solution block of desired size; and a hot upset forging step in which the solid solution block is subjected to plastic deformation while hot, and extended, so that crystal grains are aligned in a crystal orientation of excellent figure of merit for providing a thermoelectric material of satisfactory strength and performance.

43. Method of hot forging comprising:

a step of extending a material having a desired composition in a free direction while hot; and after extending in a free direction, by a step of further pressing in a condition with the free direction restrained, performing plastic deformation of the material while hot, and extending, thereby aligning crystal grains or subcrystal grains constituting the crystal grains of a material structure and achieving a density ratio above a prescribed value for providing a thermoelectric material of satisfactory strength and performance.

44. Method of hot forging comprising:

a step of extending a material having a desired composition in a free direction while hot; and subjecting the extended material to plastic deformation while hot by means of a hot mold forging step in which forging is effected in a mold while hot, and extending, thereby aligning crystal grains or subcrystal grains constituting the crystal grains of a material structure and achieving a density ratio above a prescribed value for providing a thermoelectric material of satisfactory strength and performance.

45. A thermoelectric semiconductor material wherein forming is effected such that C planes of subcrystal grains constituting a structure are aligned on a specified axis or in a specified plane by plastic processing of a thermoelectric semiconductor material having a hexagonal crystal structure, a density ratio with respect to a single crystal being thereby made to be at least 97%.

46. The thermoelectric semiconductor material according to claim 45, wherein the thermoelectric semiconductor material having the hexagonal crystal structure is a powder molded body.

47. The thermoelectric semiconductor material according to claim 45, wherein the thermoelectric semiconductor material having the hexagonal structure is a powder sintered body.

48. The thermoelectric semiconductor material according to claim 45 wherein, the thermoelectric semiconductor material having the hexagonal crystal structure is of composition represented by any of $Bi_2Te_3$, $Bi_2Se_3$, $Sb_2Te_3$, $Sb_2Se_3$, $Bi_2S_3$, $S_2S_3$ or a combination of two, three or four of these.

49. A thermoelectric semiconductor material formed such that, C planes of at least 80% of subcrystal grains, in volumetric percentage terms, of the subcrystal grains constituting a structure, are aligned within a range of ±30° with respect to a specified axial direction or specified plane, by plastic processing of thermoelectric semiconductor material having a hexagonal structure, a density ratio with respect to a single crystal being thereby made to be at least 97%.

50. A thermoelectric semiconductor material formed such that C planes of at least 50% of subcrystal grains, in volumetric percentage terms, of the subcrystal grains constituting a structure, are aligned within a range of ±15° with respect to a specified axial direction or specified plane, by plastic processing of thermoelectric semiconductor material having a hexagonal crystal structure, a density ratio with respect to a single crystal being thereby made to be at least 97%.

51. A thermoelectric semiconductor material wherein, by plastic processing of a thermoelectric semiconductor material, a size of subcrystal grains constituting a structure is reduced below a fixed size, and a grain size of the subcrystal grains is unified to a grain size in a fixed range.

52. The thermoelectric semiconductor material according to claim 51, wherein plastic processing of the thermoelectric semiconductor material is performed below the recrystallization temperature.

53. A thermoelectric semiconductor material characterized in that, by plastic processing of the thermoelectric semiconductor material, a density ratio with respect to a single crystal is made to be at least 97%, and the thermoelectric semiconductor material is formed to a shape desired for elements constituting a thermoelectric module.

54. A thermoelectric semiconductor material characterized in that, by plastic processing of the thermoelectric semiconductor material, a density ratio with respect to a single crystal is made to be at least 97%, a mean value of a shearing strength of the thermoelectric semiconductor material is made at least equal to a fixed value and a statistical scatter of the shearing strength is kept within a fixed range.

55. A thermoelectric semiconductor material formed characterized in that C planes of subcrystal grains constituting a structure are aligned on a specified axis or specified plane by performing heat treatment after plastic processing of thermoelectric semiconductor material having a hexagonal crystal structure.

56. A thermoelectric module characterized in that, by plastic processing of a thermoelectric semiconductor material having a hexagonal crystal structure, there is formed thermoelectric semiconductor materials of p-type and n-type such that C planes of subcrystal grains constituting the structure are aligned with respect to a specified axis or specified plane and a density ratio with respect to a single crystal is made at least 97%; and comprising at least one pn element pair wherein the p-type and n-type thermoelectric semiconductor materials are joined through a pair of electrodes such that an electric current or a heat current flows in an orientation in which the C planes of the subcrystal grains constituting the structure are most aligned.

* * * * *